United States Patent
Dupuy et al.

(10) Patent No.: US 8,154,340 B2
(45) Date of Patent: Apr. 10, 2012

(54) METAMATERIAL POWER AMPLIFIER SYSTEMS

(75) Inventors: Alexandre Dupuy, San Diego, CA (US); Ajay Gummalla, San Diego, CA (US); Maha Achour, Encinitas, CA (US)

(73) Assignee: Hollinworth Fund, LLC, Dover, DE (US)

( * ) Notice: Subject to any disclaimer, the term of this patent is extended or adjusted under 35 U.S.C. 154(b) by 0 days.

(21) Appl. No.: 12/708,437

(22) Filed: Feb. 18, 2010

(65) Prior Publication Data

US 2010/0207703 A1 Aug. 19, 2010

Related U.S. Application Data

(60) Provisional application No. 61/153,398, filed on Feb. 18, 2009.

(51) Int. Cl.
*H03F 3/68* (2006.01)
(52) U.S. Cl. .................................... 330/126; 330/302
(58) Field of Classification Search ............... 330/126, 330/302, 285, 296
See application file for complete search history.

(56) References Cited

U.S. PATENT DOCUMENTS

| | | | |
|---|---|---|---|
| 5,661,434 A | 8/1997 | Brozovich et al. | |
| 6,242,986 B1 * | 6/2001 | Adar | 330/302 |
| 7,592,957 B2 | 9/2009 | Achour et al. | |
| 7,656,228 B2 * | 2/2010 | Fukuda et al. | 330/126 |
| 7,769,355 B2 * | 8/2010 | Ichitsubo et al. | 455/127.1 |
| 2008/0079487 A1 | 4/2008 | Shimada | |
| 2008/0119214 A1 | 5/2008 | Liu et al. | |
| 2008/0258981 A1 | 10/2008 | Achour et al. | |
| 2009/0160575 A1 | 6/2009 | Dupuy et al. | |

FOREIGN PATENT DOCUMENTS

WO WO-2010096582 A2 8/2010

OTHER PUBLICATIONS

Caloz, C., et al., "Electromagnetic Metamaterials: Transmission Line Theory and Microwave", John Wiley & Sons. 2006.
Itoh, T., "Invited paper: Prospects for Metamaterials", Electronics Letters, vol. 40(16). Aug. 5, 2004. pp. 972-973.
U.S. Appl. No. 61/153,398 entitled "A Metamaterial Power Amplifier System and Method for Generating Highly Efficient and Linear Multi-Band Power Amplifiers," filed Feb. 18, 2009.
Kang, D., et al. "A Highly Efficient and Linear Class-AB/F Power Amplifier for Multimode Operation." IEEE Transactions on Microwave Theory and TEchniques, vol. 56, No. 1. Jan. 2008. pp. 77-87.
Dupuy, A., et al. "Class-F Power Amplifier Using a Multi-Frequency Composite Right/Left-Handed Transmission Line Harmonic Tuner." IEEE MTT-S International Microwave Symposium Digest. pp. 2023-2036.
Rennings, A. et al. "Extended Composite Right/Left-Handed (E-CRLH) Metamaterial and its Application as Quadband Quarter-Wavelength Transmission Line." Proceedings of Asia-Pacific Microwave Conference 2006. Yokohama, Japan.
Schmelzer, D., et al. "A GaN HEMT Class F Amplifier at 2 GHz With >80% PAE." IEEE Journal of Solid-State Circuits, vol. 42, No. 10. Oct. 2007. pp. 2130-2136.
"International Application Serial No. PCT/US2010/024619, International Search Report mailed Sep. 15, 2010", 3 pgs.

* cited by examiner

*Primary Examiner* — Henry Choe
(74) *Attorney, Agent, or Firm* — Connolly Bove Lodge & Hutz LLP

(57) ABSTRACT

Power amplifying systems and modules and components therein are designed based on CRLH structures, providing high efficiency and linearity.

38 Claims, 45 Drawing Sheets

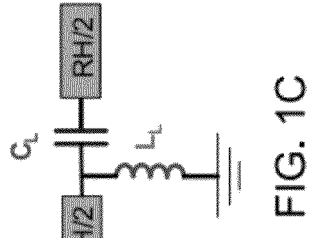
FIG. 1A
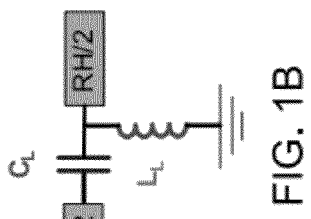
FIG. 1B
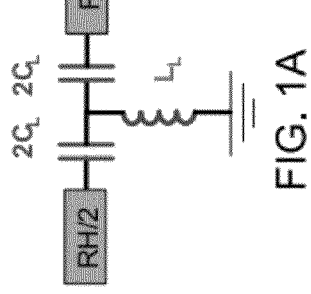
FIG. 1C
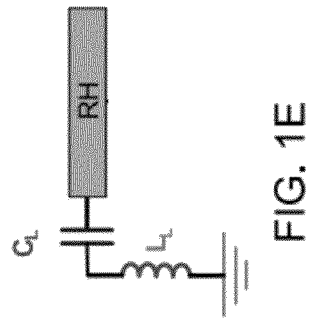
FIG. 1D
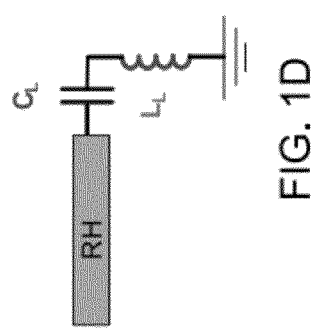
FIG. 1E
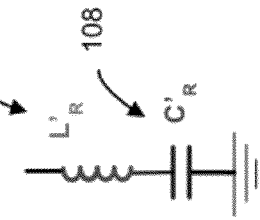
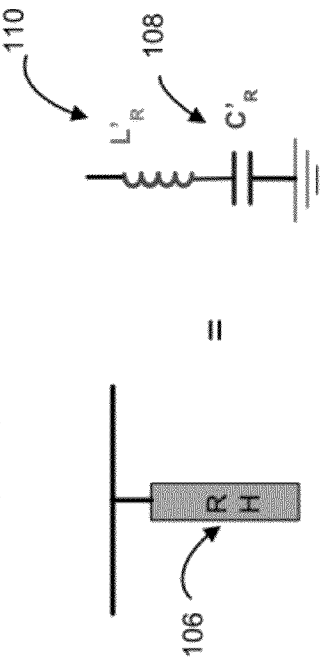
FIG. 1F
FIG. 1G

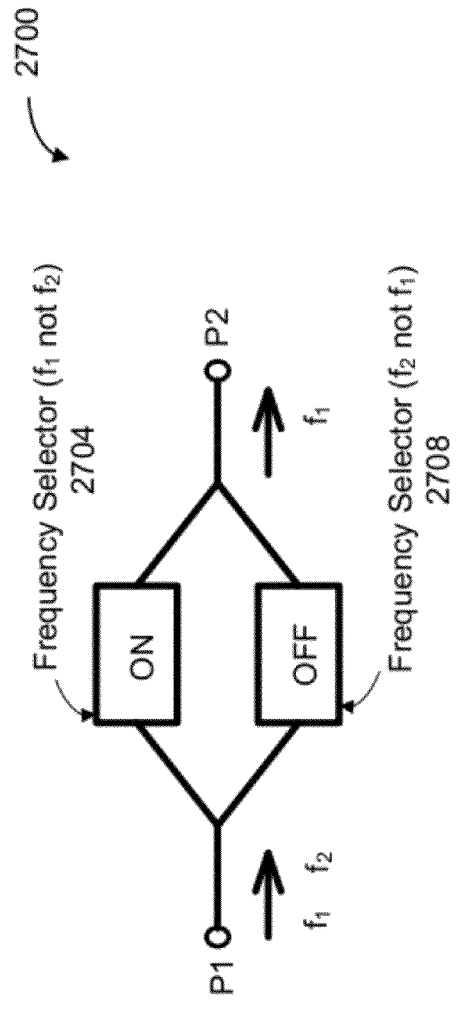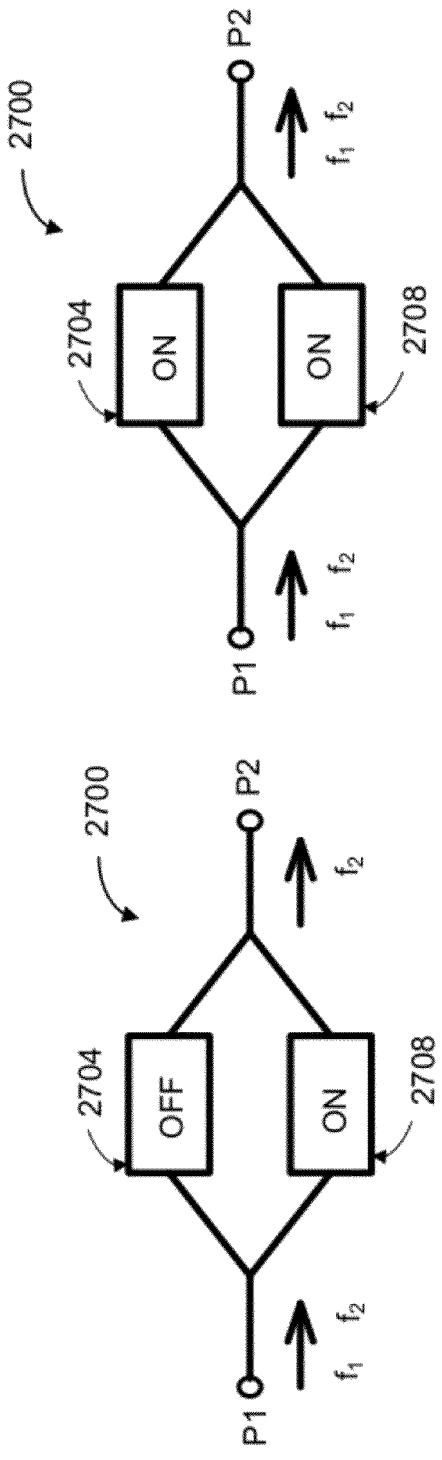
FIG. 27A
FIG. 27B
FIG. 27C

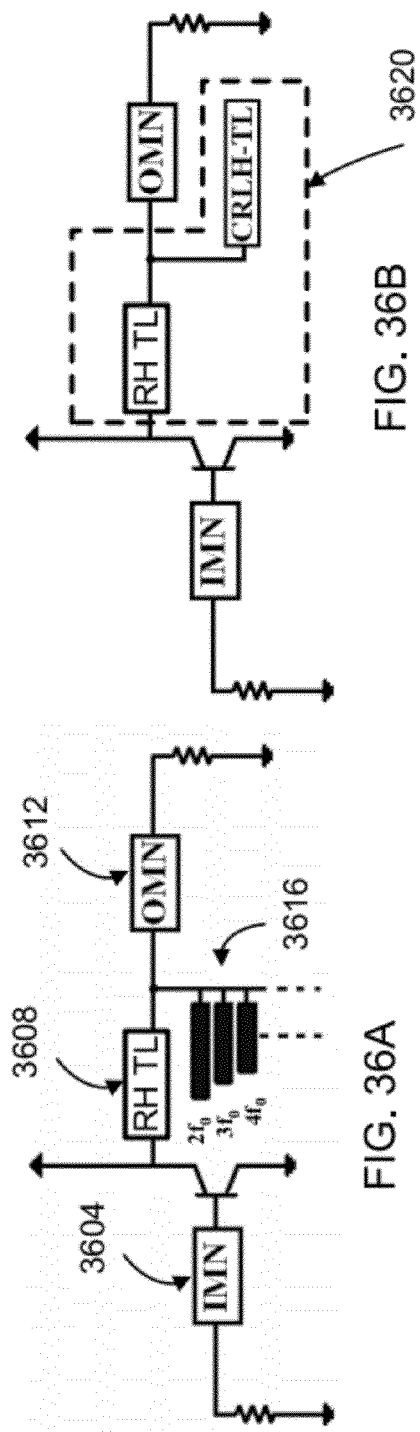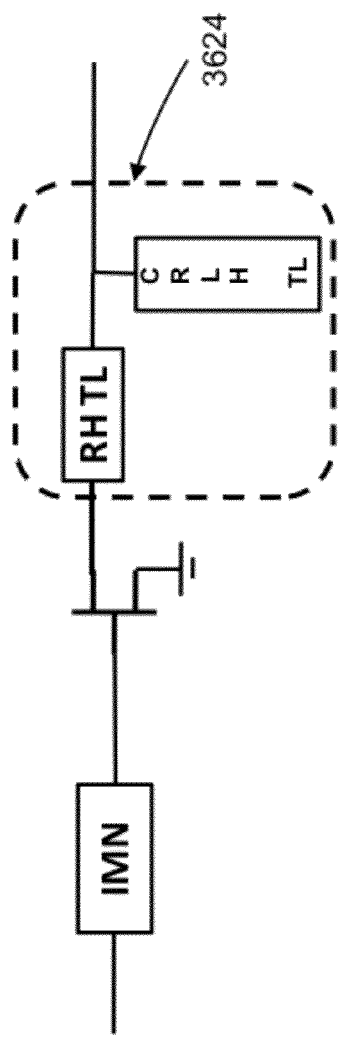
FIG. 36A
FIG. 36B
FIG. 36C

METAMATERIAL POWER AMPLIFIER SYSTEMS

PRIORITY CLAIM AND RELATED APPLICATIONS

This patent application claims the benefit of the U.S. Provisional Patent Application Ser. No. 61/153,398 entitled "A Metamaterial Power Amplifier System and Method for Generating Highly Efficient and Linear Multi-Band Power Amplifiers," filed on Feb. 18, 2008. The disclosure of the above provisional application is incorporated herein by reference. This patent application is related to U.S. patent application Ser. No. 11/741,674 entitled "Antennas, Devices and Systems based on Metamaterial Structures," filed on Apr. 27, 2007; U.S. Pat. No. 7,592,952 entitled "Antennas Based on Metamaterial Structures," issued on Sep. 22, 2009; and U.S. patent application Ser. No. 11/963,710 entitled "Power Combiners and Dividers Based on Composite Right and Left Handed Metamaterial Structures," filed on Dec. 21, 2007.

BACKGROUND

This document relates to power amplifier systems and components therein based on metamaterial structures.

The propagation of electromagnetic waves in most materials obeys the right-hand rule for the (E,H,β) vector fields, considering the electrical field E, the magnetic field H, and the wave vector β (or propagation constant). The phase velocity direction is the same as the direction of the signal energy propagation (group velocity) and the refractive index is a positive number. Such materials are referred to as Right Handed (RH) materials. Most natural materials are RH materials. Artificial materials can also be RH materials.

A metamaterial (MTM) has an artificial structure. When designed with a structural average unit cell size much smaller than the wavelength of the electromagnetic energy guided by the metamaterial, the metamaterial can behave like a homogeneous medium to the guided electromagnetic energy. Unlike RH materials, a metamaterial can exhibit a negative refractive index, and the phase velocity direction is opposite to the direction of the signal energy propagation, wherein the relative directions of the (E,H,β) vector fields follow the left-hand rule. Metamaterials which have a negative index of refraction with simultaneous negative permittivity ∈ and permeability μ are referred to as pure Left Handed (LH) metamaterials.

Many metamaterials are mixtures of LH metamaterials and RH materials and thus are Composite Right and Left Handed (CRLH) metamaterials. A CRLH metamaterial can behave like an LH metamaterial at low frequencies and an RH material at high frequencies. Implementations and properties of various CRLH metamaterials are described in, for example, Caloz and Itoh, "Electromagnetic Metamaterials: Transmission Line Theory and Microwave Applications," John Wiley & Sons (2006). CRLH metamaterials and their applications in antennas are described by Tatsuo Itoh in "Invited paper: Prospects for Metamaterials," Electronics Letters, Vol. 40, No. 16 (August, 2004).

CRLH metamaterials may be structured and engineered to exhibit electromagnetic properties tailored to specific applications and may be used in applications where it may be difficult, impractical or infeasible to use other materials. In addition, CRLH metamaterials may be used to develop new applications and to construct new devices that may not be possible with RH materials.

In some applications, MTM and CRLH structures and components are based on a technology which applies the concept of Left-handed (LH) structures. As used herein, the terms "metamaterial," "MTM," "CRLH," and "CRLH MTM" refer to composite LH and RH structures engineered using conventional dielectric and conductive materials to produce unique electromagnetic properties, wherein such a composite unit cell is much smaller than the wavelength of the propagating electromagnetic waves.

Metamaterial technology, as used herein, includes technical means, methods, devices, inventions and engineering works which allow compact devices composed of conductive and dielectric parts and are used to receive and transmit electromagnetic waves. Using MTM technology, antennas and RF components may be made very compactly in comparison to competing methods and may be very closely spaced to each other or to other nearby components while at the same time minimizing undesirable interference and electromagnetic coupling. Such antennas and RF components further exhibit useful and unique electromagnetic behavior that results from one or more of a variety of structures to design, integrate, and optimize antennas and RF components inside wireless communications devices.

CRLH structures are structures that behave as structures exhibiting simultaneous negative permittivity (∈) and negative permeability (μ) in a frequency range and simultaneous positive ∈ and positive μ in another frequency range. Transmission-line (TL) based CRLH structures are structures that enable TL propagation and behave as structures exhibiting simultaneous negative permittivity (∈) and negative permeability (μ) in a frequency range and simultaneous positive ∈ and positive μ in another frequency range. The CRLH based antennas and TLs may be designed and implemented with and without conventional RF design structures.

Antennas, RF components and other devices made of conventional conductive and dielectric parts may be referred to as "MTM antennas," "MTM components," and so forth, when they are designed to behave as an MTM structure. MTM components may be easily fabricated using conventional conductive and insulating materials and standard manufacturing technologies including but not limited to: printing, etching, and subtracting conductive layers on substrates such as FR4, ceramics, LTCC, MMIC, flexible films, plastic or even paper.

BRIEF DESCRIPTION OF THE DRAWINGS

FIGS. 1A-1E illustrate various configurations of CRLH unit cells.

FIG. 1F illustrates a series RH TL expressed with an equivalent RH shunt capacitance $C_R$ and RH series inductance $L_R$.

FIG. 1G illustrates a shunt RH TL expressed with an equivalent RH shunt capacitance $C'_R$ and RH shunt inductance $L'_R$.

FIGS. 27A-27C illustrates three different ON/OFF configurations of two frequency selectors connected in parallel.

FIG. 36A-36C illustrate schematic diagrams of three different configurations for removing harmonics in a PA.

DETAILED DESCRIPTION

In modern communication systems, it is generally preferred that power amplifiers (PAs) have high linearity and/or efficiency in order to meet various specifications and achieve a certain performance level. High efficiency is important to prolong the battery lifetime of handsets so that the handsets work for a longer period of time. High linearity is important to maintain the integrity of the signal with minimal distortion.

MTM structures may be used to construct antennas, transmission lines and other RF components and devices, allowing for a wide range of technology advancements such as functionality enhancements, size reduction and performance improvements. This document describes designs of PAs and components used therein by using MTM structures to achieve both high efficiency and high linearity.

Figure 1:
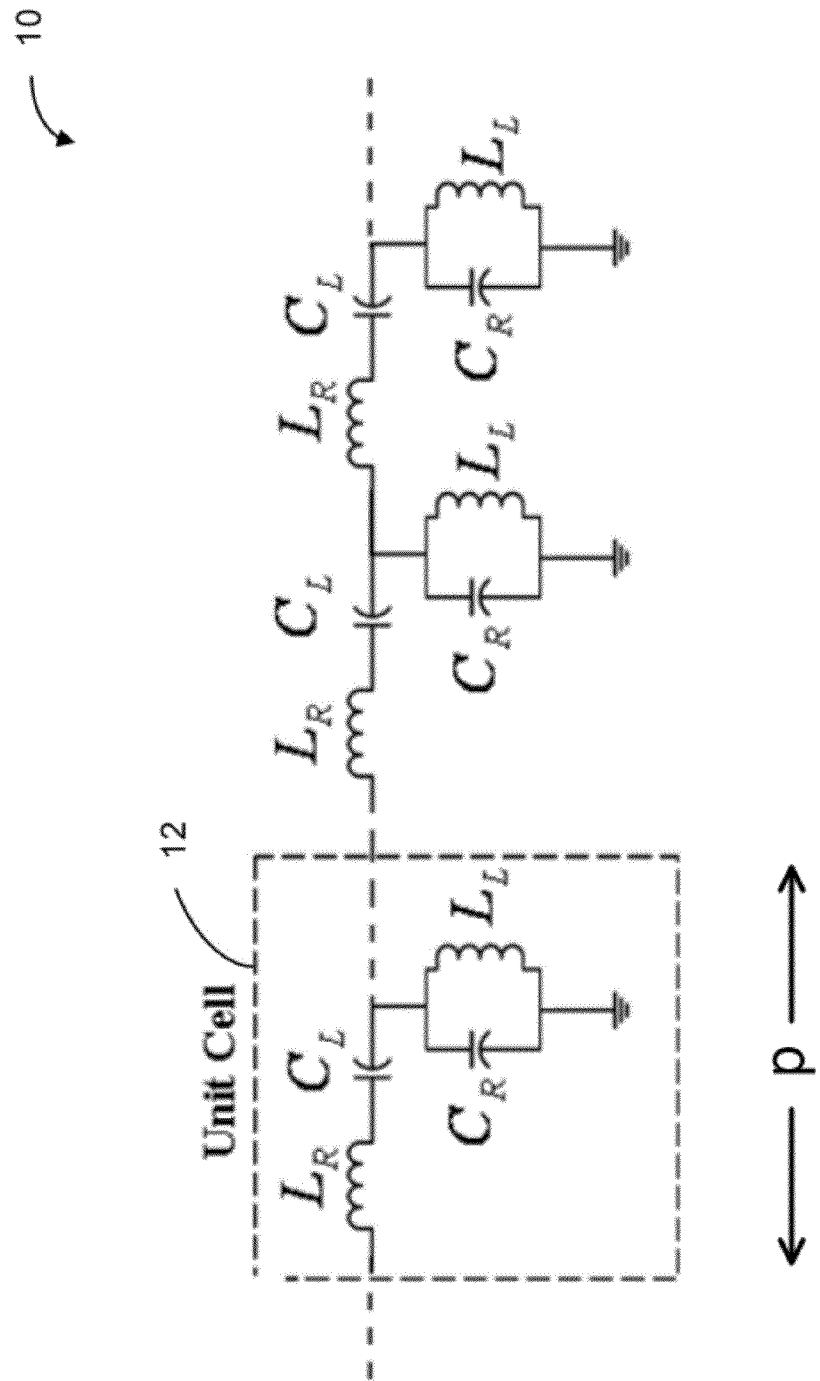
FIG. 1 illustrates an equivalent circuit of an MTM transmission line (TL) with at least three CRLH unit cells connected in series with a period p.

An MTM structure has one or more unit cells. The MTM-based components and devices may be designed based on these unit cells that may be implemented by using distributed circuit elements, lumped circuit elements or a combination of both. FIG. 1 illustrates an equivalent circuit 10 of an MTM transmission line (TL) with at least three CRLH unit cells connected in series with a period p. Denoting the length of the MTM TL by l and the number of CRLH unit cells by N, the relationship of l=N×p holds in general. The equivalent circuit for each unit cell 12 has an RH series inductance $L_R$, an RH shunt capacitance $C_R$, an LH series capacitance $C_L$ and an LH shunt inductance $L_L$. The LH shunt inductance $L_L$ and the LH series capacitance $C_L$ may be structured and connected to provide the LH properties to the unit cell 12, while the RH series inductance $L_R$ and the RH shunt capacitance $C_R$ may be structured and connected to provide the RH properties to the unit cell 12.

FIGS. 1A-1E illustrate various configurations of CRLH unit cells. A series RH block 100 represents an RH TL, such as a conventional microstrip, which may be equivalently expressed with the RH shunt capacitance $C_R$ 102 and the RH series inductance $L_R$ 104, as illustrated in FIG. 1F. When an RH TL is used in a shunt configuration as illustrated in FIG. 1G, the shunt RH TL 106 may be equivalently expressed by an RH shunt capacitance $C'_R$ 108 and an RH shunt inductance $L'_R$ 110. Note that when the series RH TL 100 and the shunt RH TL 106 are combined with a similar TL size, the $L_R$ value is more dominant than the $L'_R$ value, and the $C'_R$ value is more dominant than $C_R$ value. This indicates that the combination of a series and shunt RH TLs still provide RH properties with one overall RH shunt capacitance and one overall RH series inductance. FIGS. 1D and 1E illustrates examples of the original CRLH unit cell in FIG. 1 with the $C_R$ and $L_R$ replaced with the RH TL. "RH/2" in FIGS. 1A-1C refers to the length of the RH TL being divided by 2. FIG. 1A illustrates a symmetric representation of the CRLH unit cell illustrated in FIG. 1 with the $C_R$ and $L_R$ replaced with the RH TL, which is divided into two RH/2 for the symmetricity. Variations include a configuration as shown in FIG. 1A but with RH/2 and $C_L$ interchanged; and configurations as shown in FIGS. 1A-1C but with RH/4 on one side and 3RH/4 on the other side instead of RH/2 on both sides. Alternatively, other complementary fractions may be used to divide the RH transmission line. The MTM structures may be implemented based on these CRLH unit cells by using distributed circuit elements, lumped circuit elements or a combination of both. Such MTM structures may be fabricated on various circuit platforms, including circuit boards such as a FR-4 Printed Circuit Board (PCB) or a Flexible Printed Circuit (FPC) board. Examples of other fabrication techniques include thin film fabrication techniques, system on chip (SOC) techniques, low temperature co-fired ceramic (LTCC) techniques, monolithic microwave integrated circuit (MMIC) techniques, and MEMS (Micro-Electro Mechanical System) techniques. Some examples and implementations of antenna structures, transmission lines and other RF components based on MTM structures are described in the U.S. patent application Ser. No. 11/741,674 entitled "Antennas, Devices and Systems Based on Metamaterial Structures," filed on Apr. 27, 2007; the U.S. Pat. No. 7,592,957 entitled "Antennas Based on Metamaterial Structures," issued on Sep. 22, 2009; and the U.S. patent application Ser. No. 11/963,710 entitled "Power Combiners and Dividers Based on Composite Right and Left Handed Metamaterial Structures," filed on Dec. 21, 2007.

A pure LH metamaterial follows the left-hand rule for the vector trio (E,H,β), and the phase velocity direction is opposite to the signal energy propagation direction. Both the permittivity $\in$ and permeability $\mu$ of the LH material are simultaneously negative. A CRLH metamaterial exhibits left-handed and right-handed electromagnetic properties depending on the regime or frequency of operation. In addition, the CRLH structure may exhibit a non-zero group velocity when the wavevector β (or propagation constant) of a signal is zero. In an unbalanced case where $C_R L_L \neq C_L L_R$, there is a bandgap in which electromagnetic wave propagation is inhibited. In a balanced case where $C_R L_L = C_L L_R$, the dispersion curve does not show discontinuity at the transition point of the propagation constant $\beta(\omega_o)=0$ between the LH and RH regions, where the guided wavelength is infinite, i.e., $\lambda_g = 2\pi/|\beta| \to \infty$, while the group velocity is positive:

$$v_g = \frac{d\omega}{d\beta}\bigg|_{\beta=0} > 0. \qquad \text{Eq. (1)}$$

This state corresponds to the zeroth order mode in a TL implementation.

Figure 2:
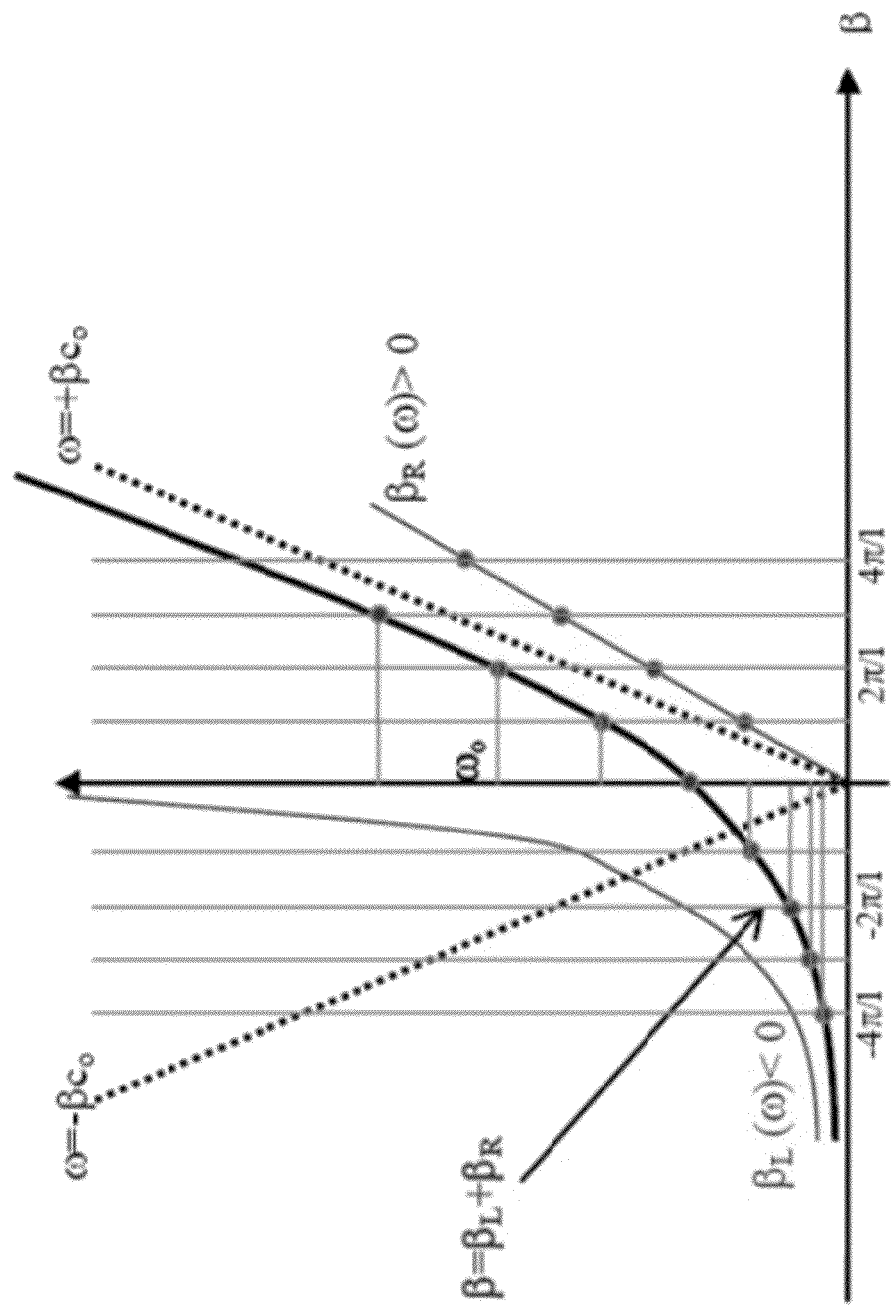
FIG. 2 illustrates a CRLH dispersion curve for a balanced CRLH unit cell, in comparison with an RH dispersion curve and an LH dispersion curve.

FIG. 2 illustrates a CRLH dispersion curve β for a balanced CRLH unit cell, where $C_R L_L = C_L L_R$, in comparison to the RH dispersion curve $\beta_R$ and the LH dispersion curve $\beta_L$. The CRLH dispersion curve for this case may be approximated by:

$$\beta = \frac{1}{p}\left(\omega\sqrt{L_R C_R} - \frac{1}{\omega\sqrt{L_L C_L}}\right). \qquad \text{Eq. (2)}$$

In the unbalanced case where $C_R L_L \neq C_L L_R$, the dispersion curve β may be expressed as:

$$\beta = \frac{1}{p}\left(s(\omega)\sqrt{\omega^2 L_R C_R + \frac{1}{\omega^2 L_L C_L} - \left(\frac{L_R}{L_L} + \frac{C_R}{C_L}\right)}\right), \qquad \text{Eq. (3)}$$

where $$s(\omega) = \begin{cases} -1 & \text{if } \omega < \min(\omega_{se}, \omega_{sh}) \text{: } LH \text{ range} \\ +1 & \text{if } \omega > \max(\omega_{se}, \omega_{sh}) \text{: } RH \text{ range} \end{cases}. \qquad \text{Eq. (4)}$$

In the unbalanced case, there are two possible zero$^{th}$ order resonances, $\omega_{se}$ and $\omega_{sh}$, which can support an infinite wavelength (β=0, fundamental mode) and are expressed as:

$$\omega_{sh} = \frac{1}{\sqrt{C_R L_L}} \text{ and } \omega_{se} = \frac{1}{\sqrt{C_L L_R}}. \qquad \text{Eq. (5)}$$

At $\omega_{se}$ and $\omega_{sh}$, the group velocity ($v_g = d\omega/d\beta$) is zero and the phase velocity ($v_p = \omega/\beta$) is infinite. When the CRLH unit cell is balanced, these resonant frequencies coincide as shown in FIG. 2 and are expressed as:

$$\omega_{se} = \omega_{sh} = \omega_0, \qquad \text{Eq. (6)}$$

where the positive group velocity ($v_g = d\omega/d\beta$) as in Eq. (1) and the infinite phase velocity ($v_p = \omega/\beta$) may be obtained. In RH TL resonators, the resonance frequencies correspond to electrical lengths of $\theta_m = \beta_m l = m\pi$ (m=1, 2, 3, ... ), where l is the length of the TL. The RH dispersion curve and the LH dispersion curve are represented by $\beta_R$ and $\beta_L$, respectively, in FIG. 2. The CRLH dispersion curve is represented by $\beta = \beta_R + \beta_L$ in FIG. 2, where $\beta_R$ and $\beta_L$ correspond to the first term and the second term, respectively, in Eq. (2). In CRLH TL resonators, the resonance frequencies correspond to electrical lengths of $\theta_m = \beta_m l = m\pi$, where l is the length of the CRLH TL with the relationship of l=N×p, and the parameter m=0, ±1, ±2, ±3, ..., ±∞. Thus, a CRLH structure supports a spectrum of resonant frequencies with a dispersion curve that extends to both negative and positive β region, as indicated by the vertical lines intercepting the CRLH dispersion curve in FIG. 2.

For the balanced case having the dispersion curve expressed as in Eq. (2), the phase response may be expressed by:

$$\phi_{CRLH} = \phi_{RH} + \phi_{LH} = -\beta 1, \quad \text{Eq. (7)}$$

$$\phi_{RH} = -N2\pi f \sqrt{L_R C_R}, \quad \text{Eq. (8)}$$

$$\phi_{LH} = \frac{N}{2\pi f \sqrt{L_L C_L}}, \quad \text{Eq. (9)}$$

where $l=N \times p$. Thus, the slope of the CRLH phase is given by:

$$\frac{d\phi_{CRLH}}{df} = -N2\pi \sqrt{L_R C_R} - \frac{N}{2\pi f^2 \sqrt{L_L C_L}}. \quad \text{Eq. (10)}$$

The characteristic impedance is given by:

$$Z_o^{CRLH} = \sqrt{\frac{L_R}{C_R}} = \sqrt{\frac{L_L}{C_L}}. \quad \text{Eq. (11)}$$

Therefore, the equivalent circuit parameter values, $C_R$, $L_L$, $C_L$, and $L_R$ as well as the number of unit cells, N, may be selected and controlled, with constraints such as the impedance matching conditions of Eq. (11), to create a desired phase response curve in a CRLH structure. Furthermore, a non-zero frequency may be obtained at 0 degree in a CRLH structure unlike in an RH structure.

The following provides examples of determining the equivalent circuit parameters of a dual-band MTM structure. Similar techniques may be used to determine the parameters with three or more bands. In a dual-band MTM design, signal frequencies $f_1$ and $f_2$ representing the two bands may be first selected for two different phase values: $\phi_1$ at $f_1$ and $\phi_2$ at $f_2$. Using Eqs. (7)-(11), the values of parameters $L_R$, $C_R$, $L_L$ and $C_L$ can be obtained as:

$$L_R = \frac{Z_t\left[\phi_1\left(\frac{\omega_1}{\omega_2}\right) - \phi_2\right]}{N\omega_2\left[1 - \left(\frac{\omega_1}{\omega_2}\right)^2\right]}, \quad C_R = \frac{\phi_1\left(\frac{\omega_1}{\omega_2}\right) - \phi_2}{N\omega_2 Z_t\left[1 - \left(\frac{\omega_1}{\omega_2}\right)^2\right]}, \quad \text{Eq. (12)}$$

$$L_L = \frac{NZ_t\left[1 - \left(\frac{\omega_1}{\omega_2}\right)^2\right]}{\omega_1\left[\phi_1 - \left(\frac{\omega_1}{\omega_2}\right)\phi_2\right]}, \quad C_L = \frac{N\left[1 - \left(\frac{\omega_1}{\omega_2}\right)^2\right]}{\omega_1 Z_t\left[\phi_1 - \left(\frac{\omega_1}{\omega_2}\right)\phi_2\right]},$$

where $Z_t$ is a given value for $Z_0^{CRLH}$, e.g., 50Ω, representing the characteristic impedance of the underlying system. A CRLH TL has a physical length of l with N unit cells, each having a period of p, where $l=N \times p$. The signal phase value is defined by $\phi=-\beta l$. Therefore, we have:

$$\beta = -\frac{\phi}{l}, \quad \text{Eq. (13)}$$

which indicates:

$$\beta_i = -\frac{\phi_i}{(N \cdot p)}, \quad \text{Eq. (14)}$$

where i=1 or 2. It is thus possible to select two different phases $\phi_1$ and $\phi_2$ at two different frequencies $f_1$ and $f_2$, respectively, as:

$$\begin{cases} \beta_1 = \frac{1}{p}\left(\omega_1 \sqrt{L_R C_R} - \frac{1}{\omega_1 \sqrt{L_L C_L}}\right) \\ \beta_2 = \frac{1}{p}\left(\omega_2 \sqrt{L_R C_R} - \frac{1}{\omega_2 \sqrt{L_L C_L}}\right) \end{cases} \quad \text{Eq. (15)}$$

Therefore, the five parameters $L_L$, $C_R$, $L_R$, $C_L$ and N as obtained above can determine the N resonant frequencies and phase response curves, corresponding bandwidth, and input/output TL impedance variations around these resonances. The above theory and derivations may be found, for example, in Caloz and Itoh, "Electromagnetic Metamaterials: Transmission Line Theory and Microwave Applications," John Wiley & Sons (2006).

Figure 3:
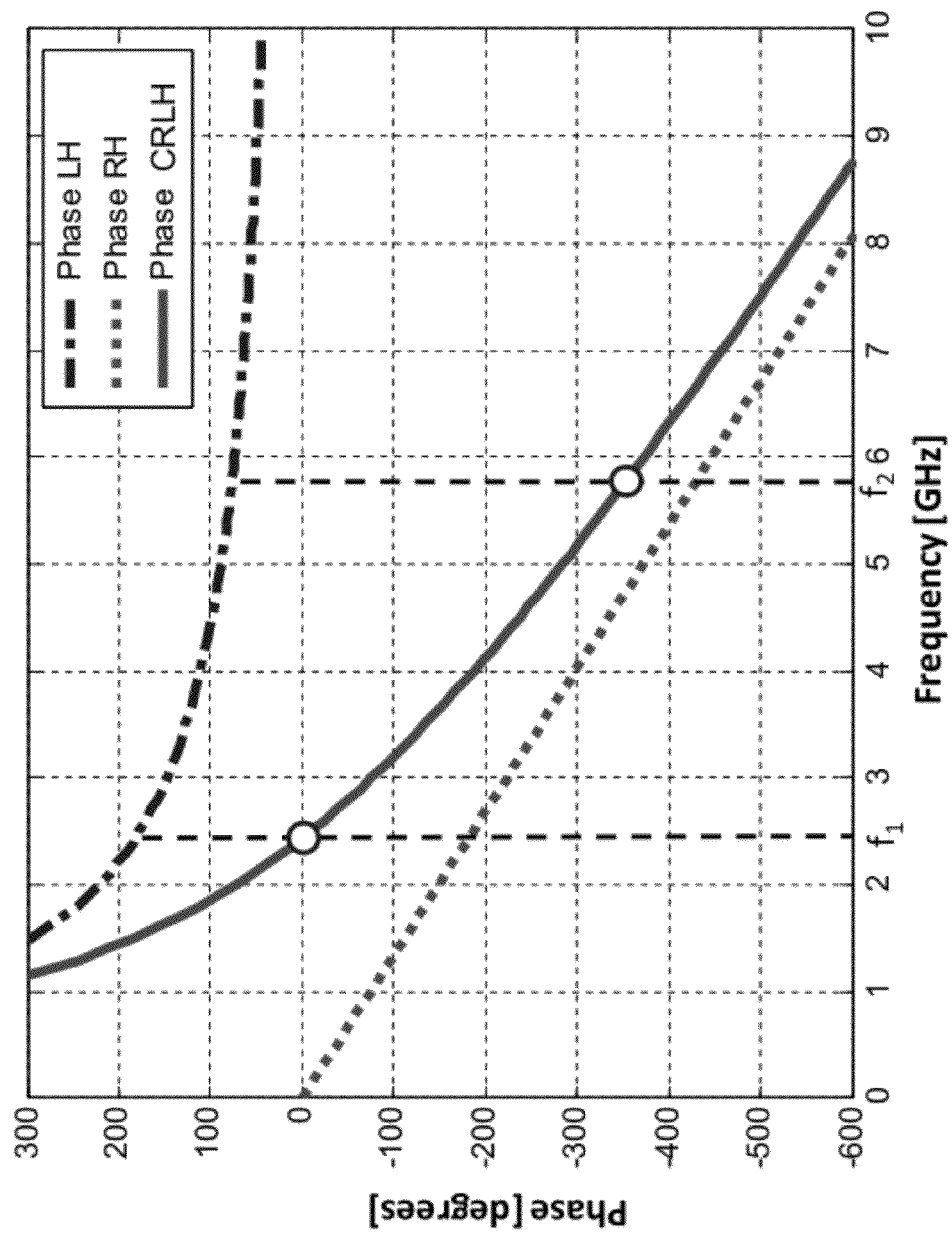
FIG. 3 illustrates examples of an RH phase response, an LH phase response and a CRLH phase response, indicated by dotted line, dashed-dotted line and solid line, respectively.

FIG. 3 illustrates an example of an RH phase response, an LH phase response and a CRLH phase response, indicated by dotted line, dashed-dotted line and solid line, respectively. The CRLH phase response may be expressed as a combination of the phase response of the RH component and the phase response of the LH component as expressed in Eqs. (7), (8) and (9). The CRLH TL phase response approaches to the LH phase response at low frequencies and approaches to the RH phase response at high frequencies. Notably, the CRLH phase response curve crosses the zero-phase axis with a frequency offset from zero and extends to both positive and negative infinity. Thus, the CRLH phase response curve may be engineered to intercept a desired pair of phases at an arbitrarily selected pair of non-zero frequencies. The values of the parameters $L_L$, $C_R$, $L_R$, $C_L$ and N may be selected and controlled to create a desired phase response. The number of unit cells, N, may be chosen to be a small number such as 1, 2 or 3 for achieving circuit simplicity and component count reduction. With such a fixed N value, the original four degree of freedom, i.e., $L_L$, $C_R$, $L_R$, and $C_L$, is reduced to two due to constraints such as the impedance matching conditions given in Eq. (11), in determining the parameter values for the CRLH design. By way of example, FIG. 3 illustrates a CRLH design example in which the phase chosen at the first frequency $f_1$ is 0 degree and the phase chosen at the second frequency $f_2$ is −360 degrees.

These CRLH properties may be utilized to provide antennas, directional couplers, matching networks, PAs, filters, power combiners and splitters, and various other RF components and integrated systems for single-band as well as multi-band operations. Some implementation examples of PAs and components or circuits used therein are described below based on CRLH structures in comparison with conventional examples.

Figure 4:
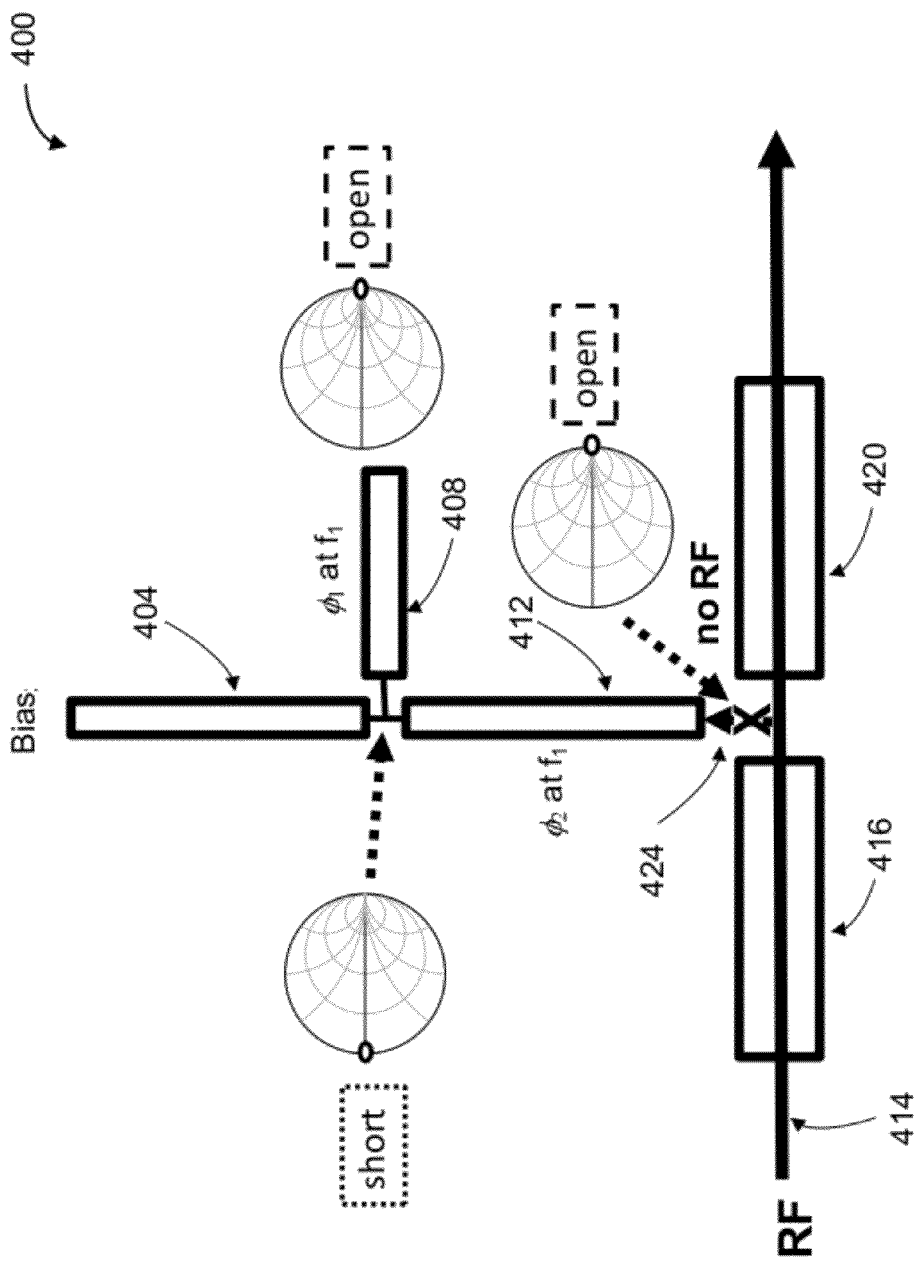
FIG. 4 illustrates an example of a conventional single-band bias circuit coupled to an RF signal path for biasing a transistor in a power amplifier (PA).

FIG. 4 illustrates an example 400 of a conventional single-band bias circuit coupled to an RF signal path for biasing a transistor in a PA. In RF communication systems, a bias circuit is generally designed to deliver DC power to the transistor while being transparent to the RF signal so as to prevent the RF signal leakage into the bias circuit that can degrade the performance of the PA in which the bias circuit is included. The conventional single-band bias circuit of FIG. 4 includes three RH TLs, 404, 408, and 412 connected radially at one end of each TL, and coupled to the RF signal path 414 through a bias line 424. The single band is represented by the operating frequency $f_1$, a bias voltage or current is supplied through the RH TL 404, and the RF signal path 414 is indicated by the arrow through two circuit blocks 416 and 420. The circuit blocks 416 and 420 represent a transistor and other peripheral RF circuitry. The electrical length of each of the RH TLs 408 and 412 may be chosen to be a quarter wavelength at $f_1$ to create a short circuit at the connected end (proximal end) and an open circuit at the other end (distal end). Equivalently, the phase $\phi_1$ at $f_1$ of the RH TL 408 and the phase $\phi_2$ at $f_1$ of the RH TL 412 may be chosen to be $-90°\times(2k+1)$, where $k=0, 1, 2, \ldots$. Note that the RH phase is negative except the DC point, as shown in Eq. (8) and FIG. 2. The locations of the short point and the open point are indicated on the Smith Charts in FIG. 4. In this example, the distal end of the RH TL 408 is configured to be open instead of being shorted to ground, a circuit or a component. By having a quarter wavelength at $f_1$, the RH TL 408 acts as an impedance transformer to change the impedance from an open at the distal end to a short at the proximal end. Furthermore, by having a quarter wavelength at $f_1$, the RH TL 412 acts as another impedance transformer to change the impedance from a short at the proximal end to an open at the distal end, which is coupled to the transistor through a bias line 424. Therefore, the RF signal path 414 is not affected by the bias line 424 because it is open for the RF signal with $f_1$. This configuration allows for the same operation at a single frequency or an odd multiple of a selected frequency based on the use of quarter-wavelength RH TLs. This is because the choice of the RH phases is restricted to be on the linear line in frequency, as shown in Eq. (8) and FIG. 2. Accordingly, the conventional design based on RH TLs may not be suitable for a multiband application, which involves two or more arbitrary frequencies that may not be a multiple of each other.

In the above example, the shape of the quarter-wavelength RH TL is chosen to be a straight stub. In another conventional example, the shape of the quarter-wavelength RH TL may be chosen to be radial, which may contribute to increasing the bandwidth. However, such a radial RH TL generally occupies more real estate than a stub-shaped RH TL.

Figure 5:
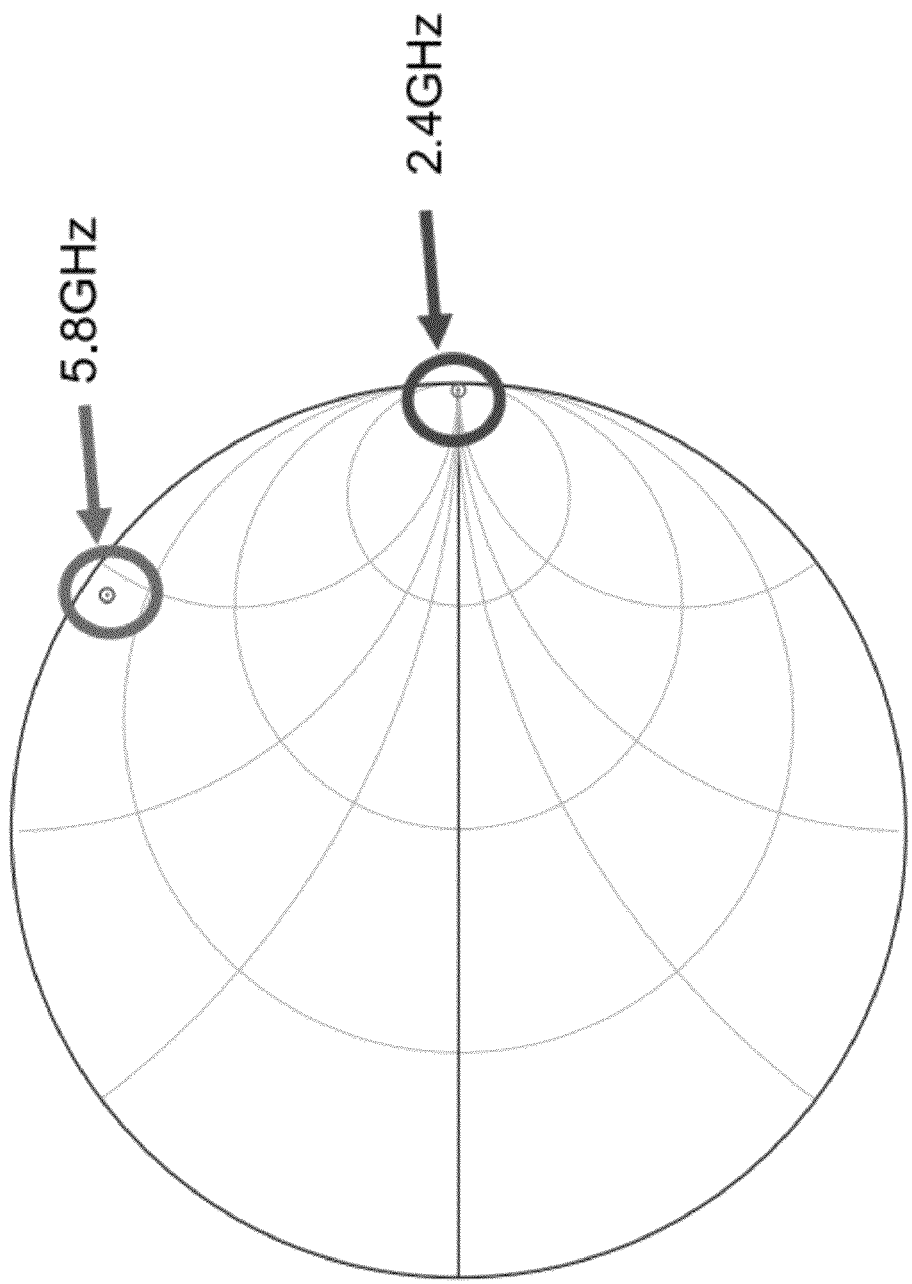
FIG. 5 plots simulation results of the impedance on the Smith Chart for two frequencies 2.4 GHz and 5.8 GHz for WiFi applications using the conventional single-band bias circuit illustrated in FIG. 4.

FIG. 5 plots simulation results of the impedance on the Smith Chart for two frequencies 2.4 GHz and 5.8 GHz for WiFi applications using the conventional single-band bias circuit illustrated in FIG. 4. The results indicate that it is unfeasible to have an open circuit in the bias line 424 for two or more selected frequencies at the same time in the conventional single-band bias scheme. Specifically, the bias line may form an open circuit at one of the frequencies of interest (e.g., 2.4 GHz), but at the other frequency (e.g., 5.8 GHz) the bias line provides an impedance that may be at a different point on the Smith Chart as illustrated in FIG. 5. The difficulty of adjusting two impedances corresponding to two arbitrary frequencies may be attributed to the use of conventional RH TLs, which have a substantially linear phase response as shown by the dotted line in FIG. 3 and in Eq. (8).

Figure 6:
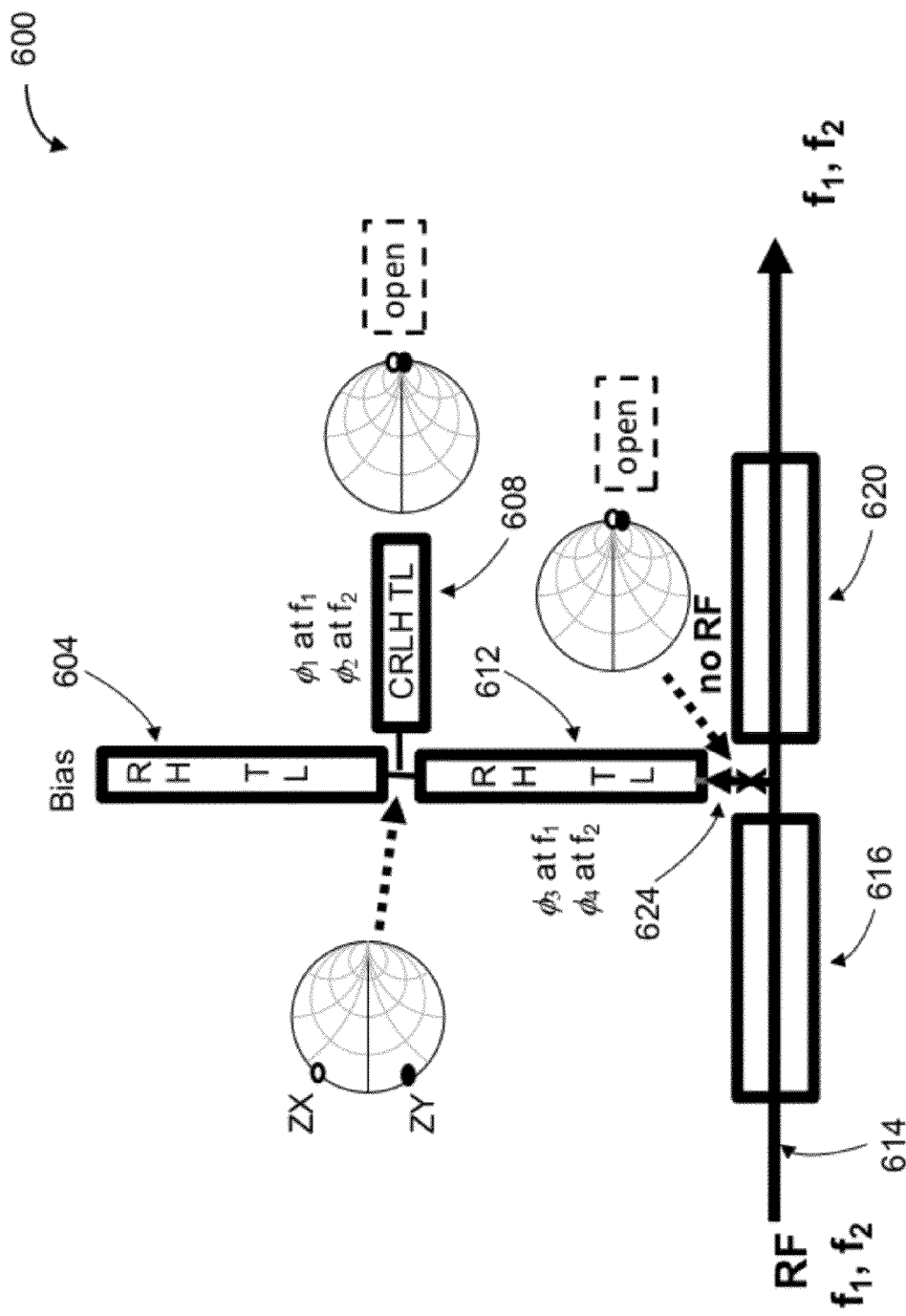
FIG. 6 illustrates an example of a dual-band bias circuit coupled to an RF signal path for biasing a transistor in a PA.

Multiband bias circuits may be constructed based on MTM structures to overcome some of the deficiencies associated with the conventional single-band bias circuit described as above. FIG. 6 illustrates an example 600 of a dual-band bias circuit coupled to an RF signal path for biasing a transistor in a PA. This dual-band bias circuit includes two RH TLs 604 and 612 and one CRLH TL 608 connected radially at the proximal end of each TL, and coupled to the RF signal path 614 through a bias line 624. The dual band is represented by the operating frequencies $f_1$ and $f_2$, a bias voltage or current is supplied through the RH TL 604, and the RF signal path 614 with frequencies $f_1$ and $f_2$ is indicated by the arrow through two circuit blocks 616 and 620. The circuit blocks 616 and 620 represent a transistor and other peripheral circuitry. This configuration includes one CRLH TL 608 and one RH TL 612 for the impedance transforming purpose, instead of two quarter-wavelength RH TLs as in the conventional single-band bias circuit in FIG. 4. Use of the CRLH TL 608 allows for an open bias line 624 at two different RF frequencies $f_1$ and $f_2$ while permitting DC power to flow to the transistor, as explained below with reference to the Smith charts in the figure. The electrical length of the RH TL 612 may be chosen to have two arbitrary phases $\phi_3=X°$ and $\phi_4=Y°$ at two frequencies $f_1$ and $f_2$, respectively, provided that they are in the linear relationship. That is, these two points correspond to a pair of points on the RH phase response line such as the dotted line shown in FIG. 3. Due to the linearity of the RH phase response, when one of the phases ($X°$ or $Y°$) is chosen, the other ($Y°$ or $X°$) is automatically fixed for fixed $f_1$ and $f_2$. In order to have an open circuit at the distal end of the RH TL 612 with the distal end of the CRLH TL 608 being open, the impedances ZX and ZY corresponding to the phases $X°$ and $Y°$ need to be compensated for by the CRLH TL 608. This is possible due to a greater degree of freedom in determining the CRLH phase response than the RH phase response. The electrical length of the CRLH TL 608 may be chosen to have $\phi_1=360°-X°$ at $f_1$ and $\phi_2=360°-Y°$ at $f_2$, for example, so that the CRLH TL 608 acts as an impedance transformer between ZX/ZY and an open. These two points correspond to a pair of points on the CRLH phase response line such as the solid line shown in FIG. 3. The locations of the open point, the ZX point and the ZY point are indicated on the Smith Charts in FIG. 6. The RF path 614 is not affected because the bias line 624 is open for the RF signals with $f_1$ and $f_2$. In this example, the total electrical length from the open to the bias line 624 (i.e., from the open end of the CRLH TL 608 to the open end of the RH TL 612) is chosen to be 360°. In general, the total electrical length may be chosen to be 0°, 180°, 360° or a multiple of 180° to obtain the open-to-open impedance transformation. That is, $\phi_1=k\times180°-X°$ at $f_1$ and $\phi_2=k\times180°-Y°$ at $f_2$, where $k=0, \pm1, \pm2, \ldots$.

The dual-band MTM bias approach shown in FIG. 6 may be extended to a multiband MTM bias approach by choosing multiple phases for the RH TL 612 corresponding to multiple frequencies on the RH phase response line such as the dotted line in FIG. 3, and choosing the CRLH phases to compensate for the respective RH phases. Furthermore, this configuration may be extended to the case where the distal end of the CRLH TL 608 is shorted instead of open. In this case, the phases of the CRLH TL 608 may be chosen so that the CRLH TL 608 acts as an impedance transformer to transform the short to ZX/ZY. In this example, the total electrical length from the short to the bias line 624 (i.e., from the shorted end of the CRLH TL 608 to the open end of the RH TL 612) may be chosen to be $\phi_1=k\times90°-X°$ at $f_1$ and $\phi_2=k\times90°-Y°$ at $f_2$, where $k=\pm1, \pm2, \ldots$. The similar design approach based on the CRLH structure may be employed for three or more band biasing to provide a multiband MTM bias circuit with the shorted CRLH TL as well.

Figure 7:
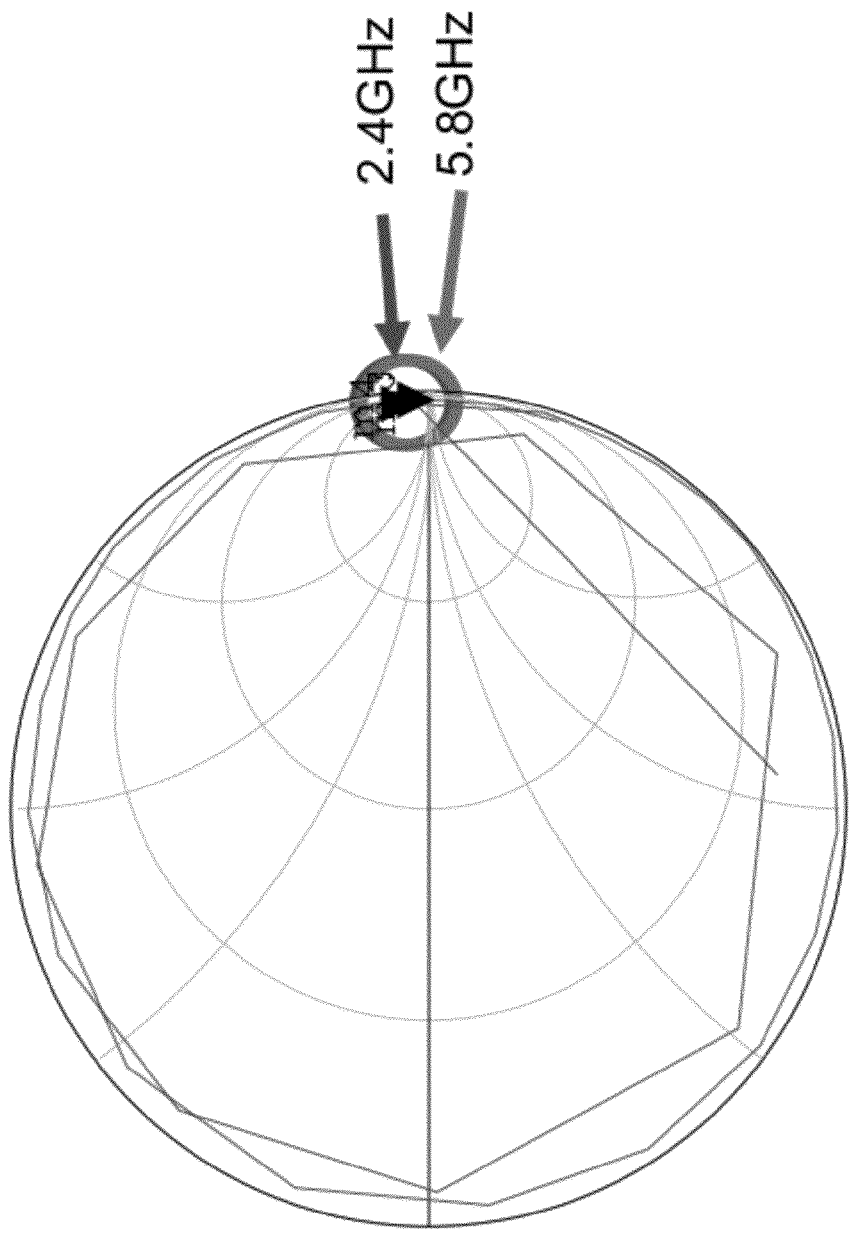
FIG. 7 plots measurement results of the impedance on the Smith Chart for two frequencies 2.4 GHz and 5.8 GHz using the dual-band bias circuit illustrated in FIG. 6.

FIG. 7 plots measurement results of the impedance on the Smith Chart for two frequencies 2.4 GHz and 5.8 GHz using the dual-band bias circuit illustrated in FIG. 6. In this example, one CRLH unit cell as illustrated in FIG. 1 is used to construct the CRLH TL 608, with the equivalent circuit parameter values of about $C_L=0.61$ pF, $L_L=5.25$ nH, $C_R=1.96$ pF and $L_R=16.9$ nH, which provide the adequate CRLH phase response for this dual-band application. The results indicate that an open circuit may be obtained at the bias line for both $f_1=2.4$ GHz and $f_2=5.8$ GHz due to the design and phase flexibility by use of the CRLH TL.

In another example, a dual-band bias circuit based on a CRLH TL may be configured to have an open bias line for one frequency $f_1$ and a shorted bias line at a different frequency $f_2$. Alternatively, the second frequency $f_2$ may be selected to be a second or higher harmonic.

In the example 600 of the dual-band bias circuit design described above, the RH TL 612 and CRLH TL 608 are configured to block a single RF signal or double RF signals at the bias line. Instead of blocking, signals with certain frequencies may be selected to pass through a desired path. Such a frequency selector may be constructed using a CRLH structure, in which a signal with one frequency $f_1$ is allowed to transmit while another signal with a different frequency $f_2$ is blocked or filtered out. The frequency selector may thus provide a filtering function, as typically exhibited in a notch filter, for example, and may be designed as a building block for a PA or other communication systems. Some examples of frequency selectors based on CRLH structures are given below.

Figure 8:
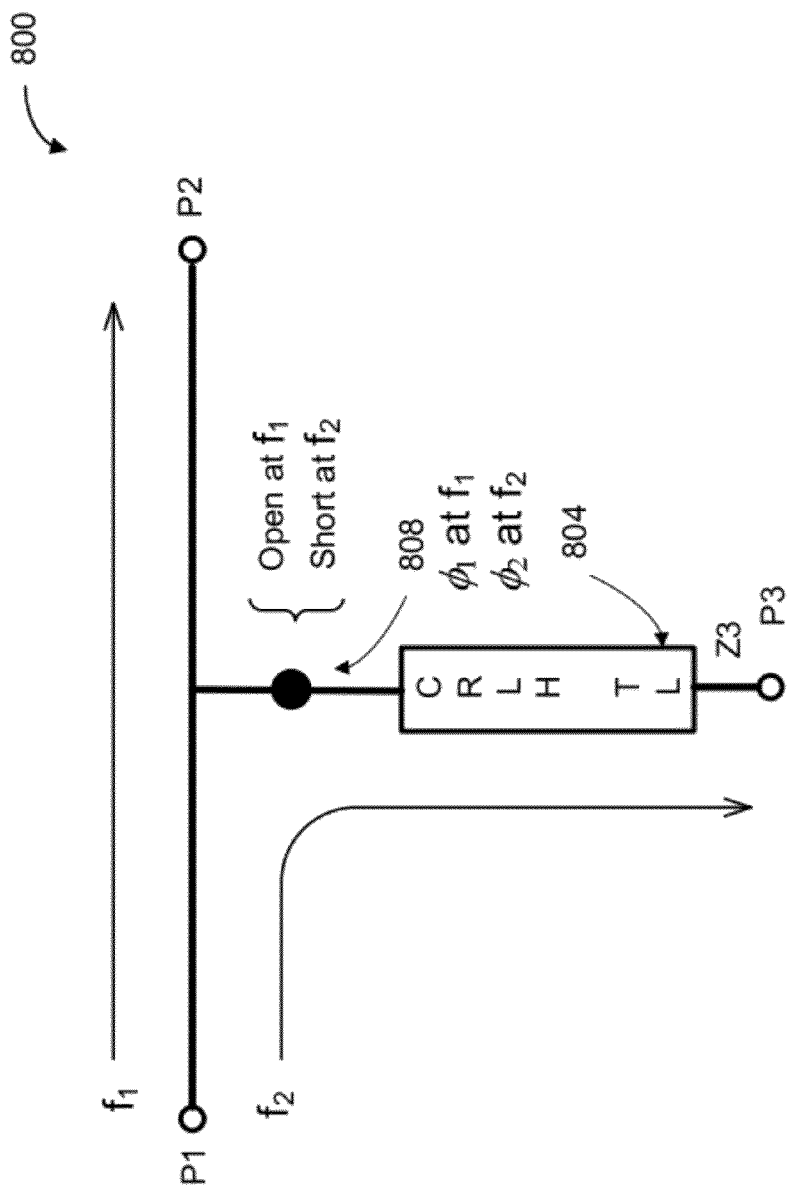
FIG. 8 illustrates an example of a frequency selector having a shunt CRLH TL configuration.

FIG. 8 illustrates an example of a frequency selector 800 having a shunt CRLH TL configuration. A port P1 is an input port where RF signals are inputted, and a port P2 is an output port where the RF signals are outputted. One end (distal end) of a CRLH TL 804 is coupled to a port P3, which may be shorted or open. The other end (proximal end) of the CRLH TL 804 is coupled to the signal path P1-P2 through a shunt line 808. The shunt line 808 may be controlled to be open for the signal with $f_1$ and shorted for the signal with $f_2$ by configuring the CRLH TL 804 to have adequate phases for the signals with $f_1$ and $f_2$ based on the CRLH phase response. In this example, the CRLH TL 804 is utilized as an impedance transformer that transforms the impedance Z3 (e.g., open or short) at the port P3 to an open for $f_1$ and to a short for $f_2$ at the shunt line 808. As a result, the signal with $f_1$ is allowed to transmit through the P1-P2 path, while the signal with $f_2$ is filtered out or removed through the shunt line 808 and the CRLH TL 804, being blocked from reaching the output port P2. Theoretically, the impedance Z3 is infinite when the port P3 is open, and is zero when the port P3 is shorted. However, in actuality and in this document, the term "an open" is used to indicate a high impedance achievable for the implementation and application and the term "a short" is used to indicate a low impedance achievable for the implementation and application.

The electrical length of the CRLH TL 804 may be engineered to correspond to a certain phase at a certain frequency as illustrated with the CRLH phase response curve in FIG. 3. In order to have the shunt line 808 open at $f_1$ and the shunt line 808 shorted at $f_2$ when the port P3 is open, a wide variety of phase combinations may be used. Using the CRLH TL, the phase $\phi_1$ at $f_1$ may configured to be:

$$\phi_1=0°\pm(k\times180°), \quad \text{Eq. (16)}$$

where k=0, 1, 2, . . . , to have an open circuit at the shunt line 808. Similarly, the phase $\phi_2$ at $f_2$ may be configured to be:

$$\phi_2=90°\pm(k\times180°), \quad \text{Eq. (17)}$$

where k=0, 1, 2, . . . , to have a shorted circuit at the shunt line 808. Alternatively, when the port P3 is shorted, a wide variety of phase combinations may also be used in order to have an open shunt line 808 at $f_1$ and a shorted shunt line 808 at $f_2$. For the case of having the shunt CRLH TL 804 shorted to ground, a circuit or a component, the phase $\phi_1$ at $f_1$ may be configured to be:

$$\phi_1=90°\pm(k\times180°), \quad \text{Eq. (18)}$$

where k=0, 1, 2, . . . , to have an open circuit at the shunt line 808. Similarly, the phase $\phi_2$ at $f_2$ may be configured to be:

$$\phi_2=0°\pm(k\times180°), \quad \text{Eq. (19)}$$

where k=0, 1, 2, . . . , to have a short circuit at the shunt line 808.

Figure 9:
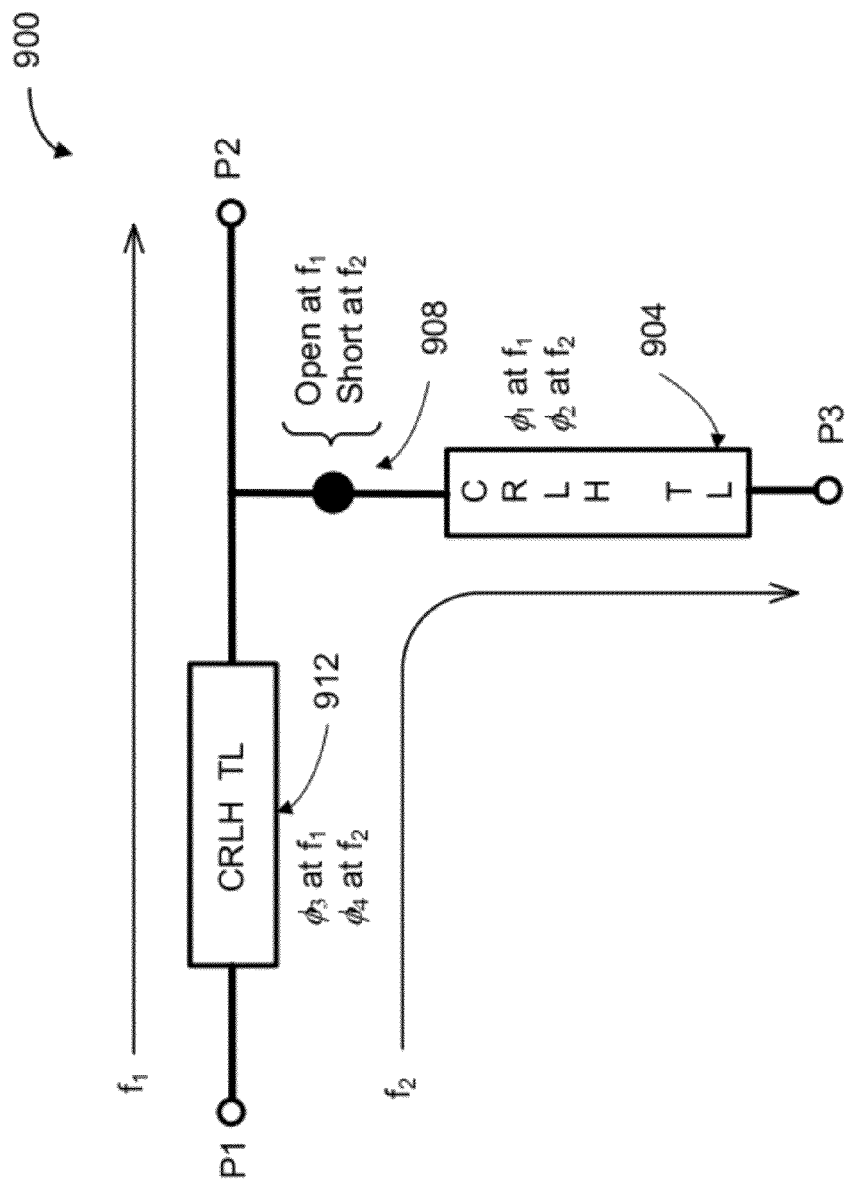
FIG. 9 illustrates an example of a frequency selector having two CRLH TLs, one CRLH TL in shunt and the other in series.

Based on the frequency selecting scheme using the shunt CRLH TL 804 as explained above, various frequency selectors may be constructed using combinations of CRLH and RH TLs. For example, a frequency selector may include a combination of two CRLH TLs, while another example may include a CRLH TL and an RH TL, to perform the frequency selecting function. FIG. 9 illustrates an example of a frequency selector 900 having two CRLH TLs, one CRLH TL 904 in shunt and the other 912 in series with the signal path P1-P2. Similar to the configuration illustrated in FIG. 8, one end (distal end) of the shunt CRLH TL 904 is coupled to the port P3, which may be shorted or open. The other end (proximal end) of the shunt CRLH TL 904 is coupled to the signal path P1-P2 through a shunt line 908. The shunt line 908 may be controlled to be open for the signal with $f_1$ and shorted for the signal with $f_2$ by configuring the shunt CRLH TL 904 to have adequate phases $\phi_1$ and $\phi_2$ for the signals with $f_1$ and $f_2$, respectively. The phases $\phi_1$ and $\phi_2$ of the shunt CRLH TL 904 may be chosen from the values in Eqs. (16) and (17), respectively, when the P3 is open and in Eqs. (18) and (19) when the P3 is shorted. One end of the series CRLH TL 912 is coupled to the input port P1 and the other end is coupled to the shunt line 908. The phases $\phi_3$ and $\phi_4$ of the series CRLH TL 912 may be selected as below when the port P3 is either open or shorted. For the signal with $f_1$, the shunt CRLH TL 904 is decoupled from the signal path P1-P2; thus, the series CRLH TL 912 may be structured to have a matched impedance between the input and output impedances, e.g., 50Ω, with the phase $\phi_3$ at $f_1$ being arbitrary. For the signal with $f_2$, the shunt line 908 is shorted, and the input port P1 is preferably designed to be open to have maximum signal reflection. Thus, the $\phi_4$ at $f_2$ of the series CRLH TL 912 may be chosen to be $90°\pm(k\times180°)$, where k=0, 1, 2, . . . , to transform the impedance from a short to an open. Alternatively, to design the input port P1 to be shorted, the $\phi_4$ at $f_2$ of the series CRLH TL 912 may be chosen to be $0°\pm(k\times180°)$, where k=0, 1, 2, . . . , to transform or keep the impedance from a short to a short. Furthermore, the CRLH TL 904 may be designed differently so that these phases $\phi_3$ and $\phi_4$ have other values suited for underlying applications to adjust the signal transmission and reflection. Using a series TL and a shunt TL, as in the above example, provides the flexibility to adjust the phases $\phi_3$ and $\phi_4$ associated with the series TL while the phases $\phi_1$ and $\phi_2$ associated with the shunt TL are kept to provide an open or a short to block or transmit signals with certain frequencies.

In one implementation example, the frequency selector 900 of FIG. 9 may be constructed to have the series CRLH TL 912 providing a phase $\phi_3=0°$ at a frequency $f_1=2.4$ GHz and a phase $\phi_4=-90°$ at a frequency $f_2=5.8$ GHz and the shunt CRLH TL 904 providing a phase $\phi_1=0°$ at a frequency $f_1=2.4$ GHz and a phase $\phi_2=-90°$ at a frequency $f_2=5.8$ GHz with the port P3 open. These phase responses may be obtained by designing the series CRLH TL 912 with two CRLH unit cells and the shunt CRLH TL 904 with one CRLH unit cell, each unit cell having equivalent circuit parameter values of about $C_L=1.7$ pF, $L_L=4.25$ nH, $L_R=2.6$ nH and $C_R=1$ pF.

Figure 10:
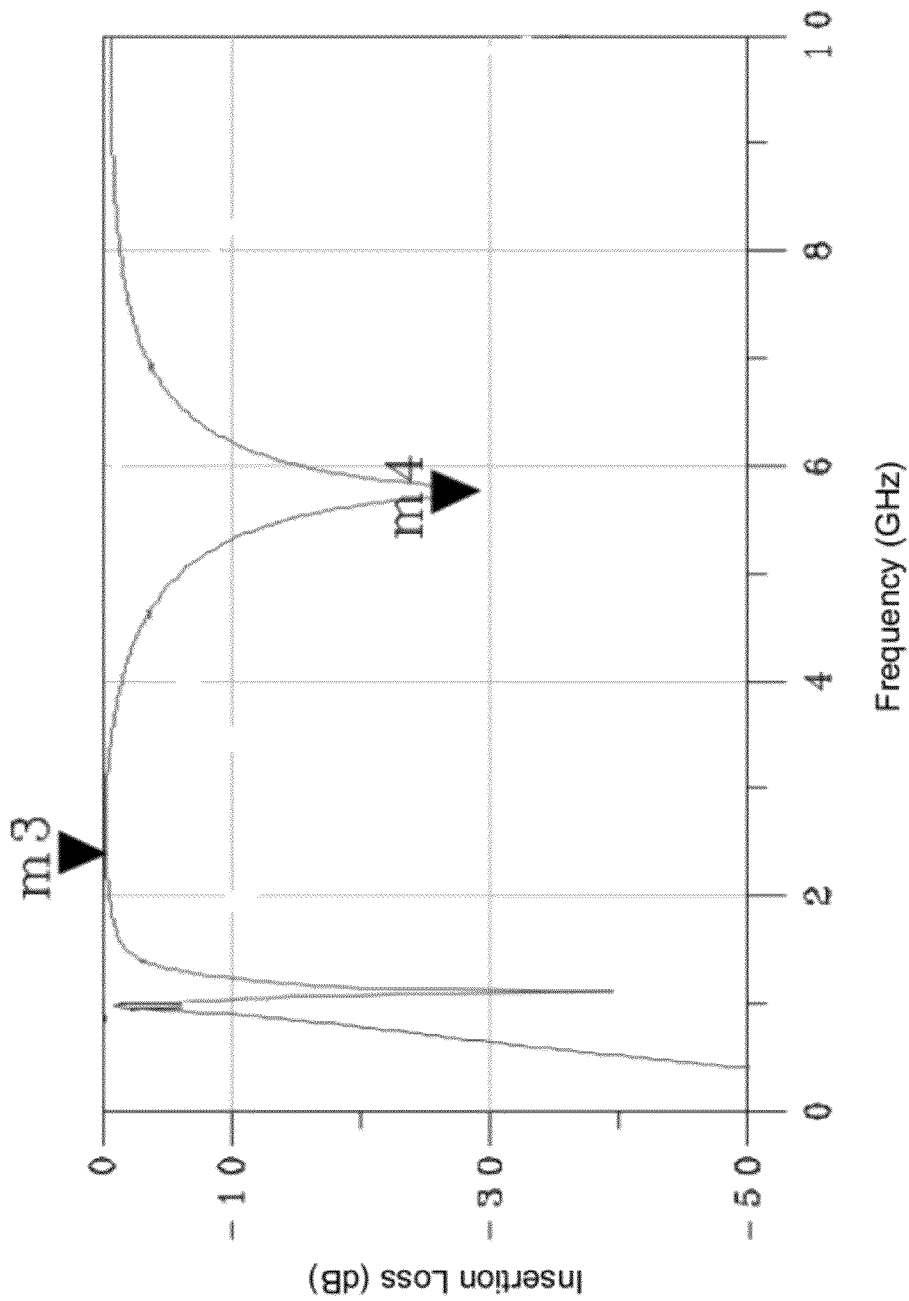
FIG. 10 plots simulation results of the insertion loss for an implementation example of the frequency selector of FIG. 9.

FIG. 10 plots simulation results of insertion loss for an implementation example of the frequency selector of 900 of FIG. 9 with the above equivalent circuit parameter values based on an FR4 substrate. The plot indicates that the insertion loss at 2.4 GHz, indicated by the point m3, is close to zero, and the insertion loss at 5.8 GHz, indicated by the point m4, is close to −30 dB. Therefore, these results indicate that signals around 2.4 GHz pass through the frequency selector 900 while signals around 5.8 GHz are blocked.

Figure 11:
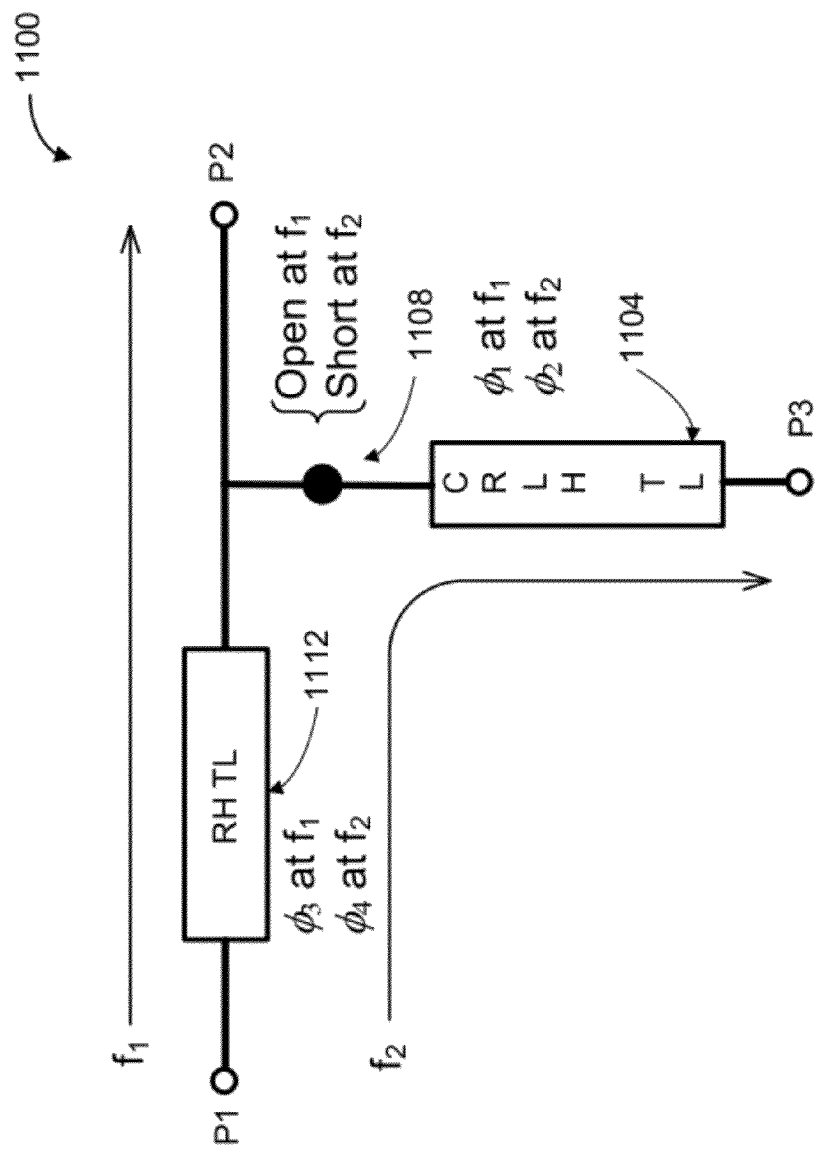
FIG. 11 illustrates an example of an frequency selector having a series RH TL and a shunt CRLH TL.

FIG. 11 illustrates another example of a frequency selector 1100. This frequency selector has a series RH TL 1112 and a shunt CRLH TL 1104. In general, use of an RH TL allows for control of the phase at one frequency; the phase at a second frequency may not be chosen arbitrarily because of the linearity of the RH phase response. As described earlier, to pass the signal with frequency $f_1$ from the port P1 to P2 and block the signal with frequency $f_2$ by filtering out the signal through the port P3, the phases $\phi_1$ and $\phi_2$ of the shunt CRLH TL 1104 may be chosen as expressed by Eqs. (16) and (17) when the port P3 is open, and as expressed by Eqs. (18) and (19) when the port P3 is shorted. The phases $\phi_3$ and $\phi_4$ of the series RH TL 1112 may be selected as below when the port P3 is either open or shorted. For the signal with $f_1$, the shunt CRLH TL 1104 is decoupled from the signal path P1-P2; thus, the series RH TL 1112 may be structured to have a matched impedance between the input and output impedances, e.g., 50Ω, with the phase $\phi_3$ at $f_1$ being arbitrary. For the signal with $f_2$, the shunt line 1108 is shorted, and the input port P1 is preferably designed to be open to have maximum signal reflection. Thus, the $\phi_4$ at $f_2$ of the series RH TL 1112 may be chosen to be $-90°-(k\times180°)$, where k=0, 1, 2, . . . , to transform the impedance from a short to an open. In general, the RH phase values are restricted to be negative for non-DC frequencies. In this example, the phase $\phi_3$ may be arbitrary as long as it is on the linear RH phase response determined by the $\phi_4$ value at $f_2$. Alternatively, to design the input port P1 to be shorted, the $\phi_4$ at $f_2$ of the series RH TL 1112 may be chosen to be $0°-(k\times180°)$, where k=1, 2, . . . , to transform or keep the impedance from a short to a short. Furthermore, the RH TL 1112 may be designed differently so that these phases $\phi_3$ and $\phi_4$ have other values suited for underlying applications to adjust the signal transmission and reflection.

In one implementation example based on the configuration of the frequency selector 1100, the shunt CRLH TL 1104 for the case of the open port P3 may be constructed with $\phi_1=0°$ at $f_1=2.4$ GHz and $\phi_2=-90°$ at $f_2=5.8$ GHz. For the series RH TL 1112, the phase $\phi_4$ at $f_2=5.8$ GHz is chosen to be $-90°$ and the phase $\phi_3$ at $f_1=2.4$ GHz may take on an arbitrary value as long as the two points are on the same RH phase response line. Using a FR4 substrate with a thickness of about 31 mils and a dielectric constant of about 4.4, the phase $\phi_3$ at 2.4 GHz may be chosen to be about $-37°$ when the phase $\phi_4$ at 5.8 GHz is $-90°$.

Figure 12:
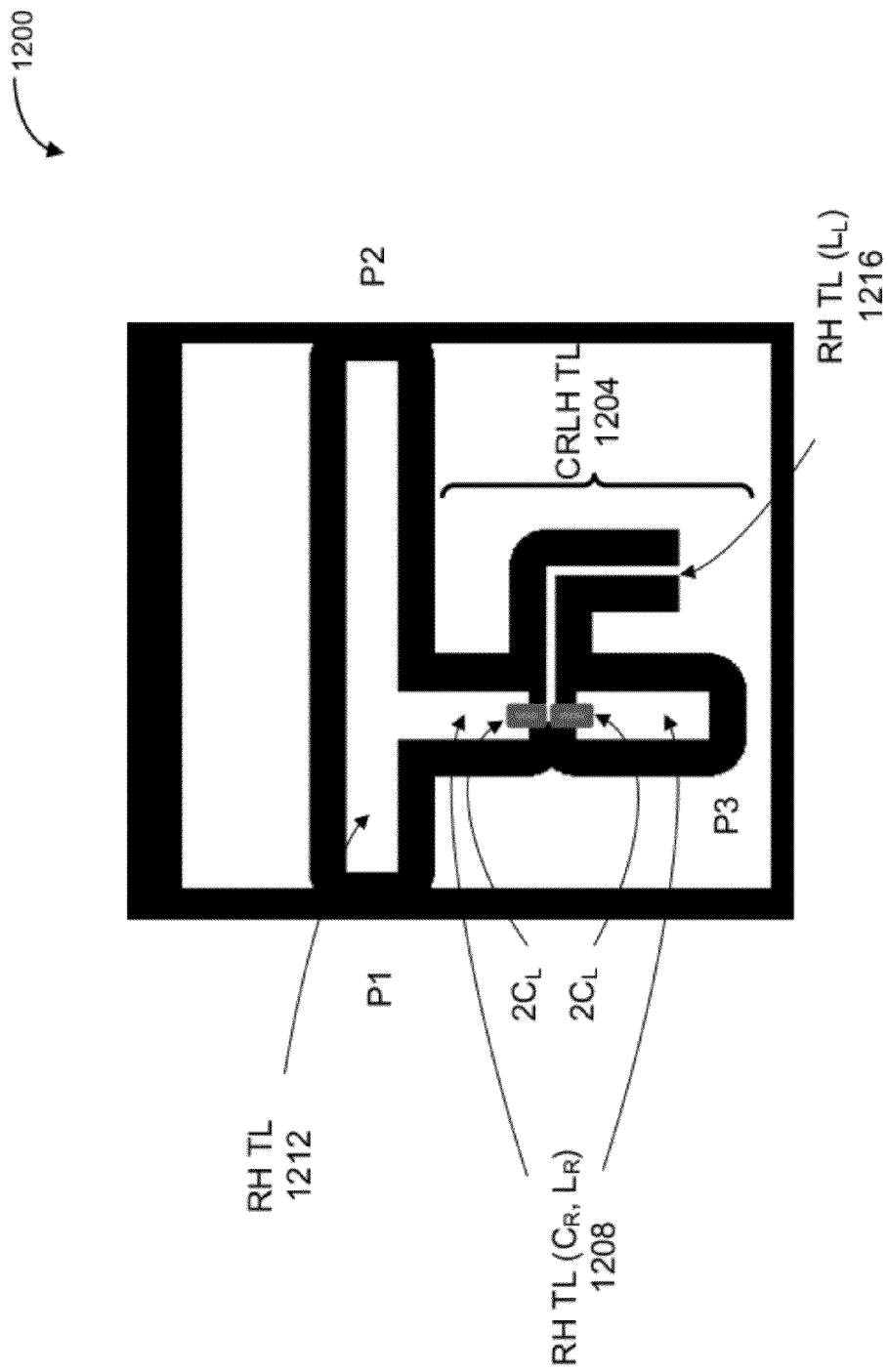
FIG. 12 illustrates a layout of an implementation example of the frequency selector of FIG. 11.

FIG. 12 illustrates a layout 1200 of the above implementation example of the frequency selector 1100 of FIG. 11. In this layout, the white part represents conductive patches and lines printed on the FR4 substrate, while the black part represents dielectric gaps formed between those conductive patches and lines. The shunt CRLH TL 1204 is designed to have one CRLH unit cell with $C_L=2$ pF, $L_L=5$ nH, $C_R=1$ pF and $L_R=2.6$ pF. In this example, two lumped capacitors, each having $2C_L$, are connected in series to provide one $C_L$ as in FIG. 1A. Alternatively, a single capacitor may be used to provide a capacitance value of $C_L$ in place of two series capacitors. Furthermore, this example has two microstrips connected to form an L-shaped RH TL ($L_L$) 1216 to provide $L_L$. Alternatively, a single microstrip having the same total electrical length may be used. In addition, a lumped inductor may be used to realize $L_L$ instead of the printed microstrip. The RH portion of the shunt CRLH TL 1204, i.e., $C_R$ and $L_R$, is implemented using a microstrip to provide an RH TL ($C_R$, $L_R$) 1208 as shown in FIG. 1F. The RH TL 1212 is also implemented using a microstrip in this example.

Figure 13:
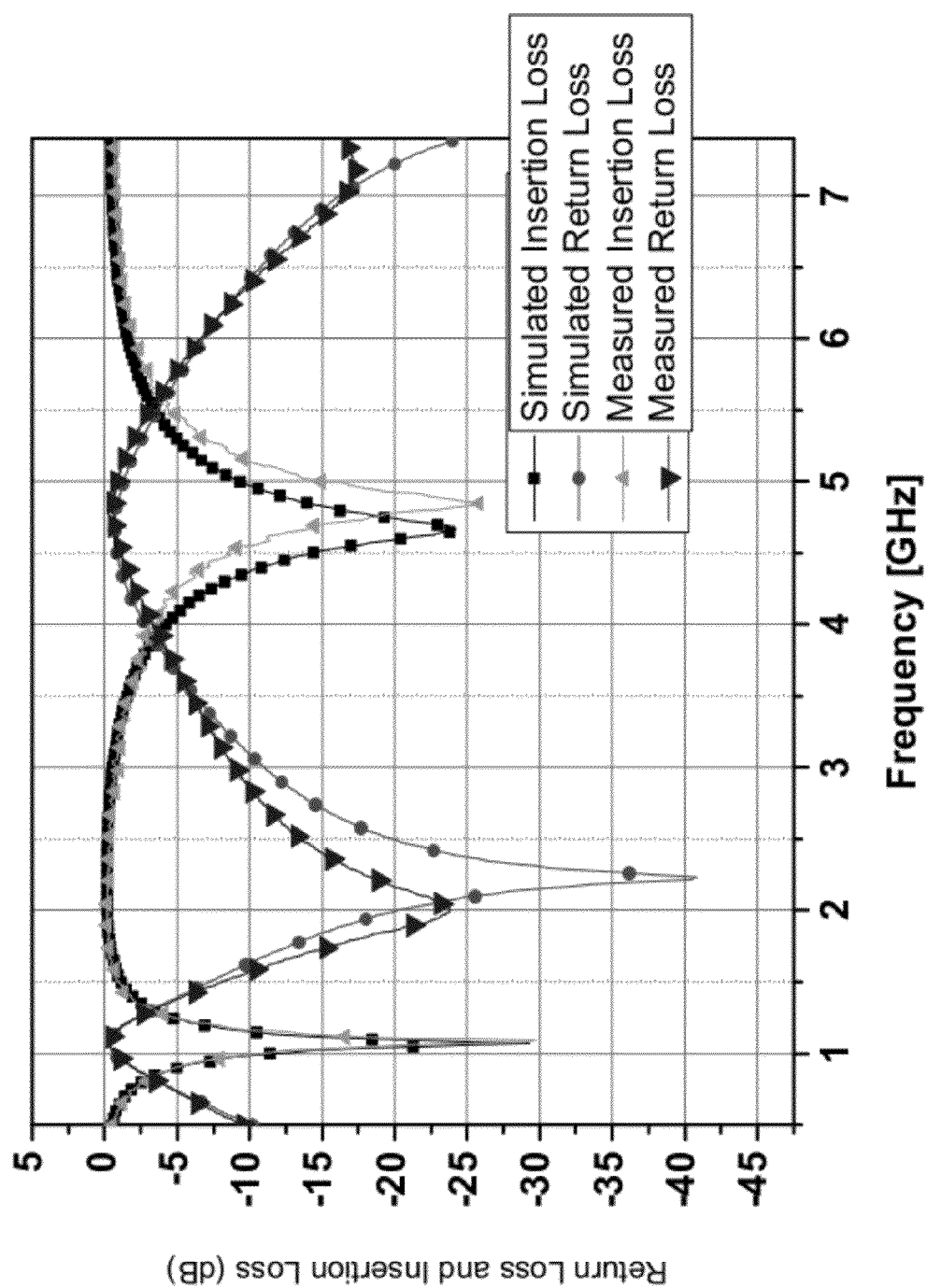
FIG. 13 plots simulation and measurement results of the return loss and insertion loss of the implementation example of FIG. 12.

FIG. 13 plots simulation and measurement results of return loss and insertion loss of the above implementation example 1200 of FIG. 12. For both simulation and measurement, the insertion loss has a dip near 5 GHz and is close to zero around 2.4 GHz. This indicates that the signals around 2.4 GHz are transmitted through the frequency selector with small signal loss. In contrast, the signals around 5 GHz are blocked from transmitting through the same frequency selector. The return loss for both simulation and measurement has a dip near 2.4 GHz and close to zero near 5 GHz, indicating that a good resonance is obtained around 2.4 GHz with minimal signal reflection at the input port P1 and nearly full signal reflection is obtained around 5 GHz providing a near-open input port P1.

Figure 14:
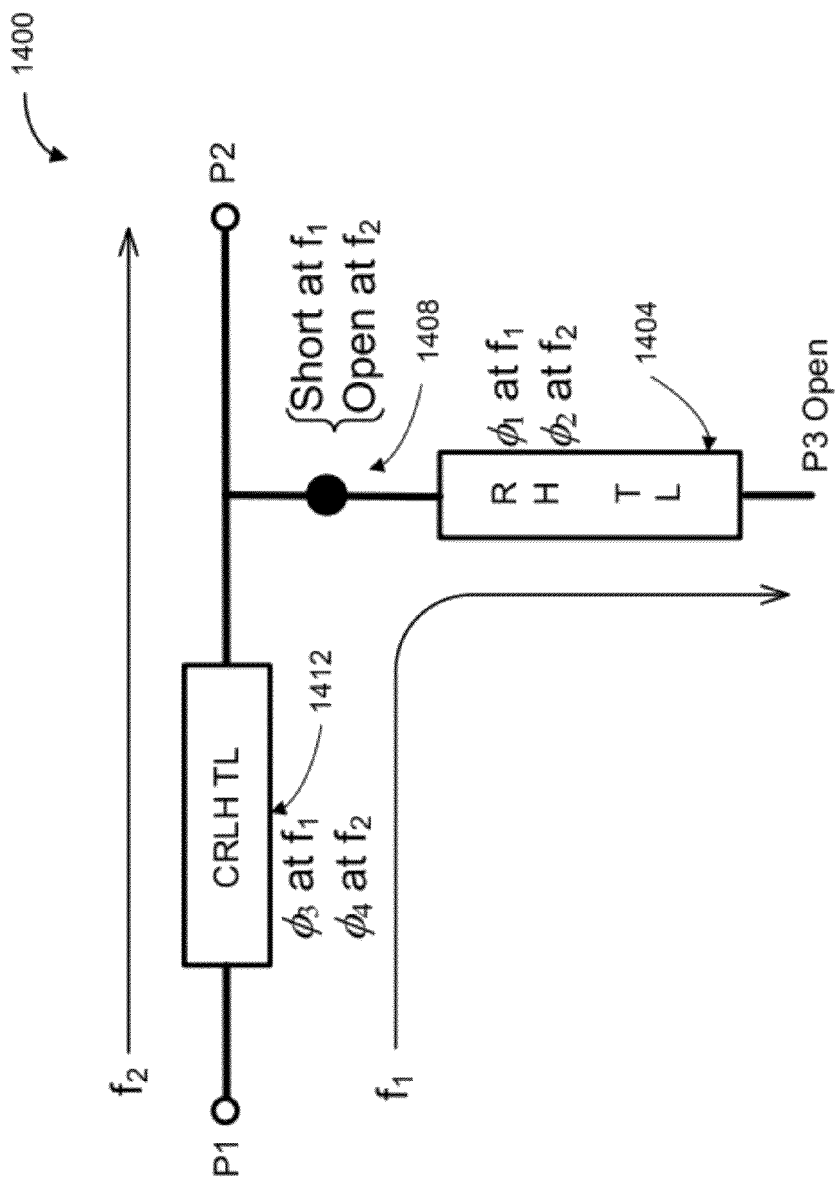
FIG. 14 illustrates an example of a frequency selector having a series CRLH TL and an open shunt RH TL.

FIG. 14 illustrates another example of a frequency selector 1400. This frequency selector 1400 includes a series CRLH TL 1412 and a shunt RH TL 1404 that is open at P3. In this example, the signal with $f_2$ is allowed to transmit from the port P1 to the port P2 while the signal transmission with $f_1$ is blocked by filtering out through the port P3. The phase $\phi_1$ at $f_1$ of the shunt RH TL 1404 may be chosen from $\phi_1=-90°-(k\times180°)$, where k=0, 1, 2, . . . , to transform the impedance from an open to a short so as to have a shorted shunt line 1408 for $f_1$. Since the RH phase is linear in frequency, the selection of the phases $\phi_1$ at $f_1$ and $\phi_2$ at $f_2$ is limited. One simple selection is to have $f_2$ to be a harmonic of $f_1$. By choosing $\phi_1=-90°$, the phase $\phi_2$ at $f_2$ of the shunt RH TL 1404 may be chosen from $\phi_2=2n\times(-90°)$ at $f_2=(n+1)\times f_1$, where n=1, 2, 3, . . . , to have an open shunt line 1408 for the signal with $f_2$ to pass from P1 to P2. The phases $\phi_3$ and $\phi_4$ of the series CRLH TL 1412 may be determined as follows. For the signal with $f_1$, the shunt line 1408 is shorted, and the input port P1 is preferably designed to be open to have maximum signal reflection. Thus, the $\phi_3$ at $f_1$ of the series CRLH TL 1412 may be chosen from $90°\pm(k\times180°)$, where k=0, 1, 2, . . . , to transform the impedance from a short to an open. For the signal with $f_2$, which is $n\times f_1$ with n being a positive even number in this case, the shunt RH TL 1404 is decoupled from the signal path P1-P2; thus, the series CRLH TL 1412 may be structured to have a matched impedance between the input and output impedances, e.g., 50Ω, with the phase $\phi_4$ at $f_2$ being arbitrary. Alternatively, to design the input port P1 to be shorted, the $\phi_3$ at $f_1$ of the series CRLH TL 1412 may be chosen to be $0°\pm(k\times180°)$, where k=1, 2, . . . , to transform or keep the impedance from a short to a short. Furthermore, the CRLH TL 1412 may be designed differently so that these phases $\phi_3$ and $\phi_4$ have other values suited for underlying applications.

Figure 15:
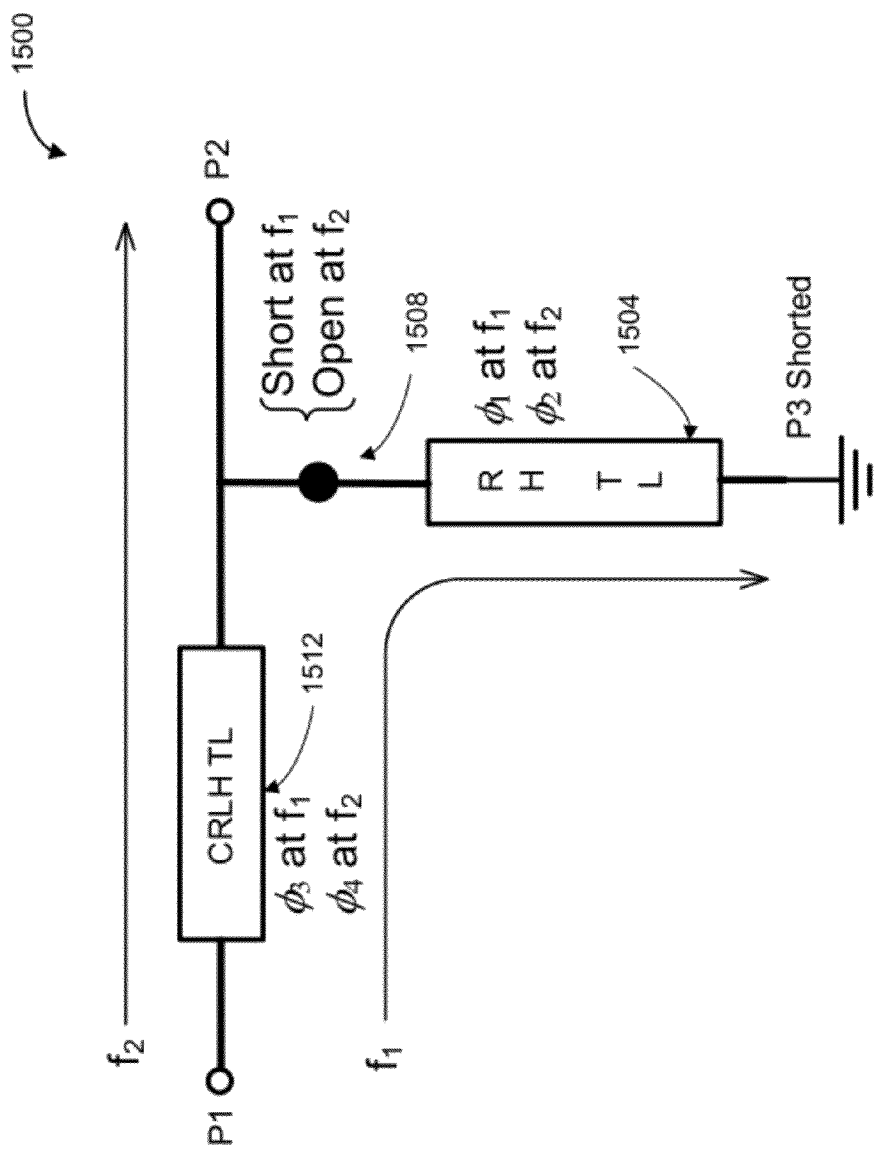
FIG. 15 illustrates an example of a frequency selector having a series CRLH TL and a shorted shunt RH TL.

FIG. 15 illustrates another example of a frequency selector 1500. This frequency selector 1500 includes a series CRLH TL 1512 and a shunt RH TL 1504 that is shorted to ground. The phase $\phi_1$ at $f_1$ of the shunt RH TL 1504 may be chosen from $\phi_1=-(k\times180°)$, where k=1, 2, . . . , to transform or keep the impedance from a short to a short so as to have a shorted shunt line 1508 to filter out the signal with $f_1$ through the port P3. Since the RH phase is linear in frequency, the selection of the phases $\phi_1$ at $f_1$ and $\phi_2$ at $f_2$ is limited. One simple selection is to have $f_1$ to be a harmonic of $f_2$. By choosing $\phi_1=-180°$, the phase $\phi_2$ at $f_2$ of the shunt RH TL 1504 may be chosen from $\phi_2=(2n-1)\times(-90°)$ at $f_2=(n+1)\times f_1$, where n=1, 2, 3, . . . , to have an open shunt line 1508 for the signal with $f_2$ to pass from P1 to P2. The phases $\phi_3$ and $\phi_4$ of the series CRLH TL 1512 may be determined as follows. For the signal with $f_1$, the shunt line 1508 is shorted, and the input port P1 is preferably designed to be open to have maximum signal reflection. Thus, the $\phi_3$ at $f_1$ of the series CRLH TL 1512 may be chosen from 90°±(k×180°), where k=0, 1, 2, . . . to transform the impedance from a short to an open. For the signal with $f_2$, which is (n+1)×$f_1$ in this case, the shunt RH TL 1504 is decoupled from the signal path P1-P2; thus, the series CRLH TL 1512 may be structured to have a matched impedance between the input and output impedances, e.g., 50Ω, with the phase $\phi_4$ at $f_2$ being arbitrary. Alternatively, to design the input port P1 to be shorted, the $\phi_3$ at $f_1$ of the series CRLH TL 1512 may be chosen to be 0°±(k×180°), where k=1, 2, . . . , to transform or keep the impedance from a short to a short. Furthermore, the CRLH TL 1512 may be designed differently so that these phases $\phi_3$ and $\phi_4$ have other values suited for underlying applications.

Figure 16:
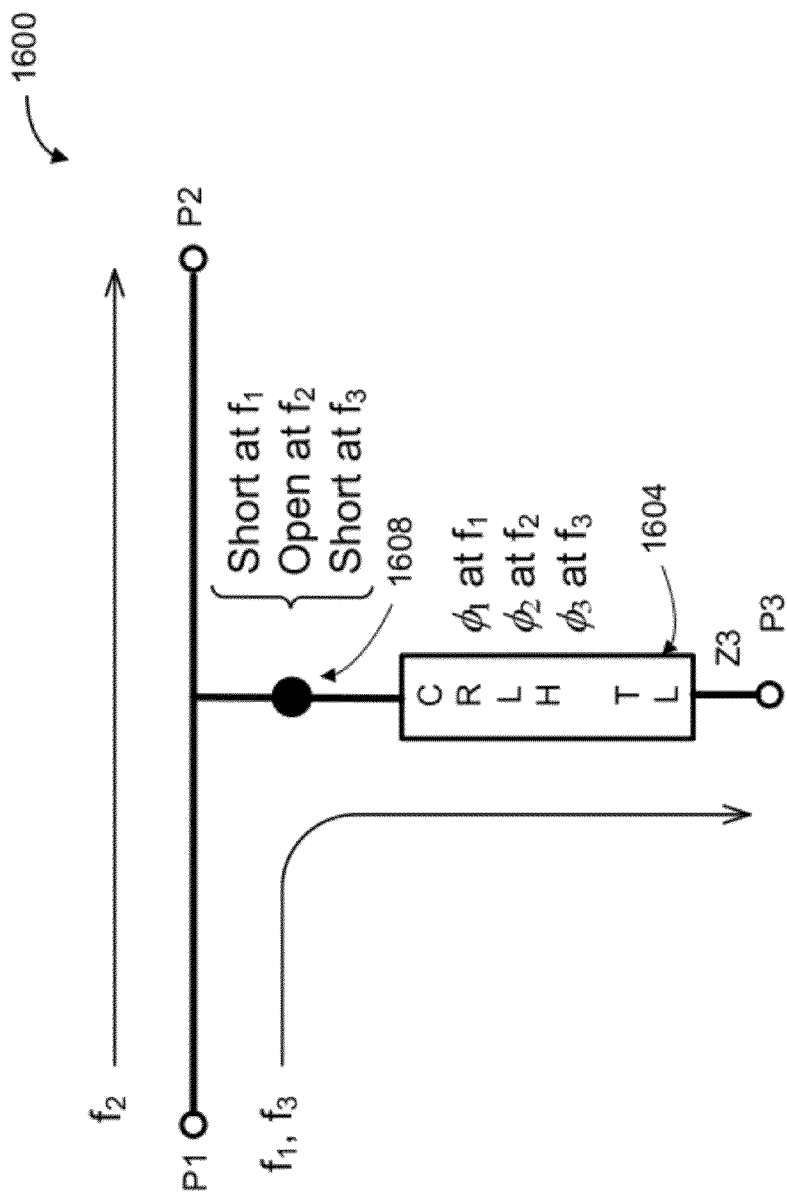
FIG. 16 illustrates an example of a frequency selector for passing a signal with one frequency and filtering out signals with two different frequencies.

Referring back to FIG. 8, the frequency selector 800 has a shunt CRLH TL 804 which is designed to provide phases at two different frequencies $f_1$ and $f_2$ such that a signal with one frequency $f_1$ is allowed to pass through the path P1-P2 while another signal with a different frequency $f_2$ is blocked. It is possible to design the shunt CRLH TL to provide phases at three different frequencies such that a signal with one frequency is allowed to pass through the path P1-P2 while the signals with the other two frequencies are blocked. FIG. 16 illustrates an example of a frequency selector 1600 for passing a signal with frequency $f_2$ through the path P1-P2 and filtering out a signal with frequency $f_1$ and a signal with frequency $f_3$. One end (distal end) of a CRLH TL 1604 is coupled to a port P3, which may be shorted or open. The other end (proximal end) of the CRLH TL 1604 is coupled to the signal path P1-P2 through a shunt line 1608. The shunt line 1608 may be controlled to be open for the signal with $f_2$ and shorted for the signals with $f_1$ and $f_3$ by configuring the CRLH TL 1604 to have adequate phases for the signals with $f_1$, $f_2$ and $f_3$ based on the CRLH phase response. In this example, the CRLH TL 1604 is utilized as an impedance transformer that transforms the impedance Z3 (e.g., open or short) at the port P3 to an open for $f_2$ and to a short for $f_1$ and $f_3$ at the shunt line 1608. As a result, the signal with $f_2$ is allowed to transmit through the P1-P2 path, while the signal with $f_1$ and the signal with $f_3$ are filtered out or removed through the shunt line 1608 and the CRLH TL 1604, being blocked from reaching the output port P2. Theoretically, the impedance Z3 is infinite when the port P3 is open, and is zero when the port P3 is shorted. However, in actuality and in this document, the term "an open" is used to indicate a high impedance achievable for the implementation and application and the term "a short" is used to indicate a low impedance achievable for the implementation and application.

The electrical length of the CRLH TL 1604 may be engineered to correspond to certain phases at certain frequencies as shown in the CRLH phase response curve in FIG. 3. In order to have the shunt line 1608 open at $f_2$ when the port P3 is open, the phase $\phi_2$ at $f_2$ may be configured to be: $\phi_2$=0°±(k×180°) where k=0, 1, 2, . . . , as in Eq. (16). Similarly, in order to have the shunt line 1608 shorted at $f_1$ and $f_3$, the phase $\phi_1$ at $f_1$ and the phase $\phi_3$ at $f_3$ may be configured to be: $\phi_1$, $\phi_3$=90°±(k×180°) where k=0, 1, 2, . . . , as in Eq. (17). Alternatively, when the port P3 is shorted, the phase $\phi_2$ at $f_2$ may be configured to be: $\phi_2$=90°±(k×180°) where k=0, 1, 2, . . . , as in Eq. (18) to have an open circuit at the shunt line 1608. Similarly, the phase $\phi_1$ at $f_1$ and the phase $\phi_3$ at $f_3$ may be configured to be: $\phi_1$, $\phi_3$=0°±(k×180°), where k=0, 1, 2, . . . , as in Eq. (19) to have a shorted circuit at the shunt line 1608.

In some WiFi applications such as for 802.11b, g, and n, it is desirable to remove the Digital Enhanced Cordless Telecommunication (DECT) band ranging 1880-1900 MHz (referred to as the 1.9 GHz band hereinafter) as well as the 5 GHz band in one branch path, and pass the 2.4 GHz band ranging 2.4-2.48 GHz in the other branch path. A conventional diplexer typically uses one low-pass filter (LPF) in one branch and one high-pass filter (HPF) in the other branch. In the present case, the band that needs to pass is the 2.4 GHz band and the bands that need to be blocked are the 1.9 GHz band and the 5 GHz band, giving the order of block-pass-block. Thus, the conventional diplexer may not be suited for handling such a complex filtering due to the simple combination of a HPF and a LPF, which generally gives the order of pass-block-pass.

The frequency selector 1600 of FIG. 16 provides a double-notch filter function, and thus may be configured to remove the 1.9 band and the 5 GHz band and pass the 2.4 GHz band. This may be achieved with a compact design printed on an FR4 substrate based on CRLH structures, thereby leading to size reduction and hence power loss reduction.

Figure 17:
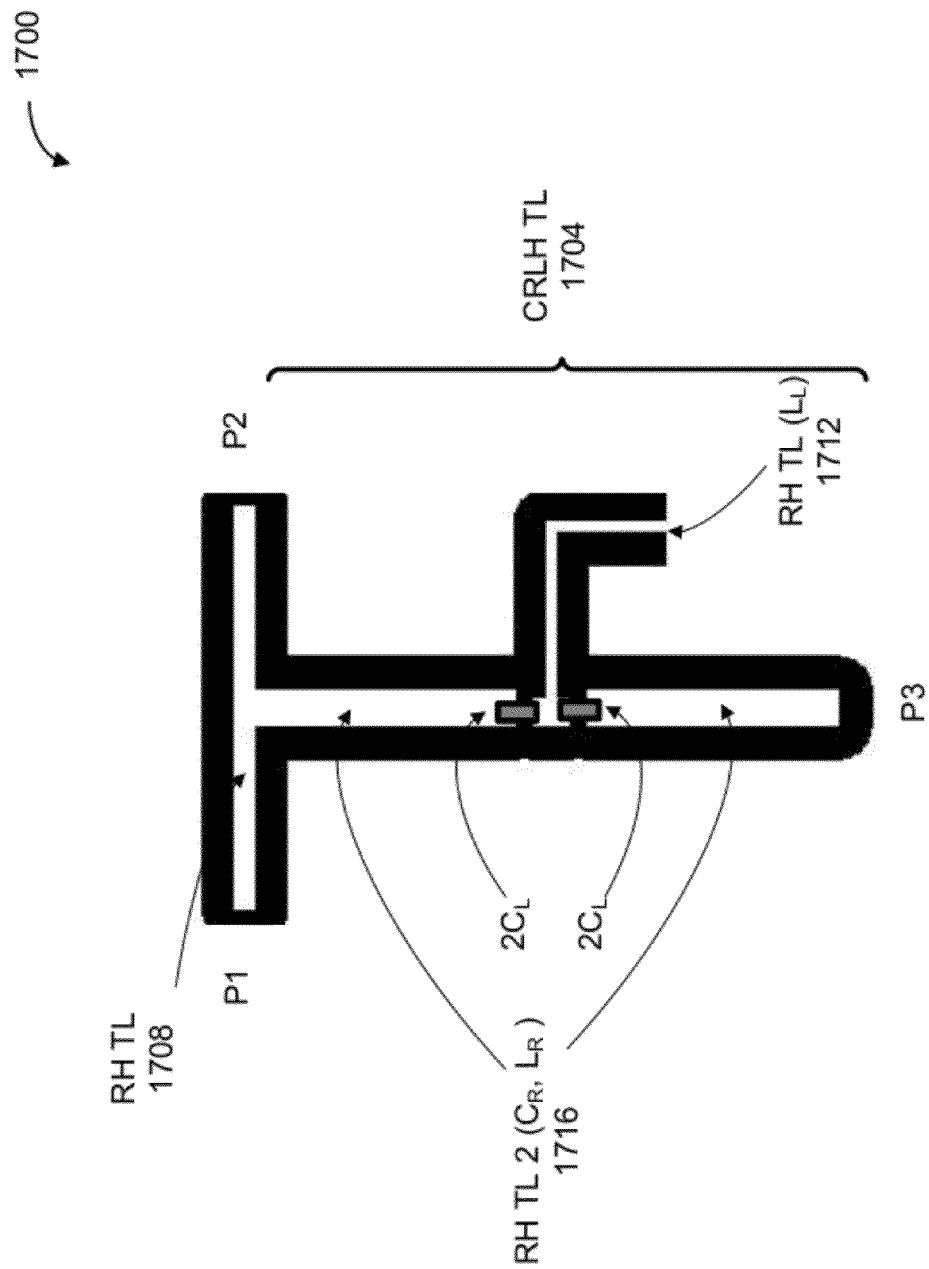
FIG. 17 illustrates a layout of an implementation example of the frequency selector of FIG. 16 with the port P3 being open.

FIG. 17 illustrates a layout of an implementation example 1700 of the frequency selector 1600 of FIG. 16 with the port P3 being open. This layout is similar to the frequency selector 1200, having a shunt CRLH TL 1704 with one symmetric CRLH unit cell and a series RH TL 1 1708. This implementation example 1700 is designed to remove the 1.9 GHz band and the 5 GHz band, and pass the 2.4 GHz band. In this example, two lumped capacitors, each having $2C_L$, are connected in series to provide one $C_L$ as in FIG. 1A. Furthermore, this CRLH unit cell has two microstrips connected to form an L-shaped RH TL ($L_L$) 1712 to provide $L_L$. The RH portion of the shunt CRLH TL 1704, i.e., $C_R$ and $L_R$, is implemented using a microstrip to provide an RH TL ($C_R$, $L_R$) 1716 as shown in FIG. 1F. The series RH TL 1708 is also implemented using a microstrip in this example. The CRLH parameter values are chosen to be: $L_L$=4 nH with a length of 7 mm, $C_L$=1 pF, $L_R$=2.66 nH, and $C_R$=1 pF. The substrate used is FR4 with a thickness of 10 mils.

Figure 18:
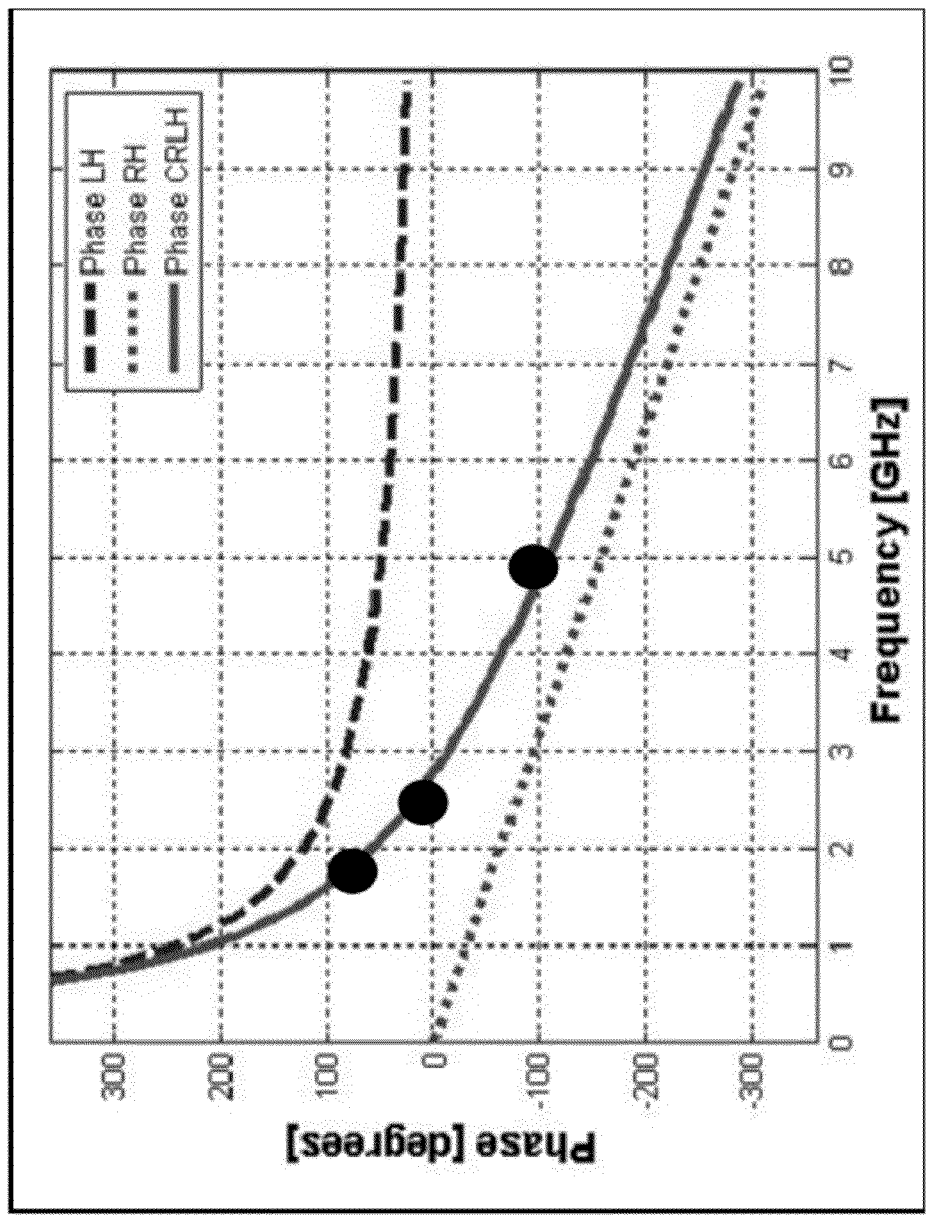
FIG. 18 plots a phase response curve of the CRLH TL in the implementation example of FIG. 17 in comparison with RH and LH response curves, indicated with the solid line, dotted line and dashed line, respectively.

FIG. 18 plots the phase response curve of the CRLH TL 1704 in FIG. 17 having the above parameter values in comparison with the RH and LH response curves, indicated with the solid line, dotted line and dashed line, respectively. In this implementation example 1700, the shunt CRLH TL 1704 with the open port P3 is structured with the above parameter values to provide approximately $\phi_1$=90° at $f_1$=1.9 GHz, $\phi_2$=0° at $f_2$=2.4 GHz, and $\phi_3$=−90° at $f_3$=5 GHz, as indicated by the three points on the CRLH phase response curve in FIG. 18.

Figure 19:
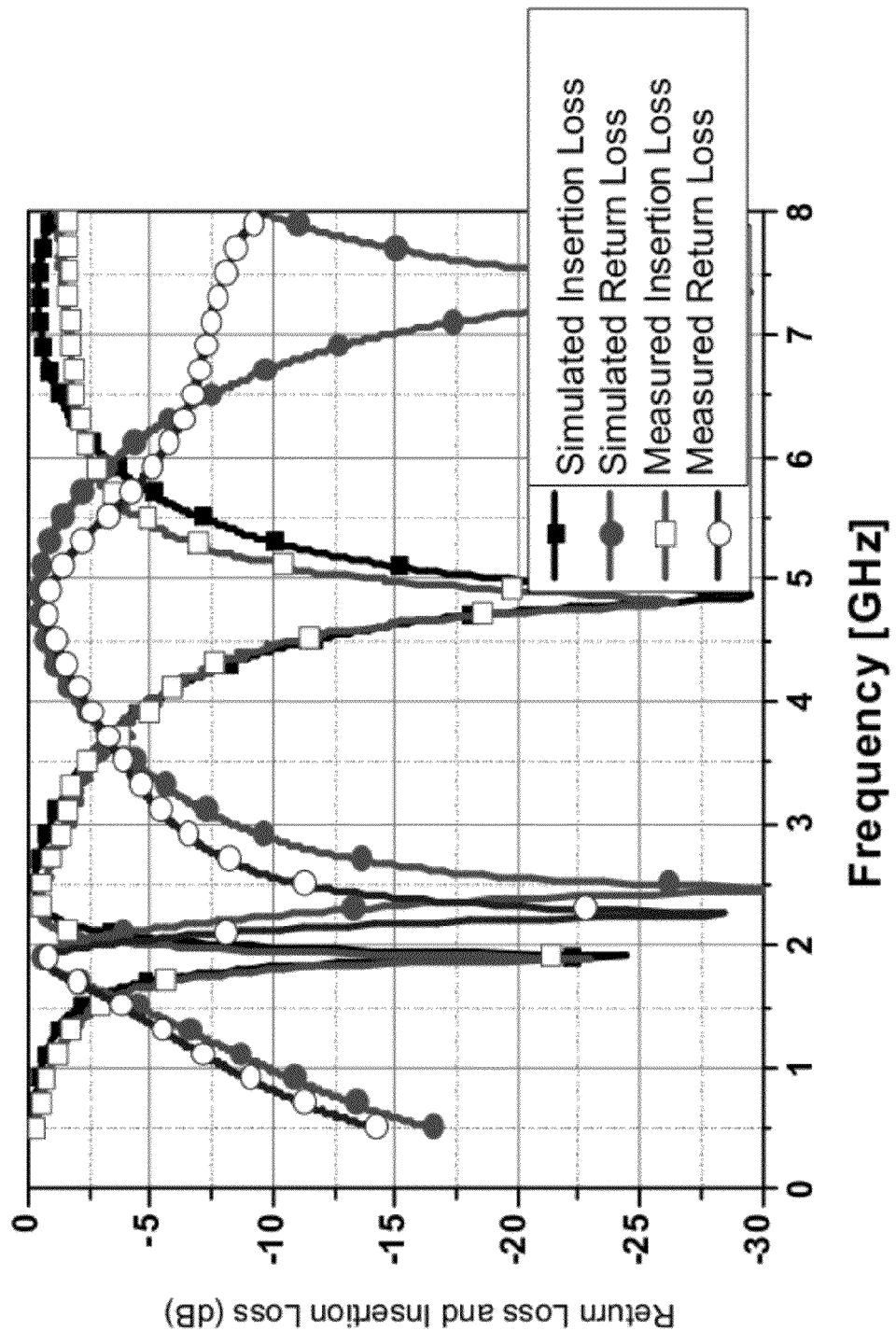
FIG. 19 plots measurement and simulation results of return loss and insertion loss for the implementation example of FIG. 17.

FIG. 19 plots measurement and simulation results of the return loss and insertion loss for the above implementation example 1700 of the frequency selector 1600. The plots indicate that this frequency selector filters out the signals around 1.9 GHz and 5 GHz while passing the signals around 2.4 GHz, exhibiting the double-notch filter characteristics.

Figure 20:
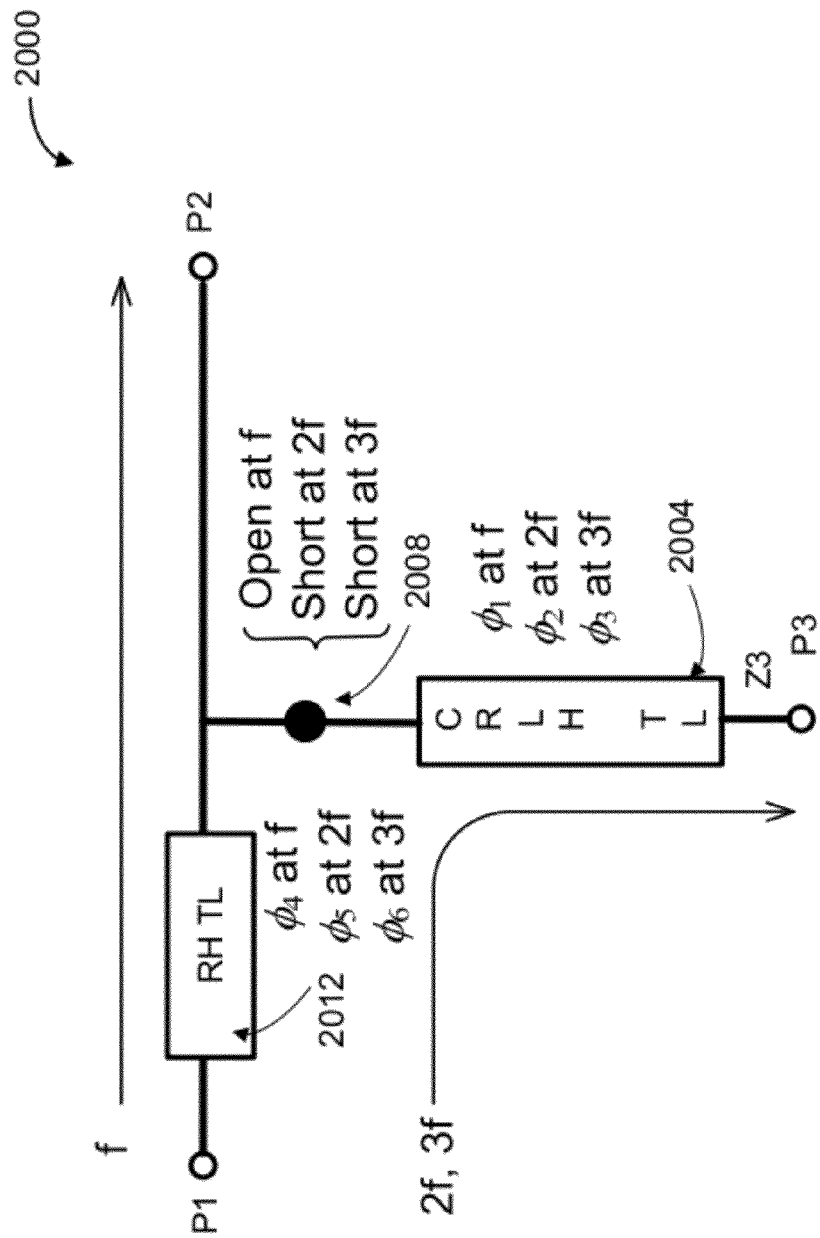
FIG. 20 illustrates an example of a frequency selector for passing a signal with the primary frequency and filtering out signals with the $2^{nd}$ and $3^{rd}$ harmonics.

Referring back to FIG. 11, a series RH TL 1112 is used in this frequency selector 1100 for controlling the RH phases for a certain application, in which an open circuit at the port P1 is preferred to obtain maximum signal reflection. The similar configuration may be extended to controlling three phases at three different frequencies by incorporating the CRLH TL design as in FIG. 16 with a series RH TL such as the series RH TL 1112 in FIG. 11. FIG. 20 illustrates an example of a frequency selector 2000 for passing a signal with the primary frequency f and filtering out signals with the $2^{nd}$ and $3^{rd}$ harmonics 2f and 3f. The frequency selector 2000 has a shunt CRLH TL 2004 and a series RH TL 2012, providing capability as a harmonic trap. One end (distal end) of the CRLH TL 2004 is coupled to the port P3, which may be shorted or open. The other end (proximal end) of the CRLH TL 2004 is coupled to the signal path P1-P2 through a shunt line 2008. The shunt line 2008 may be controlled to be open for the signal with the primary frequency f and shorted for the signals with the harmonics 2f and 3f by configuring the CRLH TL 1604 to have adequate phases for the signals with f, 2f and 3f based on the CRLH phase response. In order to have the shunt line 2008 open at f when the port P3 is open, the phase $\phi_1$ at f may be configured to be: $\phi_1 = 0° \pm (k \times 180°)$ where k=0, 1, 2, . . . , as in Eq. (16). Similarly, in order to have the shunt line 2008 shorted at 2f and 3f, the phase $\phi_2$ at 2f and the phase $\phi_3$ at 3f may be configured to be: $\phi_2, \phi_3 = 90° \pm (k \times 180°)$ where k=0, 1, 2, . . . , as in Eq. (17). Alternatively, when the port P3 is shorted, the phase $\phi_1$ at f may be configured to be: $\phi_1 = 90° \pm (k \times 180°)$ where k=0, 1, 2, . . . , as in Eq. (18) to have an open circuit at the shunt line 2008. Similarly, the phase $\phi_2$ at 2f and the phase $\phi_3$ at 3f may be configured to be: $\phi_2, \phi_3 = 0° \pm (k \times 180°)$, where k=0, 1, 2, . . . , as in Eq. (19) to have a short circuit at the shunt line 2008. The phases $\phi_4$ at f, $\phi_5$ at 2f and $\phi_6$ at 3f of the series RH TL 2012 may be selected as below when the port P3 is either open or shorted. For the signal with f, the shunt CRLH TL 2004 is decoupled from the signal path P1-P2; thus, the series RH TL 2012 may be structured to have matching impedance between the input and output impedances, e.g., 50Ω, with the phase $\phi_4$ at f being arbitrary. For the signal with 2f and 3f, the shunt line 2008 is shorted, and the input port P1 is preferred to be open for odd harmonics and shorted for even harmonics in certain applications. Thus, the phase $\phi_5$ at 2f of the series RH TL 2012 may be chosen to be 0°−(k×180°), where k=1, 2, . . . , to transform or keep the impedance from a short to a short; and $\phi_6$ at 3f of the series RH TL 2012 may be chosen to be −90°−(k×180°), where k=0, 1, 2, . . . , to transform the impedance from a short to an open. Note that RH phase values are restricted to be negative and linear in frequency. Thus, for example, these three phases may be chosen to be $\phi_4 = −90°$ at f, $\phi_5 = −180°$ at 2f and $\phi_6 = −270°$ at 3f based on the RH phase response.

As described in the design examples thus far, the equivalent circuit parameters are manipulated to fit the resultant CRLH phase response curve to two or three points representing desired two or three pairs of a phase and a frequency. The passing and blocking of the signals in the two or three frequency bands are thus engineered by the chosen phases. The possible number of fitting points on the CRLH phase response curve depends on the degree of freedom in the design parameters. Generally, the design flexibility and hence the number of fitting points increases as the number of parameters increases. Use of one CRLH unit cell, for example, gives four parameters $C_L$, $L_L$, $C_R$, and $L_R$, but the impedance matching conditions such as in Eq. (11) and other conditions may reduce the number of adjustable parameters. As explained below, use of a different type of CRLH unit cells having more parameters is one possible solution to increase the design flexibility and hence the number of fitting points on the CRLH phase response curve. As a result, a filter device that is capable of passing and blocking a multiple number of bands may be designed and implemented.

Figure 21:
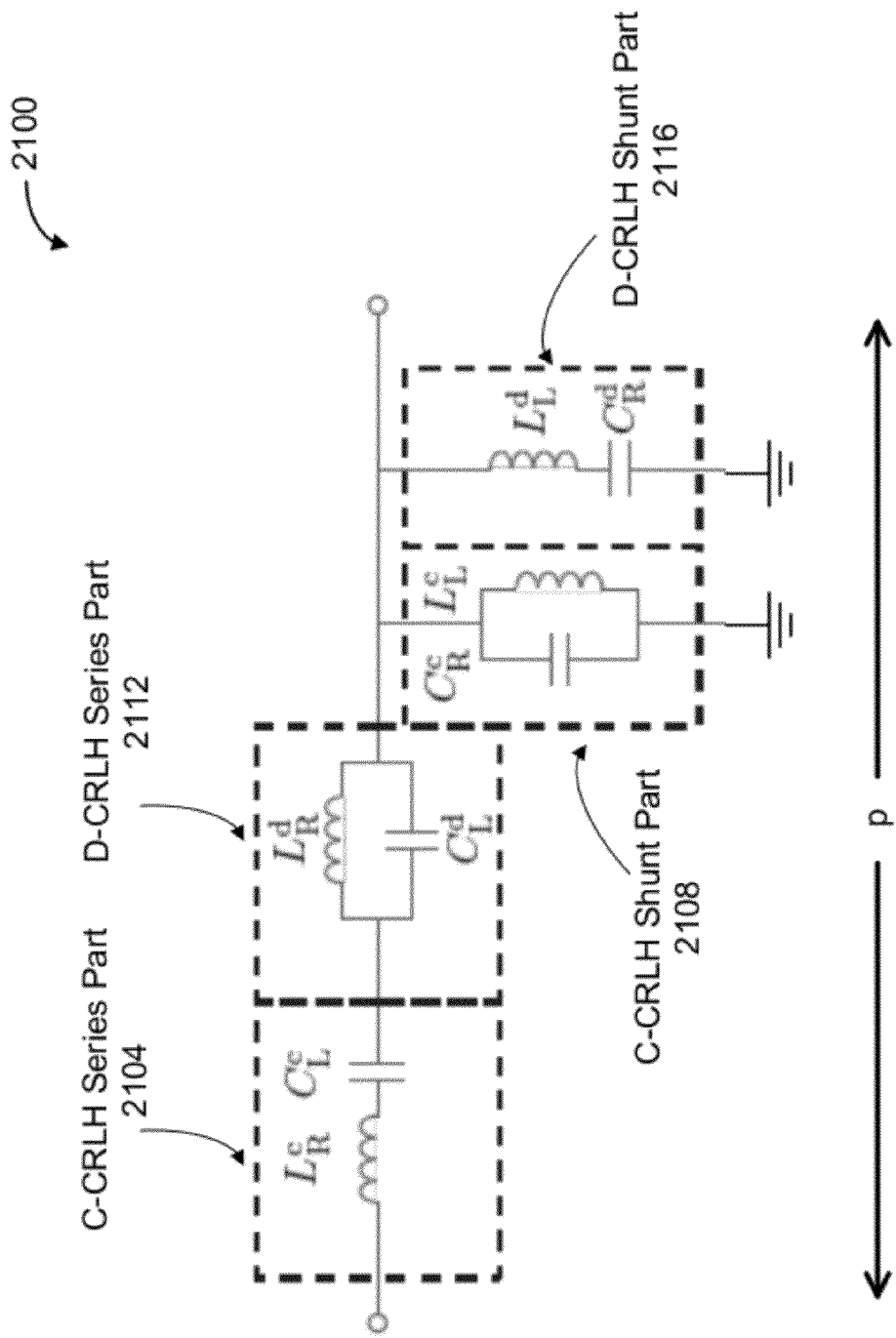
FIG. 21 illustrates an extended-CRLH (E-CRLH) unit cell.

FIG. 21 illustrates an extended-CRLH (E-CRLH) unit cell 2100. The original CRLH unit cell 12 such as illustrated in FIG. 1 is termed a conventional-CRLH (C-CRLH) unit cell for comparison. An E-CRLH unit cell 2100 may be defined as a combination of a C-CRLH unit cell and a dual-CRLH (D-CRLH) cell with a period p. The C-CRLH series part 2104 has an RH series inductor $L^c_R$ and an LH series capacitor $C^c_L$ that are coupled in series; the C-CRLH shunt part 2108 has an RH shunt capacitor $C^c_R$ and an LH shunt inductor $L^c_L$ that are coupled in parallel; the D-CRLH series part 2112 has an RH series inductor $L^d_R$ and an LH series capacitor $C^d_L$ that are coupled in parallel; and the D-CRLH shunt part 2116 has an RH shunt capacitor $C^d_R$ and an LH shunt inductor $L^d_L$ that are coupled in series. Thus one E-CRLH unit cell 2100 provides 8 equivalent circuit parameters, $L^c_R$, $C^c_L$, $C^c_R$, $L^c_L$, $L^d_R$, $C^d_L$, $C^d_R$, and $L^d_L$. Even with the reduction of adjustable parameters due to the impedance matching conditions or other conditions, the E-CRLH unit cell 2100 provides more adjustable parameters than the C-CRLH or D-CRLH portion alone.

Figure 22:
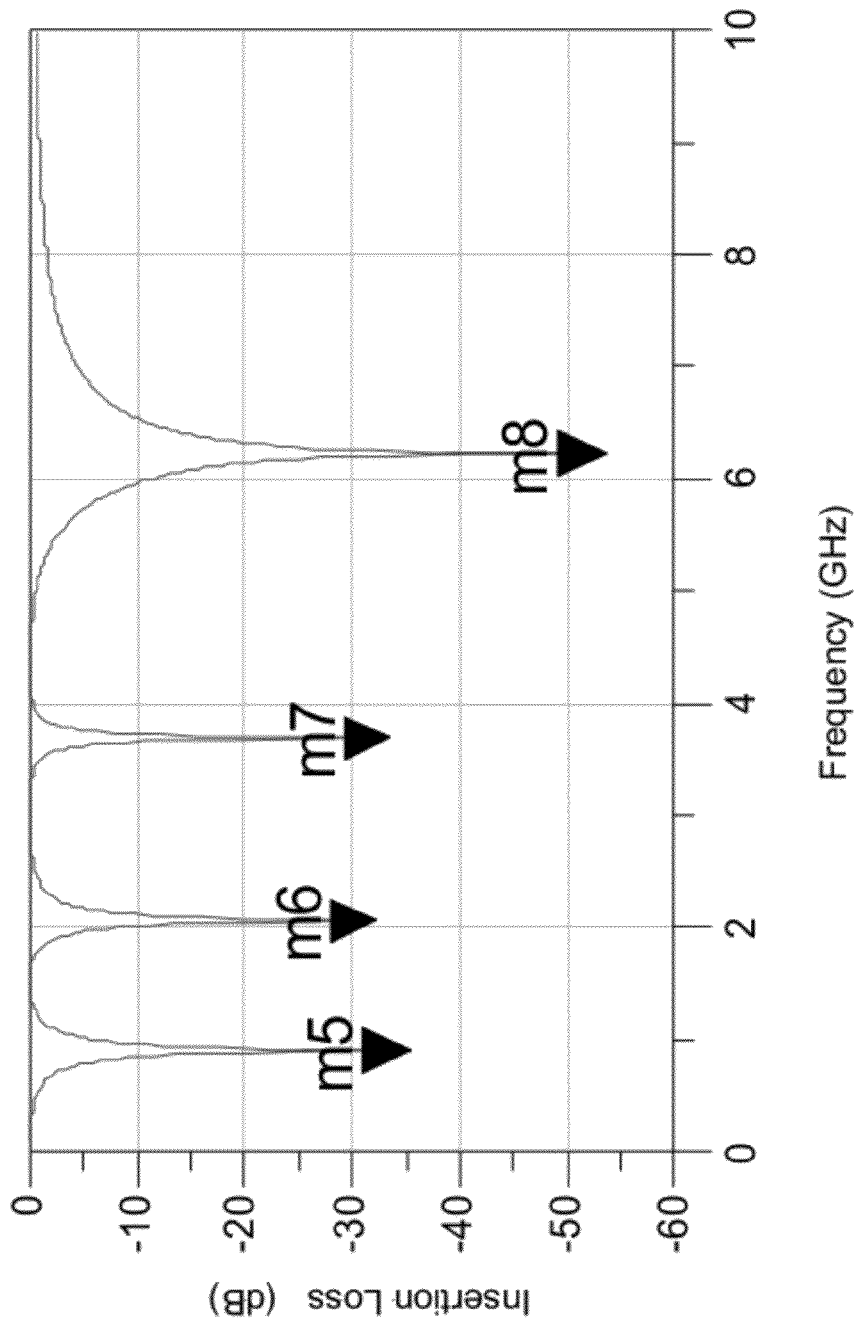
FIG. 22 plots simulation results of insertion loss of a frequency selector configured as in FIG. 16 but with an E-CRLH TL instead of a conventional-CRLH (C-CRLH) TL.

FIG. 22 plots simulation results of insertion loss of an frequency selector configured as in FIG. 16 but with an E-CRLH TL instead of the C-CRLH TL 1604. The E-CRLH equivalent parameters are manipulated to provide four notches in the insertion loss at 910 MHz, 2.06 GHz, 3.69 GHz and 6.23 GHz, as indicated by the points m5, m6, m7 and m8, respectively, so as to block the signals in these four bands. This type of frequency selectors based on E-CRLH unit cells may thus be termed a multi-notch filter.

By combining a frequency selector (single-notch or multiple-notch) and a high-pass filter, a low-pass filter, a band-pass filter, a band-stop filter or other different filters, complex filtering functions, which are not achievable by using conventional filters, may be provided. Based on the flexibility in phase selection inherent in CRLH structures, the combined filter may be tailored to provide desirable blocking and passing of frequency bands depending on underlying applications. The example frequency selectors described in this document are two-port devices and thus suited for applications in which signals with different frequencies are received sequentially in different time intervals so that the signal blocking and passing occur in different time intervals. In a system in which signals with different frequencies are received at the same time, it may be effective to have multiple branches for the multiple frequency selection. A diplexer is an example having two such branches, and thus is a three-port device. Combining an frequency selector in one branch and a high-pass filter (HPF) in the other branch, for example, may provide a diplexer capability with better performance than a conventional diplexer. Furthermore, a multiple number of frequency selectors with multiple branches may be configured for passing and blocking a multiple number of frequencies, thereby providing multiplexer functionality.

Figure 23:
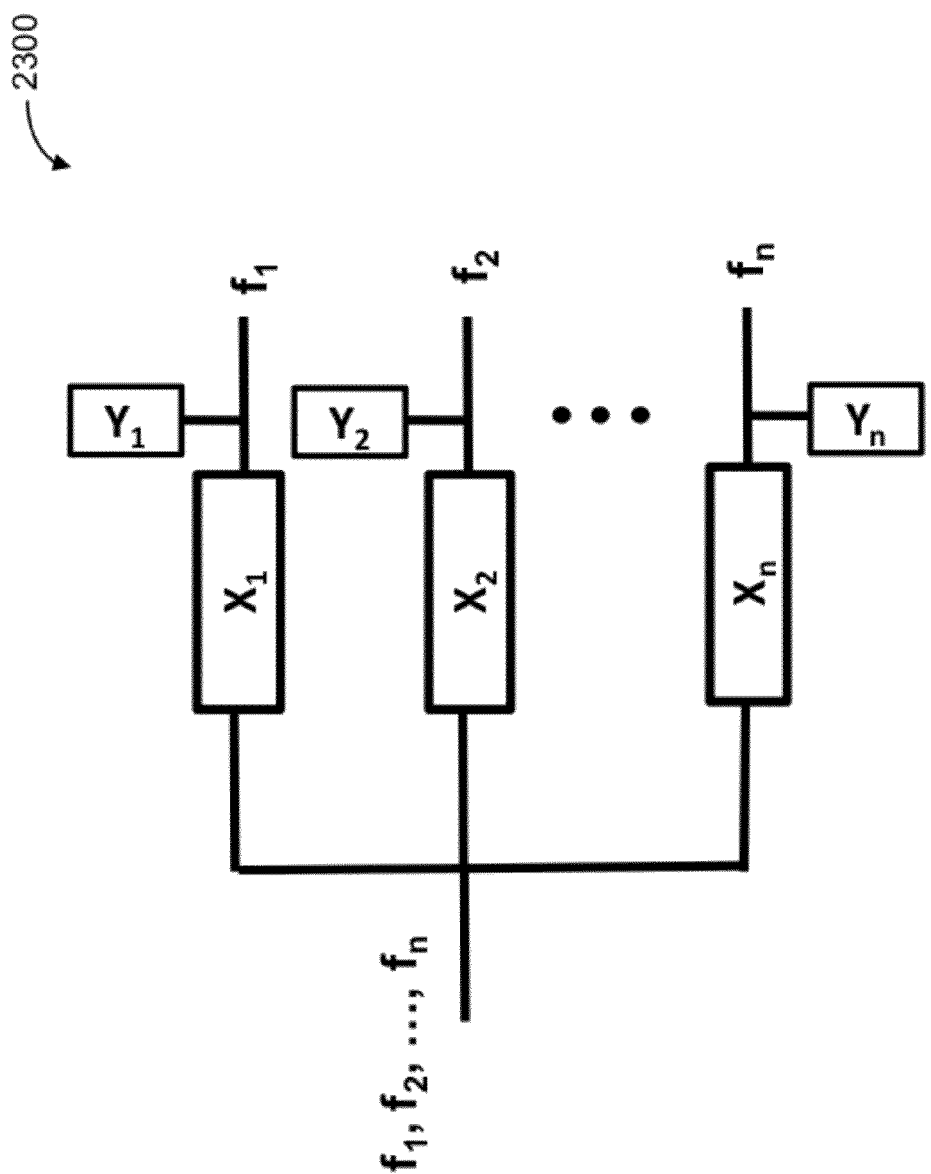
FIG. 23 illustrates an example of a multiband frequency selector having series elements $X_1, X_2, \ldots, X_n$ and shunt elements $Y_1, Y_2, \ldots, Y_n$.

FIG. 23 illustrates an example of a multiband frequency selector 2300, in which the input and output frequencies are represented by $f_1, f_2, \ldots, f_n$, the series elements are denoted by $X_1, X_2, \ldots, X_n$, and the shunt elements are denoted by $Y_1, Y_2, \ldots, Y_n$, where n is a positive integer greater than 1. Thus, the multiband frequency selector 2300 is a (n+1) port bi-directional device in that signals are allowed to transmit in either direction from the one port to the n ports or from the n ports to the one port. The series element $X_m$ and the shunt element $Y_m$, where 1<m<n, are coupled to the same $m^{th}$ branch to select the frequency $f_m$ for passing through the branch to an output. Each branch includes a frequency selector such as the frequency selectors described with reference to FIGS. 8-20. Thus, the pair of the series element $X_m$ and the shunt element $Y_m$ in the $m^{th}$ branch may both be CRLH TLs or may be a combination of an RH TL and a CRLH TL, as in the frequency selectors described with reference to FIGS. 8-20. In addition, a conventional filter such as a high-pass filter, a low-pass filter, a band-pass filter, a band-stop filter or another type of filter may be used for one or more branches. Furthermore, a multi-notch filter based on an E-CRLH structure, as illustrated in FIGS. 21 and 22, may be used for one or more branches as a frequency selector to support complex filtering functions. Thus, the multiband frequency selector 2300 of FIG. 23 is essentially a network of frequency selectors distributed on the multifurcated branches, where the frequency selectors may include conventional filters and frequency selectors. Such a frequency selecting network has (n+1) ports, where n represents the number of the frequency bands supported in the multiband operation, and is a bi-directional device in that signals are allowed to transmit in either direction from the one port to the n ports or from the n ports to the one port.

Figure 24:
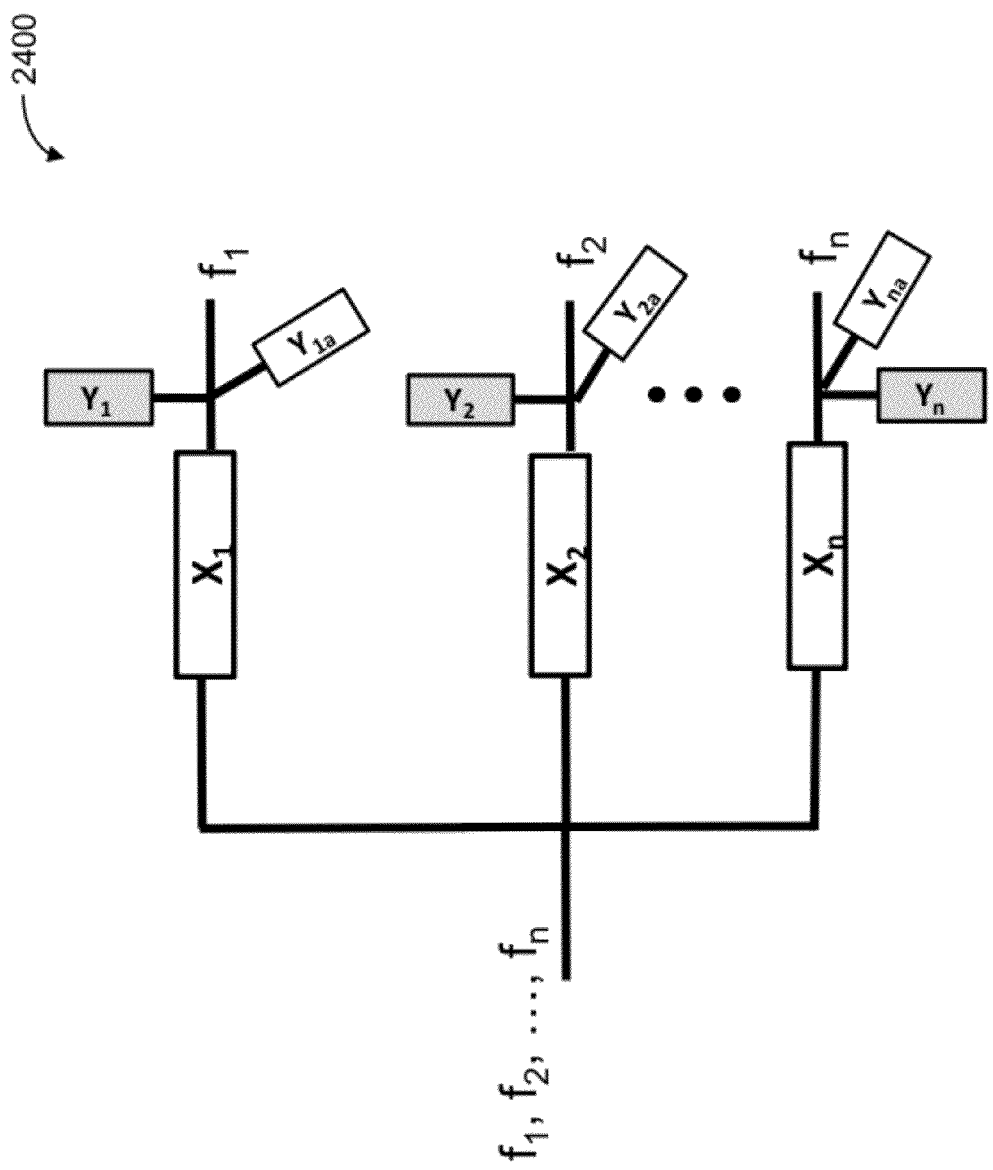
FIG. 24 illustrates an example of a multiband frequency selector having two shunt elements coupled to each branch, as indicated by $Y_1, Y_2, \ldots, Y_n$ and $Y_{1a}, Y_{2a}, \ldots, Y_{na}$.

FIG. 24 illustrates another example of a multiband frequency selector 2400, in which two shunt elements are coupled to each branch, as indicated by $Y_1, Y_2, \ldots, Y_n$, and $Y_{1a}, Y_{2a}, \ldots, Y_{na}$. For example, the first shunt element may be designed to remove a signal with a first frequency and the second shunt element in the same branch may be designed to remove a signal with a second frequency so that the branch passes a signal with a third frequency when the signals with the three different frequencies are inputted to the branch. In another example, the first shunt element may be designed to remove a signal with a first frequency and the second shunt element is designed to remove harmonics from a signal with a second frequency so that the branch passes the signal with the second frequency without harmonics when the signals with the different frequencies are inputted to the branch. To extend the application, three or more shunt elements may be coupled to one branch, or the number of shunt elements per branch may vary from branch to branch. Similarly, the number of series elements per branch may be more than one and may vary from branch to branch. In the frequency selector designs described in this document, each of the series and shunt elements can be chosen to have an RH structure or a CRLH structure, which can be implemented using lumped components, distributed components, or a combination of both.

Figure 25:
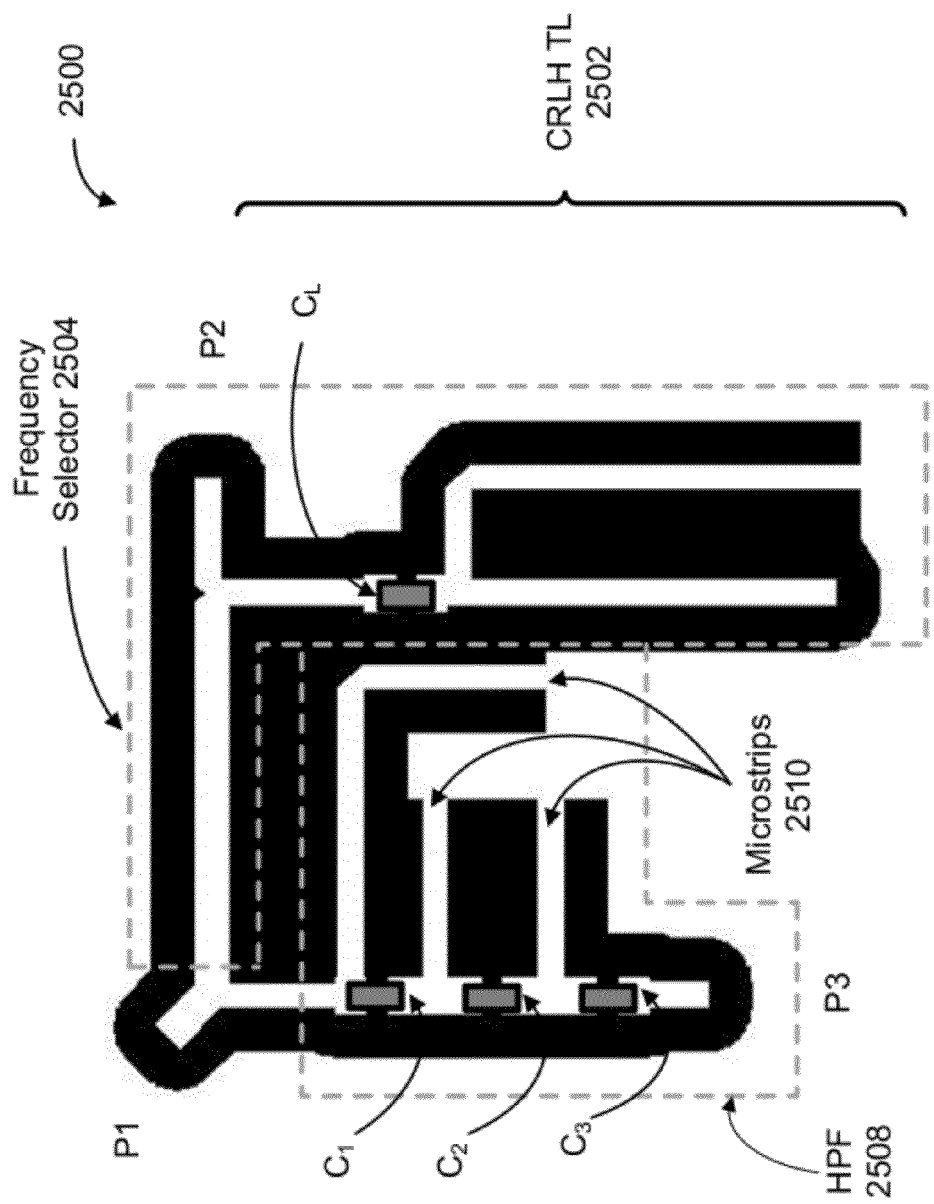
FIG. 25 illustrates a layout of an implementation example a diplexer having a frequency selector and a high-pass filter (HPF).

FIG. 25 illustrates a layout of an implementation example of a diplexer 2500. This implementation is devised to provide a diplexer function based on the combination of the frequency selector 2504 and the HPF 2508. Similar to the double-notch frequency selector 1700 of FIG. 17, the frequency selector 2504 in this example is designed to pass the 2.4 GHz band and filter out the 1.9 GHz and 5 GHz bands. Minor design modifications are made for optimization in comparison to the layout of FIG. 17. For example, the CRLH unit cell 2502 in this case has one $C_L$ capacitor, instead of two $2C_L$ capacitors of FIG. 17 which provide a symmetric unit cell, and the L-shaped RH TL has dimensions for obtaining an optimized $L_L$ value different from the RH TL ($L_L$) 1712 of FIG. 17. The diplexer 2500 of FIG. 25 is a three-port device similar to a conventional diplexer. An antenna or any other device may be connected to the port P1. The port P2 of the diplexer 2500 is coupled to the frequency selector 2504. The port P3 is coupled to the HPF 2508 that is designed with three capacitors C1, C2 and C3 and three microstrips 2510 to filter out the 2.4 GHz band and pass the 5 GHz band. In one example the diplexer 2500 may have an overall footprint of 10 mm×10 mm. The three ports are matched to 50Ω in the example design. Note, however, that the diplexer 2500 in some implementation examples may have the capability of matching different ports to different impedances because of the flexible CRLH phase response and hence the design flexibility. As illustrated in FIG. 25, this implementation example has the HPF 2508 with three microstrips 2510. The longest L-shaped microstrip is placed at the input of the HPF 2508 to rotate the phase associated with the frequency filtered by the HPF, i.e., 2.4 GHz in this example. Thus, the HPF 2508 has an open circuit at the port P1 preventing the signal around 2.4 GHz from going into the branch P1-P3.

Figure 26:
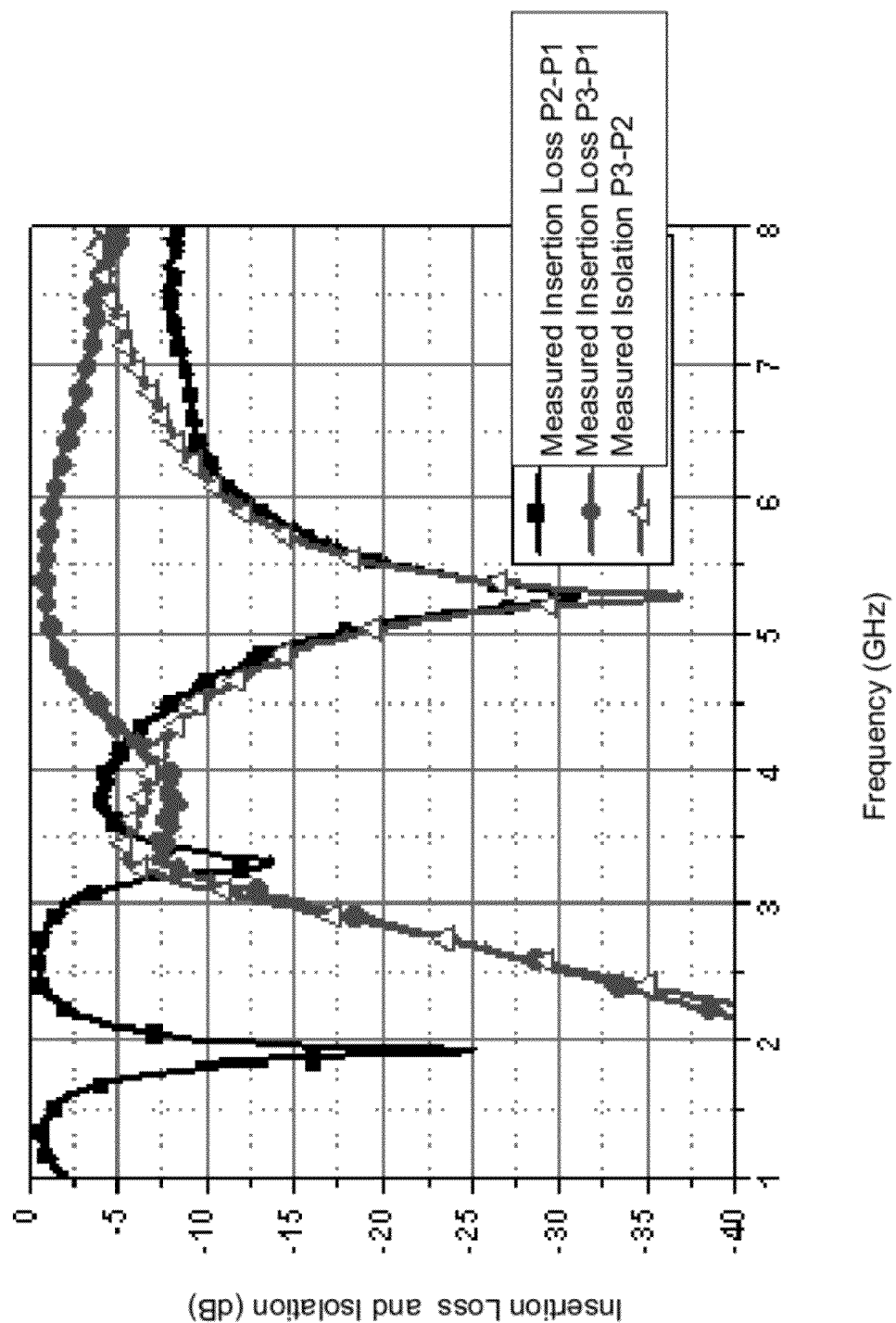
FIG. 26 plots measurement results of insertion loss P2-P1, insertion loss P3-P1 and isolation P3-P2 for the implementation example of FIG. 25.

FIG. 26 plots measurement results of the insertion loss P2-P1, the insertion loss P3-P1 and the isolation P3-P2 for the implementation example diplexer 2500 of FIG. 25. Around 5 GHz, the insertion loss P3-P1 is close to zero and the insertion loss P2-P1 is close to −20 dB, indicating that the signal in the 5 GHz band is selectively transmitted to the port P3 through the HPF 2508 and rejected by the frequency selector 2504. Similarly around 2.4 GHz, the insertion loss P2-P1 is close to zero and the insertion loss P3-P1 is close to −35 dB, indicating that the signal in the 2.4 GHz band is selectively transmitted to the port P2 through the frequency selector 2504 and rejected by the HPF 2508. At around 1.9 GHz, both the insertion losses P2-P1 and P3-P1 are very low, less than −25 dBm, indicating that the signal in the 1.9 band is rejected by both the frequency selector 2504 and the HPF 2508.

The examples of frequency selectors described so far may be considered to be passive since the frequency selection is determined based on RH and/or CRLH TL designs providing proper phases without being controlled by an active component such as a diode or a switch. In different examples, a combination of passive frequency selectors, a combination of RH and CRLH TLs and a combination of CRLH TLs may be structured to be actively controlled for selecting a single frequency or multiple frequencies. These frequency selectors are thus termed active frequency selectors in this document.

FIGS. 27A-27C illustrate an example of an active frequency selector 2700 using two passive frequency selectors 2704 and 2708 connected in parallel. The active frequency selector 2700 has one input port P1 and one output port P2, and a dual signal with frequencies with $f_1$ and $f_2$ may be fed simultaneously or sequentially in different time intervals to the input port P1. These passive frequency selectors may be CRLH-based, conventional, or a combination of both. An active frequency selector can be used for the simultaneous signal input since the frequency selection may be controlled by active components when two different frequencies $f_1$ and $f_2$ are fed at the same time to the input port P1. In the present example, the frequency selector ($f_1$ not $f_2$) 2704 is configured to select the signal with frequency $f_1$ and block the signal with frequency $f_2$, whereas the frequency selector ($f_2$ not $f_1$) 2708 is configured to select the signal with frequency $f_2$ and block the signal with frequency $f_1$. The ON/OFF of the frequency selectors 2704 and 2708 may be controlled by an external control circuit, for example. In FIG. 27A, the frequency selector ($f_1$ not $f_2$) 2704 is ON while the other frequency selector ($f_2$ not $f_1$) 2708 is OFF. While the active frequency selector 2700 is in this state, only the signal with $f_1$ is allowed to pass through this system to reach the port P2. In FIG. 27B, the frequency selector ($f_1$ not $f_2$) 2704 is OFF while the other frequency selector ($f_2$ not $f_1$) 2708 is ON. While the active frequency selector 2700 is in this state, only the signal with $f_2$ is allowed to pass through this system to reach the port P2. In FIG. 27C, both the frequency selector ($f_1$ not $f_2$) 2704 and the other frequency selector ($f_2$ not $f_1$) 2708 are ON. While the active frequency selector 2700 is in this state, both the signals with $f_1$ and $f_2$ are allowed to pass through this system to reach the port P2.

Figure 28:
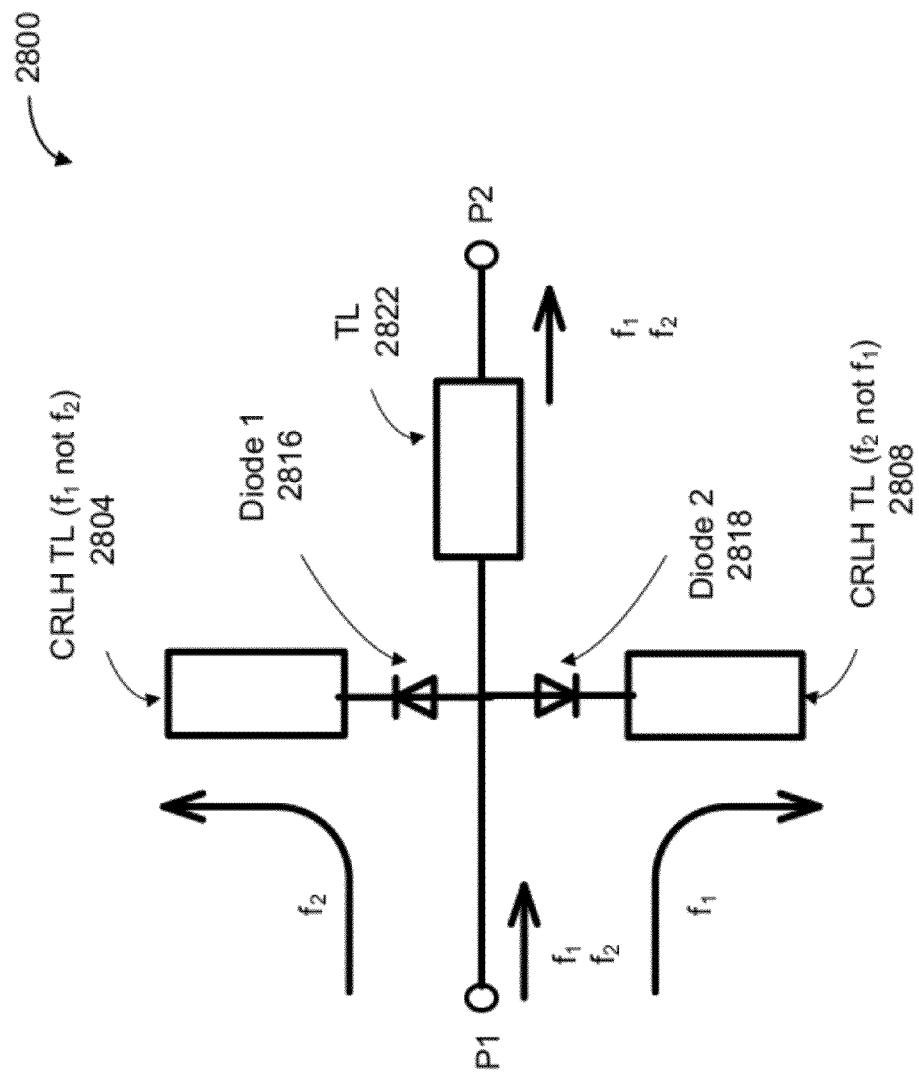
FIG. 28 illustrates an example of an active frequency selector having two CRLH TLs connected in shunt.

FIG. 28 illustrates an example of an active frequency selector 2800 having two CRLH TLs 2804 and 2808 connected in shunt. In this example, two different frequencies $f_1$ and $f_2$ may be fed to the port P1 simultaneously or sequentially in different time intervals. These CRLH TLs 2804 and 2808 are coupled to the signal path P1-P2, each in an open shunt configuration in this example via a diode 1 2816 and a diode 2 2818, respectively. If shunt lines are used for connection in place of the diode 1 2816 and the diode 2 2818, the CRLH TL ($f_1$ not $f_2$) 2804 is configured to pass the signal with frequency $f_1$ through the path P1-P2 and filter out the signal with frequency $f_2$, whereas the CRLH TL ($f_2$ not $f_1$) 2808 is configured to pass the signal with frequency $f_2$ through the path P1-P2 and filter out the signal with frequency $f_1$. These CRLH TLs 2804 and 2808 may be designed based on a CRLH TL design as illustrated in FIG. 8. The ON/OFF of the diode 1 2816 and the diode 2 2818 may be controlled by an external control circuit, for example. When the diode 1 2816 is ON and the diode 2 2818 is OFF, the CRLH TL ($f_1$ not $f_2$) 2804 is coupled to the path P1-P2 so that the signal with $f_1$ is allowed to pass through the path P1-P2, but the signal with $f_2$ is blocked. When the diode 1 2816 is OFF and the diode 2 2818 is ON, the CRLH TL ($f_2$ not $f_1$) 2808 is coupled to the path P1-P2 so that the signal with $f_2$ is allowed to pass through the path P1-P2, but the signal with $f_1$ is blocked. A series TL 2822 is included in this example along the path P1-P2. This TL may be designed using an RH structure such as a conventional microstrip or a CRLH structure so that these phases $\phi_3$ and $\phi_4$ have values suited for underlying applications to adjust the signal transmission and reflection. This TL may also be used to integrate another circuit function, an impedance matching network, for example.

Figure 29:
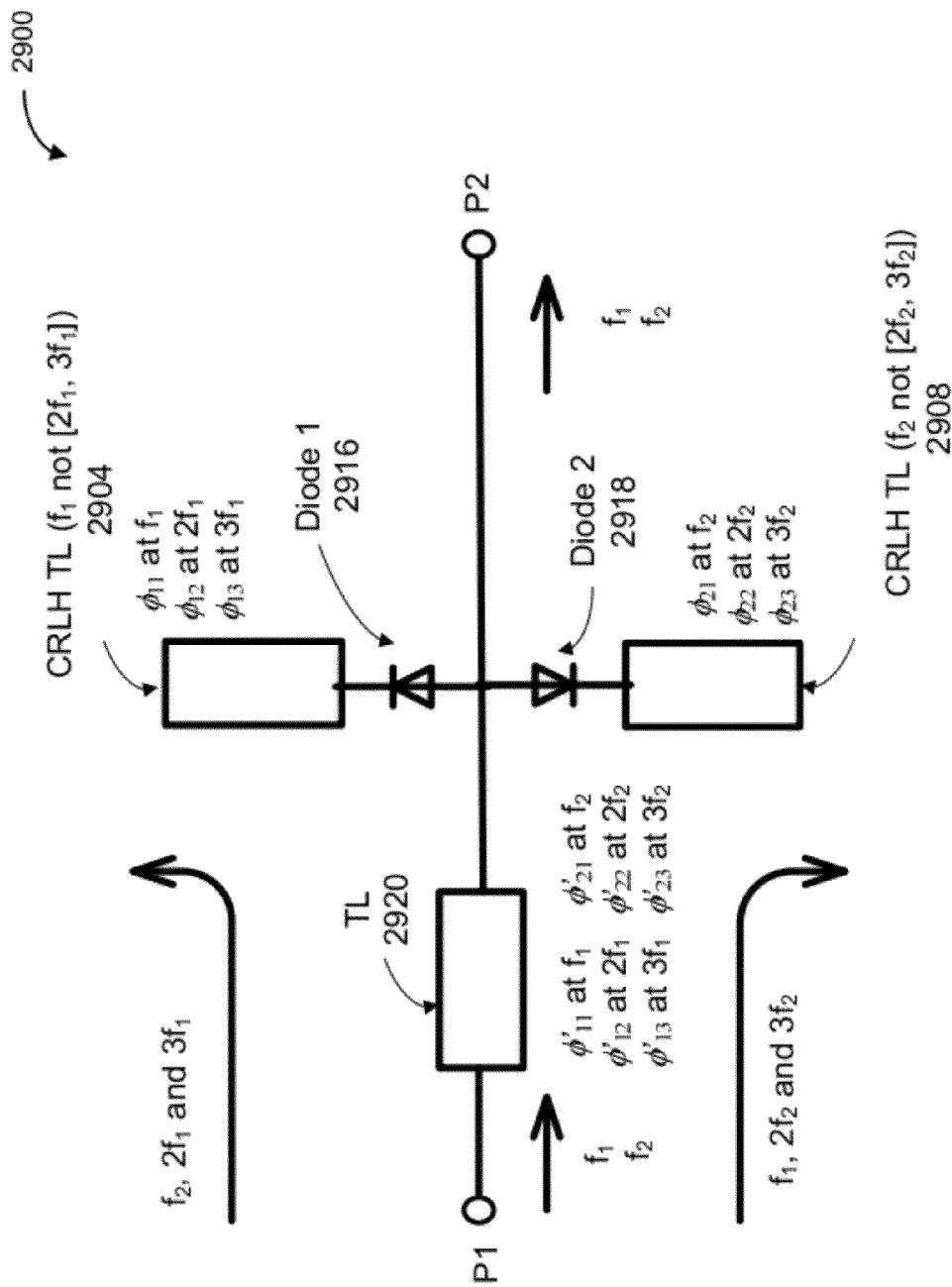
FIG. 29 illustrates an example of an active frequency selector having two CRLH TLs connected in shunt and used as an active harmonic trap.

FIG. 29 illustrates another example of an active frequency selector 2900. In this example, the CRLH TLs 2904 and 2908 are coupled to the path P1-P2 in an open shunt configuration via a diode 1 2916 and a diode 2 2918, respectively, and used as an active harmonic trap for effectively removing harmonics. The design for the shunt CRLH TLs 2904 and 2908 may be similar to the shunt CRLH TL 2004 design in FIG. 20. A series TL 2920 is included in this example along the path P1-P2. This TL 2920 may be designed using an RH structure such as a conventional microstrip or a CRLH structure to have flexibility in phase and frequency selection according to underlying applications. If a shunt line is used for connection in place of the diode 1 2916, the CRLH TL ($f_1$ not [$2f_1$, $3f_1$]) 2904 is configured to pass the signal with frequency $f_1$ through the path P1-P2 and filter out the harmonics $2f_1$ and $3f_1$. This may be accomplished by choosing $\phi_{11}=180°$ (open) at $f_1$, $\phi_{12}=90°$ at $2f_1$ (short) and $\phi_{12}=-90°$ (short) at $3f_1$, for example. Similarly, If a shunt line is used for connection in place of the diode 2 2918, the CRLH TL ($f_2$ not [$2f_2$, $3f_2$]) is configured to pass the signal with frequency $f_2$ through the path P1-P2 and filter out the harmonics $2f_2$ and $3f_2$. This may be accomplished by choosing $\phi_{21}=180°$ (open) at $f_2$, $\phi_{22}=90°$ at $2f_2$ (short) and $\phi_{22}=-90°$ (short) at $3f_2$, for example. The ON/OFF of the diode 1 2916 and the diode 2 2918 may be controlled by an external control circuit (not shown) to select the signal with $f_1$ or the signal with $f_2$ for transmission through the path P1-P2. The TL 2920 may be designed with an RH TL or a CRLH TL to have adequate phases for underlying applications. For example, a class F PA application includes the case in which the port P1 needs to be shorted for the second harmonic and to be open for the third harmonic. In this case, by using a CRLH TL, the phases of the TL 2920 may be chosen to be $\phi'_{11}$=arbitrary at $f_1$, $\phi'_{12}=180°$ at $2f_1$, $\phi'_{13}=90°$ at $3f_1$, $\phi'_{21}$=arbitrary at $f_2$, $\phi'_{22}=-180°$ at $2f_2$, and $\phi'_{23}=-90°$ at $3f_2$, for example. Similarly, an inverse class F PA application includes the case in which the port P1 needs to be open for the second harmonic and to be shorted for the third harmonic. In this case, by using a CRLH TL, the phases of the TL 2920 may be chosen to be $\phi'_{11}$=arbitrary at $f_1$, $\phi'_{12}=90°$ at $2f_1$, $\phi'_{13}=180°$ at $3f_1$, $\phi'_{21}$=arbitrary at $f_2$, $\phi'_{22}=-90°$ at $2f_2$, and $\phi'_{23}=-180°$ at $3f_2$, for example.

As mentioned earlier, obtaining high linearity and/or high efficiency is one of the main goals of PA designs. When used in a conventional single-band PA, an output matching network (OMN) is generally designed to match the output impedance of a transistor to the output load so as to maximize the output power transfer from the transistor to the load. Thus, the OMN may be tailored to improve linearity and efficiency. Similarly, an input matching network (IMN) may be designed to match the input impedance of the transistor to the input load. Thus, in a conventional single-band PA, an IMN and an OMN may be utilized for optimizing efficiency and linearity of the PA over the single band. However, for multiband operations other circuit elements may need to be added, designed or optimized to meet efficiency, linearity and other considerations over multiple frequency bands.

Figure 30:
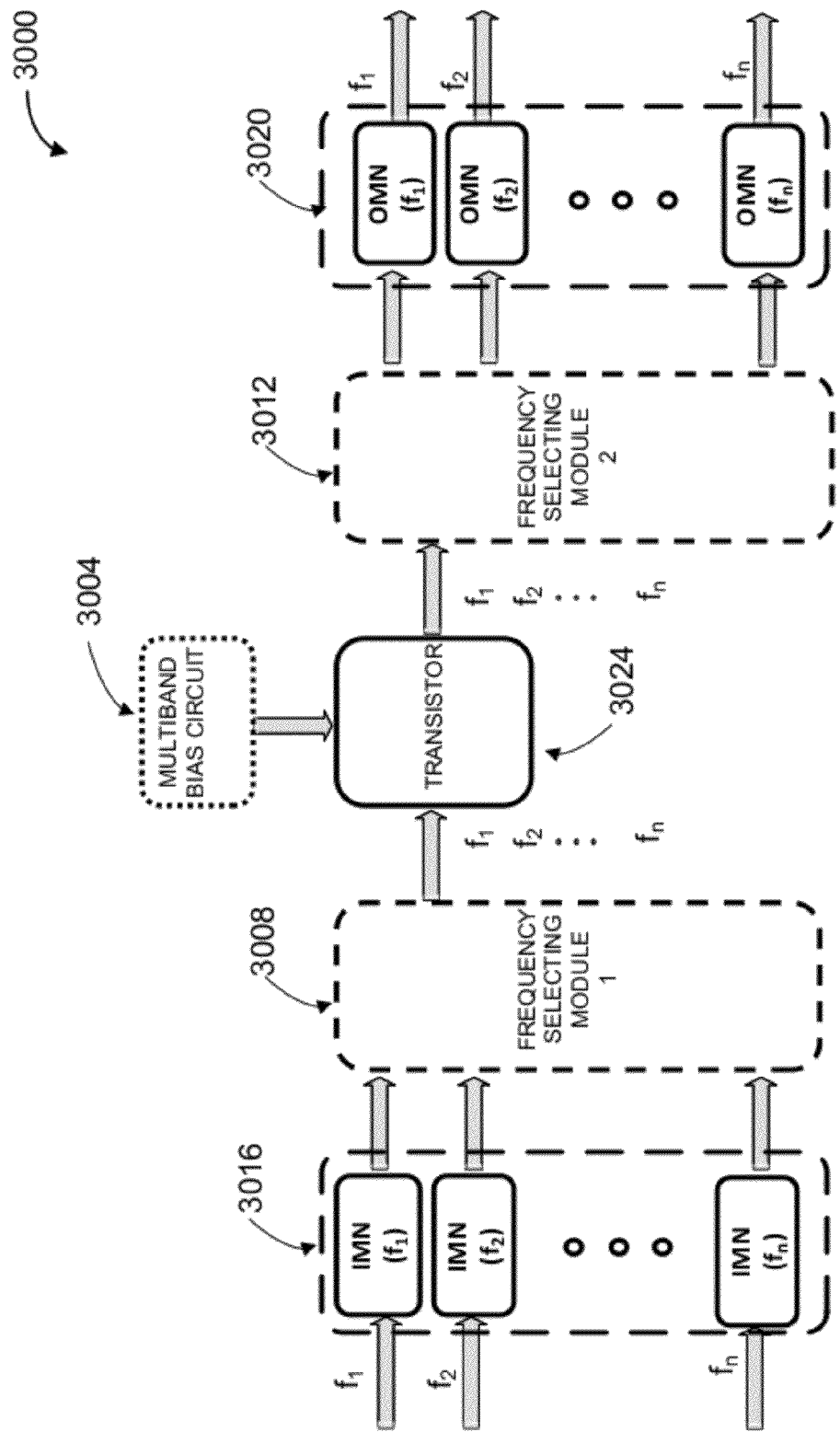
FIG. 30 illustrates a block diagram of a first power amplification system for multiple frequency bands.

FIG. 30 illustrates a block diagram of a first power amplification system 3000 for multiple frequency bands. This power amplification system 3000 represents an example of a multiband PA. The first system 3000 has multiple input ports and multiple output ports for handling multiple frequency bands individually, and includes a multiband bias circuit 3004, a frequency selecting module 1 3008 on the input side, another frequency selecting module 2 3012 on the output side, an IMN 3016 including IMN($f_1$), IMN($f_2$), ..., IMN($f_n$) for input impedance matching for respective frequency bands, an OMN 3020 including OMN($f_1$), OMN($f_2$), ..., OMN($f_n$) for output impedance matching for respective frequency bands, and a transistor 3024 that receives bias signals from the multiband bias circuit 3004 and is coupled to the frequency selecting module 1 3008 and the frequency selecting module 2 3012. The transistor 3024 is a multiband transistor operable for the multiple frequency bands and may include multiple basic transistors for handling the frequency range and power levels considered for underlying multiband applications. The multiband bias circuit 3004 may include multiple basic bias circuits for biasing different terminals of the transistor 3004. Typically, a drain bias and a gate bias are needed for a Metal-Oxide-Semiconductor Field Effect Transistor (MOSFET) type of transistor; a collector bias and a base bias are needed for a Bipolar Junction Transistor (BJT) type of transistor or Heterojunction Bipolar Transistor (HBT). In general, a bias circuit is designed to deliver DC power to the transistor while being transparent to the RF signal so as to prevent the RF signal leakage into the bias circuit that may degrade the efficiency and linearity of the PA in which the bias circuit is included. To perform the similar operation for two or more frequency bands, the multiband bias circuit 3004 may include a multiband bias circuit as illustrated in FIG. 6.

When different signals with different frequencies $f_1$, $f_2$, ..., and $f_n$ are inputted simultaneously, the frequency selecting module 1 3008 is configured to select the signal with one frequency, $f_1$, $f_2$, ..., or $f_n$, from the input signals coming out of the IMNs 3016. One role of this frequency selecting module 1 3008 on the input side is to send a signal with one frequency in a given time interval to the transistor 3024, instead of mixed signals with different frequencies. Generally, if signals with two different frequencies are sent at the same time to a transistor, several intermodulation products may be outputted from the transistor. Such an intermodulation arises from non-linearity between the input and the output of a transistor, resulting in possible detrimental effects. The intermodulation associated with the transistor 3024 may thus be avoided by use of the frequency selecting module 1 3008 for the case in which multiple signals with different frequencies are inputted simultaneously. Further, the frequency selecting module 1 3008 is configured to prevent signal reflections into wrong paths so as to minimize the signal mixing and maximize the power transfer, thereby improving the linearity and efficiency. When multiple signals with different frequencies $f_1$, $f_2$, ..., and $f_n$ are inputted sequentially in different time intervals, the intermodulation of the transistor 3024 does not occur under normal conditions. However, the frequency selecting module 1 3008 is used to prevent signal reflections into wrong paths so as to minimize the signal mixing and maximize the power transfer, thereby improving the linearity and efficiency. The frequency selecting module 2 3012 on the output side is configured to send a signal with a certain frequency $f_m$ ($1 \leq m \leq n$) to the $m^{th}$ output port, and/or remove harmonics from the output signals from the transistor 3024.

Figure 31:
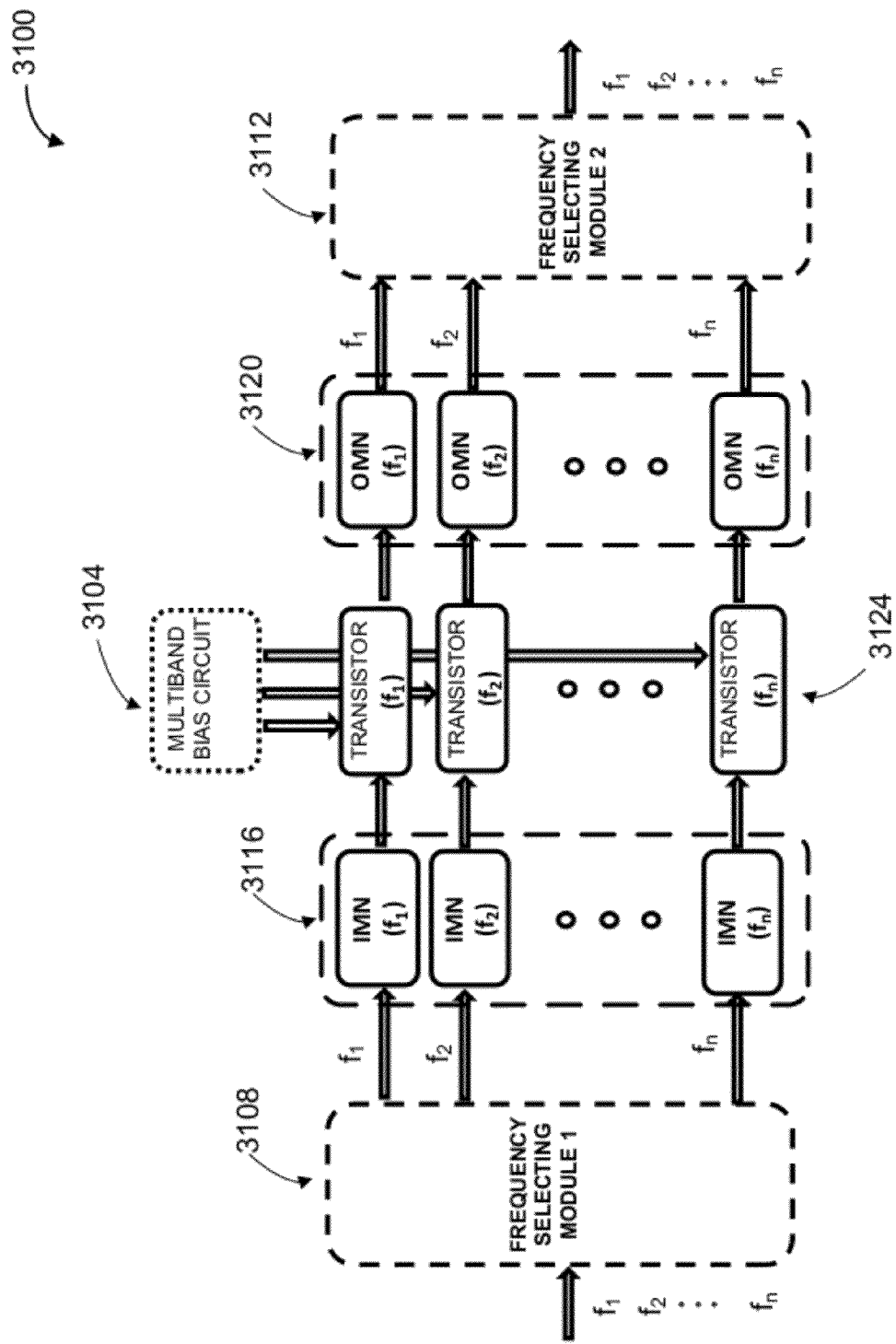
FIG. 31 illustrates a block diagram of a second power amplification system for multiple frequency bands.

FIG. 31 illustrates a block diagram of a second power amplification system 3100 for multiple frequency bands. The second system 3100 has a single input port and a single output port for handling multiple frequency bands in one channel, and includes a multiband bias circuit 3104, a frequency selecting module 1 3108 on the input side for sending the signal with one frequency $f_m$ to the $m^{th}$ branch ($1 \leq m \leq n$), another frequency selecting module 2 3112 on the output side to select a signal with one frequency and send the selected signal to the output port, an IMN 3116 including IMN($f_1$), IMN($f_2$), . . . , IMN($f_n$) for input impedance matching for respective frequency bands, an OMN 3120 including OMN ($f_1$), OMN($f_2$), . . . , OMN($f_n$) for output impedance matching for respective frequency bands, and multiple transistors 3124, each receiving bias signals from the multiband bias circuit 3104 and coupled to one of the IMN($f_1$), IMN($f_2$), . . . , IMN($f_n$) and to one of the OMN($f_1$), OMN($f_2$), . . . , OMN($f_n$). Each of the transistors 3124 is a single-band transistor and may include multiple basic transistors for handling the frequency range and power levels considered for underlying applications. These transistors 3124 may be implemented using separate discrete packages or banks of segmented basic transistors on an IC chip. The multiband bias circuit 3104 may include multiple basic bias circuits for biasing multiple transistors 3104 and different terminals of each of the transistors 3104. The multiband bias circuit 3104 may include a multiband bias circuit such as shown in FIG. 6.

In the second system 3100 of FIG. 31, multiple signals with different frequencies $f_1$, $f_2$, . . . , and $f_n$ may be inputted simultaneously or sequentially in different time intervals. The frequency selecting module 1 3108 on the input side in the second system 3100 of FIG. 31 works in the similar way as the frequency selecting module 2 3012 on the output side in the first system 3000 of FIG. 30; and the frequency selecting module 2 3112 on the output side in the second system 3100 of FIG. 31 works in the similar way as the frequency selecting module 1 3008 on the input side in the first system 3000 of FIG. 30.

The second power amplifying system 3100 of FIG. 31 represents an example of a multiband PA. In addition, by using an array of single-band PAs, each accommodating the IMN($f_m$), one of the transistors 3124 handling the $f_m$ band and the OMN($f_m$), where $1 \leq m \leq n$, a power amplifying system in a compact design may be realized for multiband operations.

The second system 3100 of FIG. 31 may be modified for the case of one input port and multiple output ports by removing the frequency selecting module 2 3112 from the output side. Similarly, this system 3100 may be modified for the case of multiple input ports and one output port by removing the frequency selecting module 1 3108 from the input side.

The frequency selecting module in the above power amplification systems 3000 and 3100 of FIGS. 30 and 31 may be configured to include a multiband frequency selector such as illustrated in FIG. 23 or FIG. 24. Further, the frequency selecting module may be configured to include an active frequency selector such as illustrated in FIG. 28 or FIG. 29. Furthermore, a combination of a multiband frequency selector and an active frequency selector may be utilized in one frequency selecting module.

Figure 32:
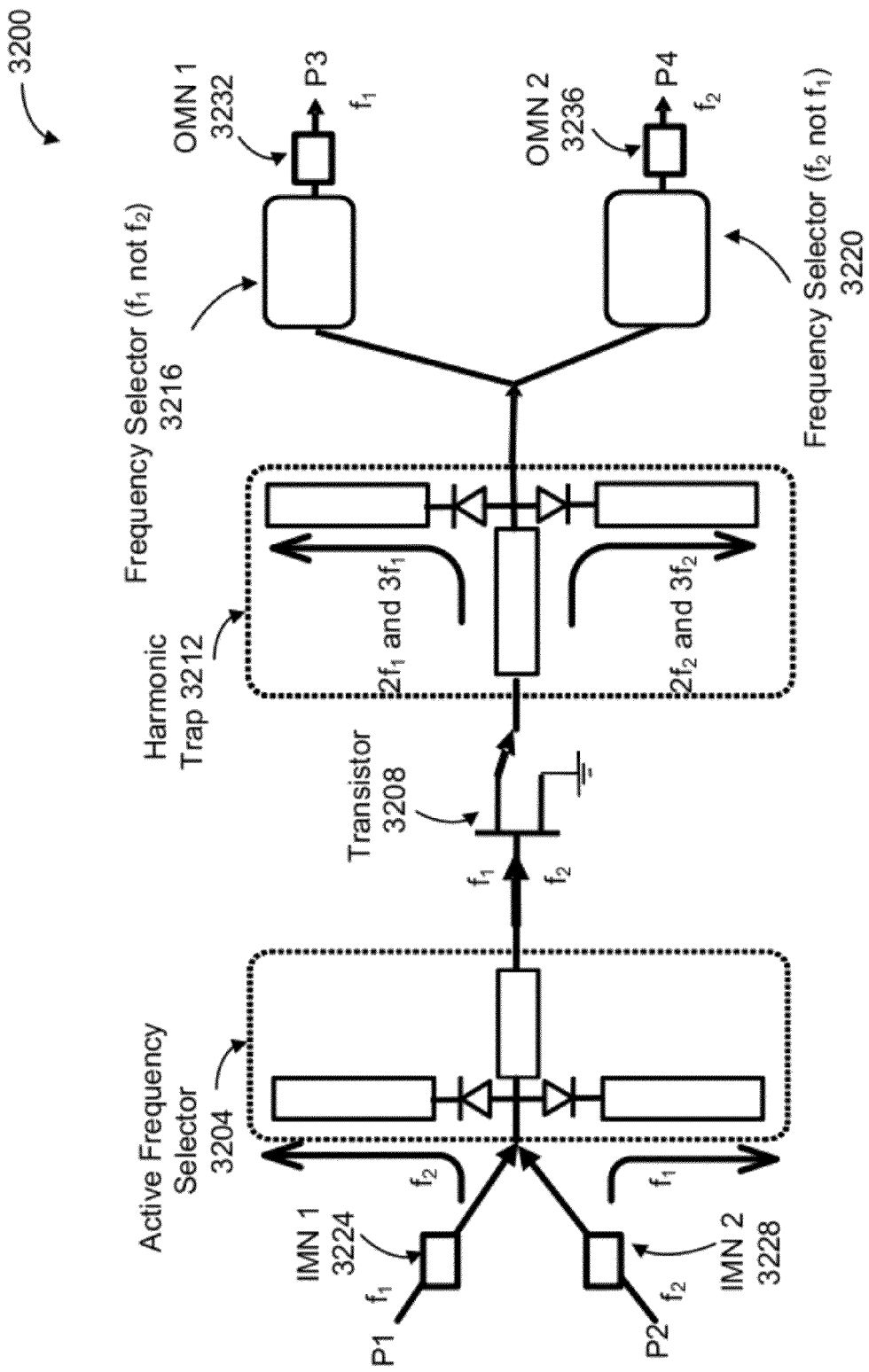
FIG. 32 illustrates an example of a dual-band PA based on the power amplification system of FIG. 30 using active frequency selectors.

FIG. 32 illustrates an example of a dual-band PA 3200 based on the first power amplification system 3000 of FIG. 30 using active and passive frequency selectors for the first and second frequency modules. This dual-band PA 3200 has two input ports P1 and P2 and two output ports P3 and P4. The dual signals with frequencies $f_1$ and $f_2$ may be fed simultaneously or sequentially in different time intervals to the input ports P1 and P2, respectively. In this example, an active frequency selector 3204, such as the active frequency selector 2800 of FIG. 28, is placed on the input side; and a harmonic trap 3212, such as the active frequency selector 2900 of FIG. 29, is placed on the output side. The ON/OFF of the diodes in the active frequency selector 3204 is controlled to select the signal with either $f_1$ or $f_2$, which is to be sent to a transistor 3208 for amplification. The transistor may be a Metal Semiconductor Field Effect Transistor (MESFET), a Pseudomorphic High Electron Mobility Transistor (pHEMT), a Heterojunction Bipolar Transistor (HBT) or of other suitable technologies. The harmonic trap 3212 is designed to remove the second and third harmonics for $f_1$ and $f_2$ in this example. Specifically, by controlling the ON/OFF of the diodes in the harmonic trap 3212, the harmonics $2f_1$ and $3f_1$ may be removed when the signal with $f_1$ is outputted from the transistor 3208 or the harmonics $2f_2$ and $3f_2$ may be removed when the signal with $f_2$ is outputted from the transistor 3208. The output of the harmonic trap 3212 is coupled to the frequency selector ($f_1$ not $f_2$) 3216 and the frequency selector ($f_2$ not $f_1$) 3220 that are connected in a diplexer form. Thus, the signal with $f_1$ is selected to pass through the upper branch to the output port P3 and the signal with $f_2$ is selected to pass through the lower branch to the output port P4. Each of these frequency selectors on the output side may include a passive frequency selector described with reference to FIGS. 8-22. The IMN 1 3224 is coupled to the input port P1, the IMN 2 3228 is coupled to the input port P2, the OMN 1 3232 is coupled to the output port P3, and the OMN 2 3236 is coupled to the output port P4.

Figure 33:
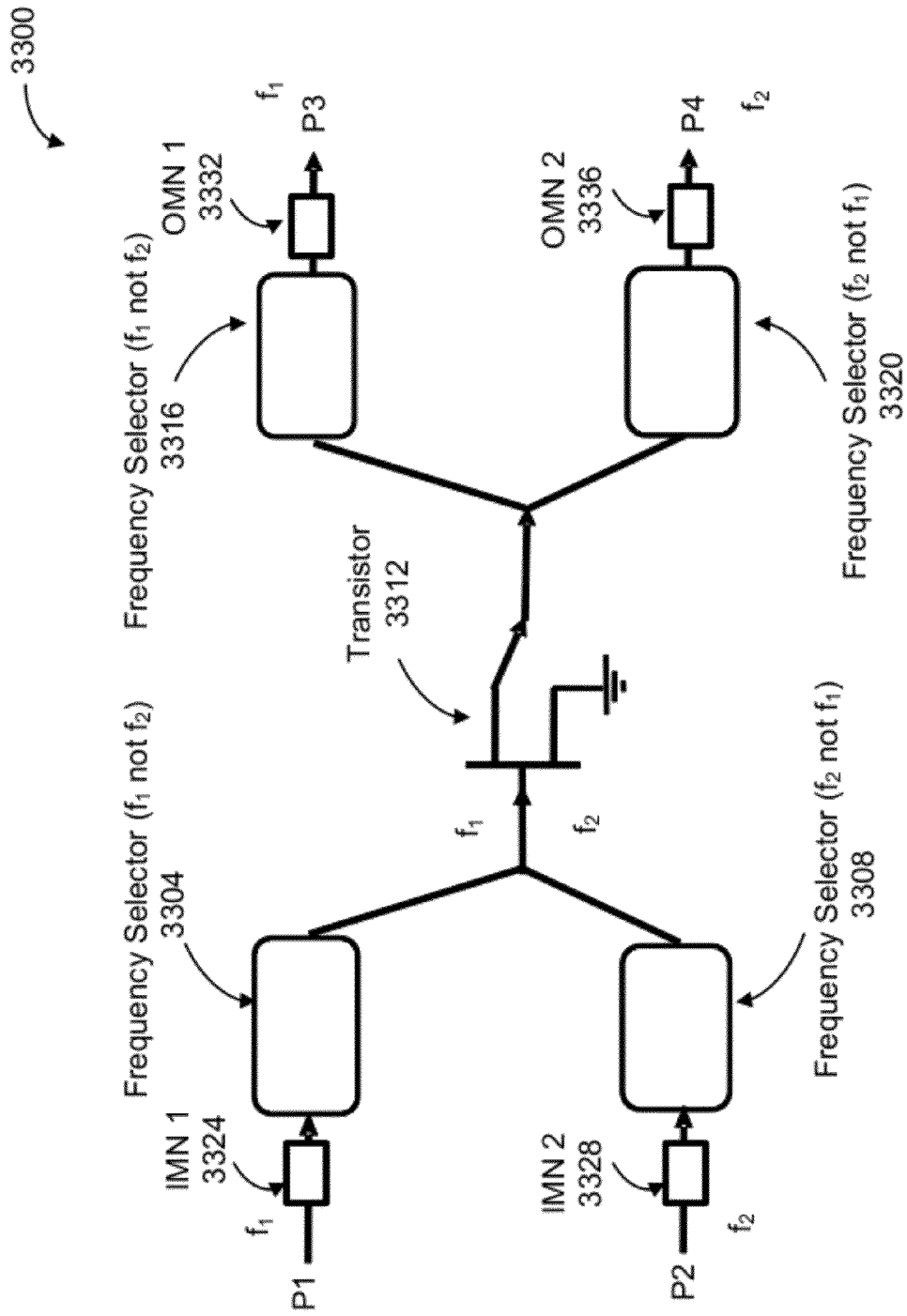
FIG. 33 illustrates an example of a dual-band PA based on the power amplification system of FIG. 30 and having two input ports and two output ports.

FIG. 33 illustrates another example of a dual-band PA 3300 based on the first power amplification system 3000 of FIG. 30. This dual-band PA 3300 has two input ports P1 and P2 and two output ports P3 and P4, and includes two passive frequency selectors 3304 and 3308 on the input side and two passive frequency selectors 3316 and 3320 on the output side. Examples of passive frequency selectors described with reference to FIGS. 8-22 may be utilized to construct these passive frequency selectors 3304, 3308, 3316 and 3320. The IMN 1 3324 is coupled to the input port P1, the IMN 2 3328 is coupled to the input port P2, the OMN 1 3332 is coupled to the output port P3, and the OMN 2 3336 is coupled to the output port P4. Signals with $f_1$ and $f_2$ are fed at the input ports P1 and P2, respectively. Due to the use of the passive frequency selectors 3304 and 3308 on the input side in this example, the signals may need to be inputted sequentially in different time intervals to avoid intermodulation which may occur if signals from both input ports P1 and P2 are inputted simultaneously and reach the transistor simultaneously. The frequency selector ($f_1$ not $f_2$) 3304 selects the signal with $f_1$ but not the signal with $f_2$ and blocks the signal $f_2$ reflection, while the frequency selector ($f_2$ not $f_1$) 3308 selects the signal with $f_2$ but not the signal with $f_1$ and blocks the signal $f_1$ reflection. The selected signal with $f_1$ or $f_2$ is then amplified by the transistor 3312. The output frequencies are selected at the output branches having the frequency selector ($f_1$ not $f_2$) 3316 on one branch to select $f_1$ and the frequency selector ($f_2$ not $f_1$) 3320 on the other branch to select $f_2$. Thus, the signal with $f_1$ is outputted to the output port P3; and the signal with $f_2$ is outputted to the port P4.

Figure 34:
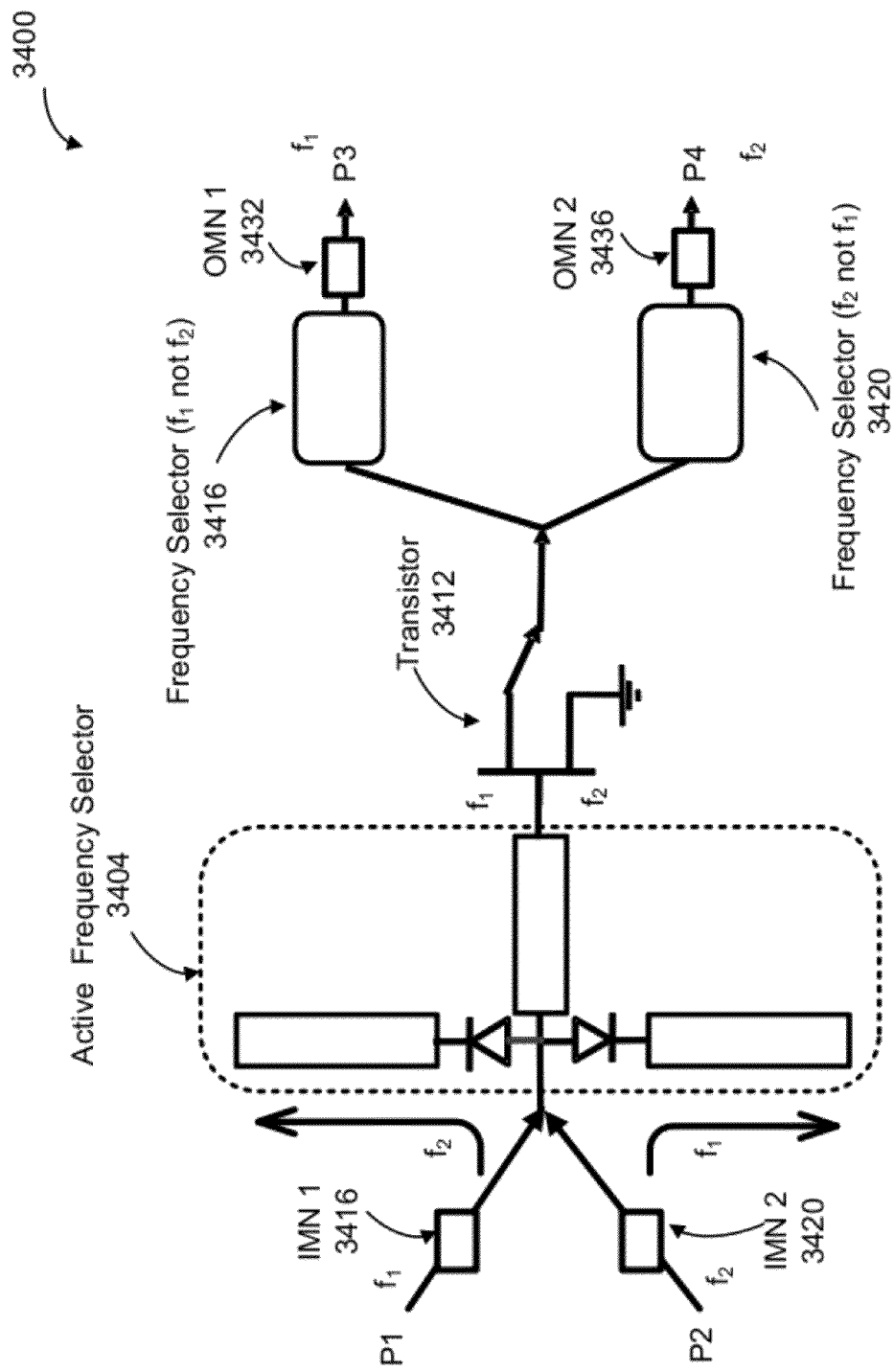
FIG. 34 illustrates an example of a dual-band PA based on the power amplification system of FIG. 30 and having two input ports and two output ports.

FIG. 34 illustrates another example of a dual-band PA 3400 based on the first power amplification system 3000 of FIG.

30. This dual-band PA 3400 has two input ports P1 and P2 and two output ports P3 and P4, and includes an active frequency selector 3404, such as the active frequency selector 2800 of FIG. 28, on the input side and two passive frequency selectors 3416 and 3420 on the output side. The IMN 1 3416 is coupled to the input port P1; the IMN 2 3420 is coupled to the input port P2; the OMN 1 3432 is coupled to the output port P3; and the OMN 2 3436 is coupled to the output port P4. The signals with $f_1$ and $f_2$ may be inputted from the input ports P1 and P2, respectively, simultaneously or sequentially in different time intervals. By controlling the ON/OFF of the diodes in the active frequency selector 3404, the signal with frequency $f_1$ or the signal with frequency $f_2$ is selected. The selected signal with $f_1$ or $f_2$ is then amplified by the transistor 3412. The output frequencies are selected at the output branches having the frequency selector ($f_1$ not $f_2$) 3416 on one branch to select $f_1$ and the frequency selector ($f_2$ not $f_1$) 3420 on the other branch to select $f_2$.

Figure 35:
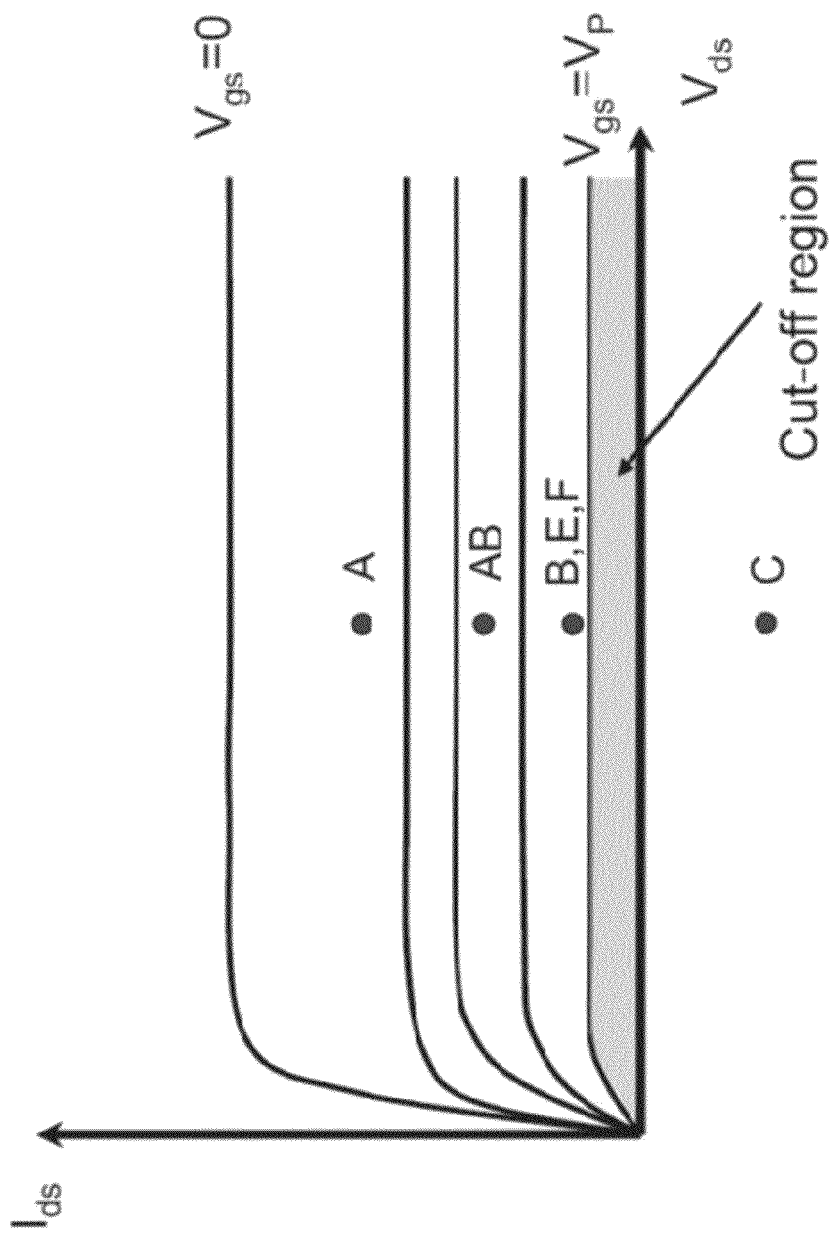
FIG. 35 illustrates I-V characteristics of a MESFET with bias points of various class operations.

As mentioned earlier, it is generally preferred that PAs have high linearity and/or efficiency in order to meet various specifications and achieve a sufficient performance level in communication systems. In systems such as the Global System for Mobile (GSM) communications, PAs are preferred to have high efficiency, but linearity considerations may be less stringent because constant envelope signals are used therein. In other systems, such as the Code Division-Multiple Access (CDMA) systems, non-constant envelope signals are used, and thus linearity considerations are likely to be stringent. Generally, efficiency and linearity have a trade-off relationship in a PA. FIG. 35 illustrates the I-V characteristics of a MESFET as an example. The bias points of various class operations are indicated in this figure. A MESFET is driven by a negative gate-to-source voltage Vgs having the maximum current at Vgs=0. As the Vgs is lowered until the pinch-off at Vgs=Vp, the drain-to-source current Ids decreases. Below the Vgs=Vp line is the cut-off region. A class-A PA has the bias point with a high Vgs value and hence a high Ids value. This equates to high output power and hence high linearity. However, the class-A operation is mostly in an ON-state in spite of varying signal envelopes, thereby resulting in low efficiency due to prolonged power loss. Thus, a class-A PA is considered to be a linear amplifier but generally has a poor efficiency rating. A class-C is operated with a very low Vgs value below the pinch-off for special applications. Class-B, class-E, class-F and their inverses have bias points with Vgs values close to pinch off, being capable of providing ON/OFF controls for varying signal envelopes so as to reduce power loss and thus increase efficiency compared to class-A. However, the linearity in these PAs may not be sufficient for certain applications due to the low Ids current and hence low output power. In some cases, PAs may be designed to operate in two modes: class-AB and class-F, for example, by changing the bias point of the PA. This type of operation may contribute to achieving high efficiency and linearity in spite of the trade-off relationship. In applications where both moderate efficiency and linearity are preferred, a class-AB PA may be chosen since the bias point is located between the class-A and the classes-B, E and F. A class-J PA may generally be viewed as a class-AB PA plus a harmonic trap used to remove harmonics. In a class-J scheme, it is possible to have both the second and third harmonics shorted. This allows the drain (collector) current and voltage to have sinusoidal waveforms, which will enhance linearity of the class-J PA.

The following PA architectures in this document are based on a class-J PA. By using a CRLH TL for the harmonic trap in the class-J PA, an example of a class-J MTM PA is devised and described as below. Using CRLH structures may contribute to a circuit size reduction and a decrease in power loss, which may consequently improve efficiency. Additionally, biasing the PA close to the class-AB bias point is expected to lead to better linearity than class-B, E, F and their inverses. Note, however, that the similar harmonic trapping scheme based on CRLH structures can be used for other classes as well depending on efficiency and linearity considerations of underlying applications.

FIG. 36A-36C illustrate schematic diagrams of three different configurations for removing harmonics in a PA. FIG. 36A illustrates a conventional configuration of a class-J PA using a conventional harmonic trap 3616, which includes multiple RH TLs for removing multiple harmonics individually. This PA includes an IMN 3604 on the input side and an OMN 3612 on the output side, and the harmonic trap 3616 coupled to the transistor drain (or collector) terminal through an RH TL 3608 such as a microstrip. FIG. 36B illustrates a configuration of a class-J MTM PA having an MTM harmonic trap 3620 for removing multiple harmonics based on one CRLH TL in place of multiple TLs in FIG. 36A. The frequency selector 2000 of FIG. 20, for example, may be utilized for the harmonic trap 3620 to remove the second and third harmonics, thereby resulting in less components than the conventional harmonic trap 3616. Such an overall circuit size reduction may consequently reduce the overall power loss, thereby improving efficiency. FIG. 36C illustrates a class-J MTM PA having an OMN-integrated MTM harmonic trap 3624. In this integration example, the RH portion of the CRLH TL, i.e. an RH inductance $L_R$ and an RH capacitance $C_R$, are structured for optimizing the output impedance matching in addition to providing adequate phases as part of the CRLH TL in the MTM harmonic trap 3624.

Figure 37:
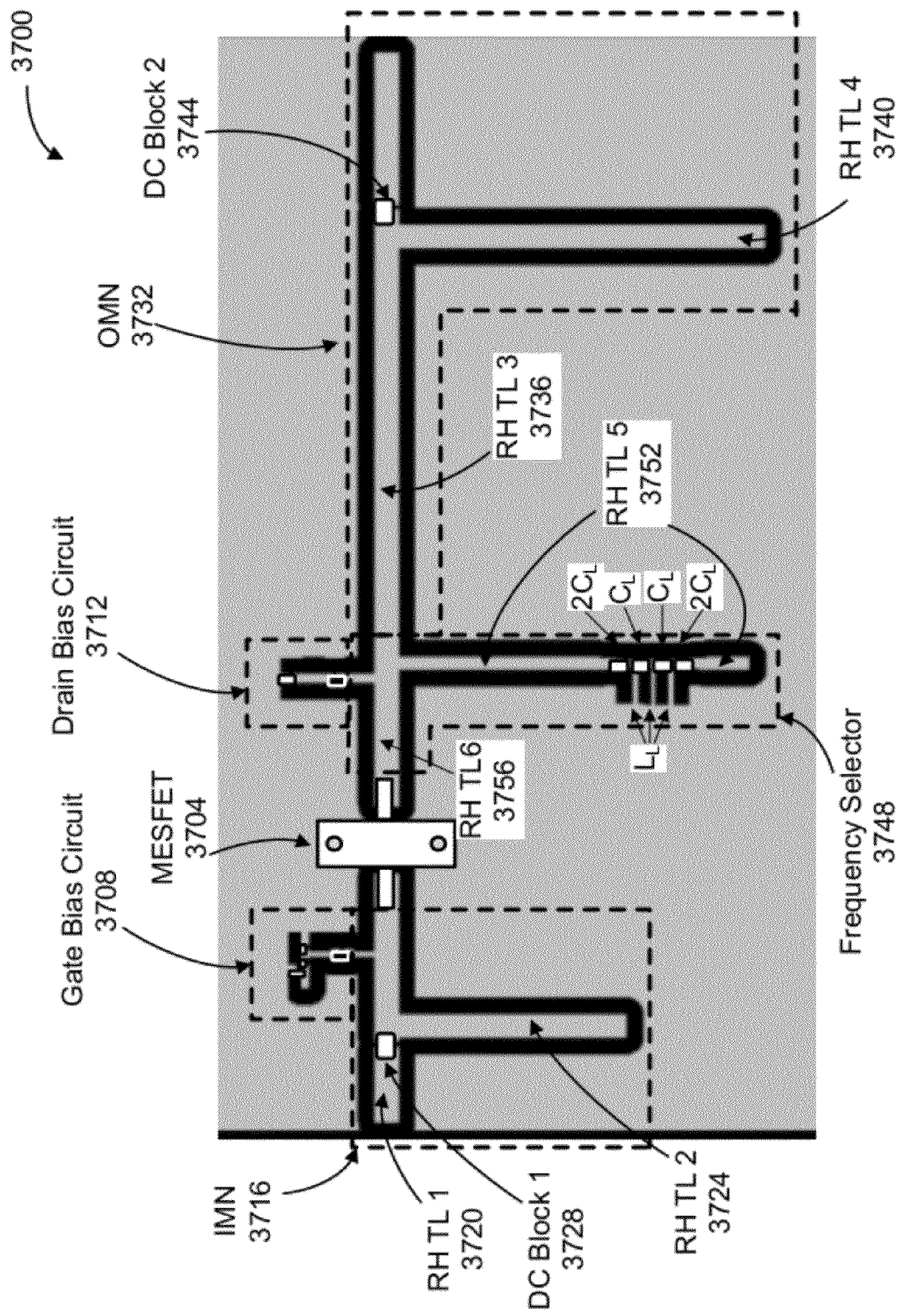
FIG. 37 illustrates a layout of an implementation example of the class J MTM PA with the MTM harmonic trap of FIG. 36B.

FIG. 37 illustrates a layout of an implementation example 3700 of the class J MTM PA with the MTM harmonic trap 3620 of FIG. 36B. A MESFET 3704 is used in this example due to availability of the discrete package for the underlying frequency range. However, the transistor may be of a different type with a different fabrication technique. FIG. 37 schematically illustrates additional discrete components used to realize this PA. The gate of the MESFET 3704 is biased by the gate bias circuit 3708, which includes two capacitors, a resistor and an RF choke. The drain of the MESFET 3704 is biased by the drain bias circuit 3712, which includes a capacitor and an RF choke. Although conventional single-band bias circuits are used for this implementation example 3700, the bias circuit as illustrated in FIG. 6 may be used for one or both of the gate and drain bias circuits. The IMN 3716 includes a series RH TL and a shunt RH TL, indicated as RH TL 1 3720 and RH TL 2 3724, respectively. As explained earlier with reference to FIGS. 1F and 1G, the combination of a series RH TL and a shunt RH TL may be modeled with an RH series inductance $L_R$ and an RH shunt capacitor $C_R$. By structuring the lengths and widths of the RH TLs 3720 and 3724, these equivalent circuit parameters may be adjusted to provide the optimum input impedance matching. A DC bock 1 3728 is included in the path along the RH TL 1 3720 to block DC signals. Similarly, the OMN 3732 includes a series RH TL and a shunt RH TL, indicated as RH TL 3 3736 and RH TL 4 3740, respectively. By structuring the lengths and widths of the RH TLs 3736 and 3740, the equivalent circuit parameters may be adjusted to provide the optimum output impedance matching. A DC block 2 3744 is included in the path along the RH TL 3 3736 to block DC signals. The frequency selector 3748 plays a role of the MTM harmonic trap. Four shunt LH capacitors, i.e., two $2C_L$s and two $C_L$s, three shunt $L_L$ inductors, i.e., three $L_L$s, and the RH TL 5 3752 are configured to provide three CRLH unit cells in this example. These parameter values are manipulated to provide the harmonic trap function, i.e., to remove the second and third harmonics and pass the signal with the primary frequency by using the CRLH design scheme for the harmonic trap described with reference to FIG. 20, in which the CRLH phase curve is fit to three points. The phases of the RH TL 6 3756 may also be determined using the RH design scheme described with reference to FIG. 20 in that the input port P1, which is coupled to the drain terminal of the MESFET 3704, has an open circuit for odd harmonics and a short circuit for even harmonics, as generally considered for class-J applications. The phases of the RH TL 6 3756 may be adjusted differently depending on underlying applications to adjust the signal transmission and reflection. The efficiency may be improved due to the reduced size of the frequency selector 3748 compared to the conventional RH harmonic trap in FIG. 36A. Furthermore, sufficient linearity may also be achieved due to the use of the class AB bias.

Figure 38:
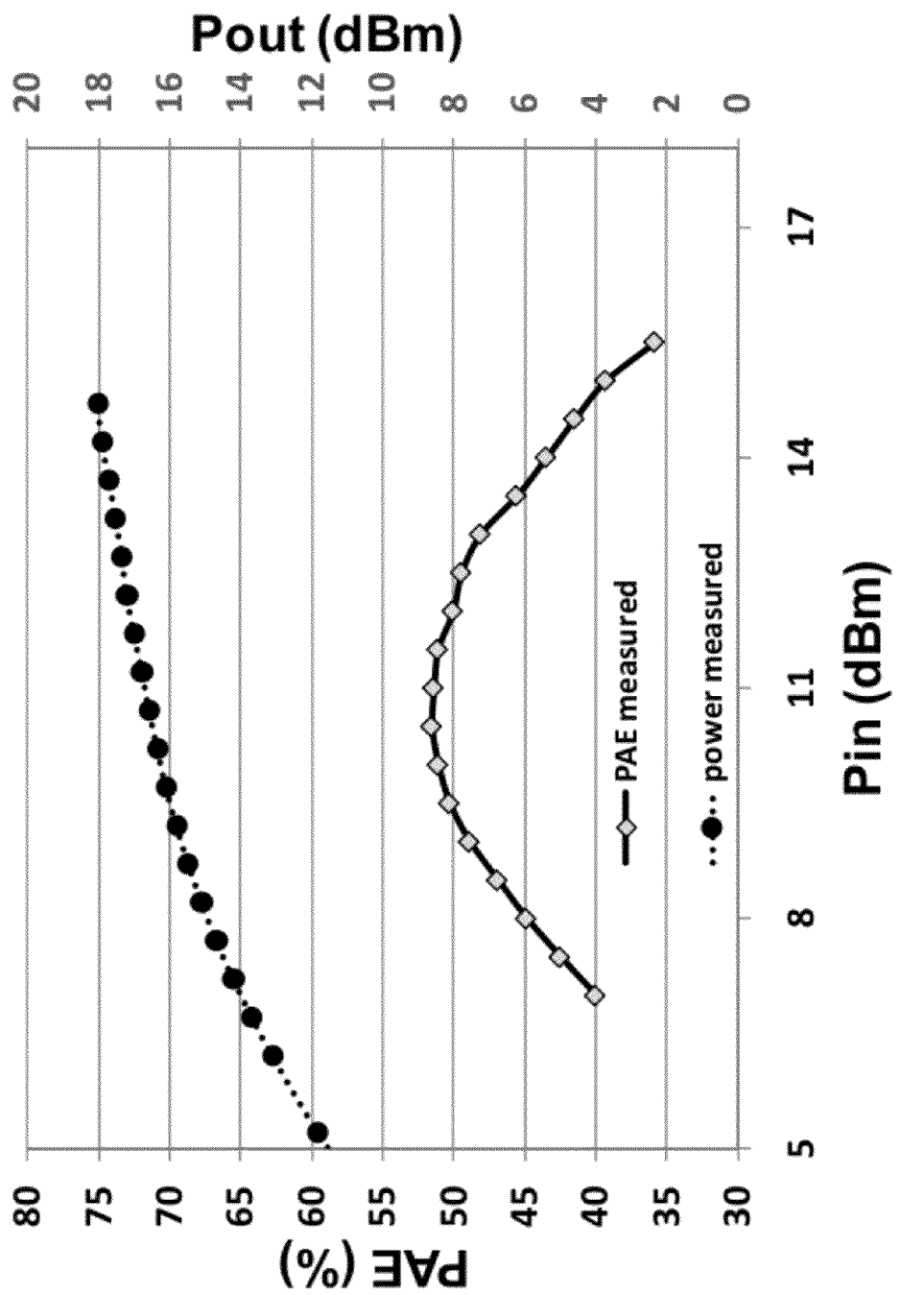
FIG. 38 plots measurement results of Power Added Efficiency (PAE) and output power (Pout) as a function of input power (Pin) of the implementation example of FIG. 37.

FIG. 38 plots measurement results of Power Added Efficiency (PAE) and output power (Pout) as a function of input power (Pin) of the implementation example 3700 of the Class-J MTM PA of FIG. 37. In an RF PA, PAE is defined as the ratio of the difference between Pout and Pin to the DC power consumed, whereas efficiency is defined as the ratio of Pout to the DC power consumed. The Pout versus Pin curve in FIG. 38 is approximately linear, indicating good linearity, in this measurement range in which Pout=18 dBm corresponds to power saturation. Linearity may also be evaluated by using Error Vector Magnitude (EVM), which is a measure of how far the points are from the ideal lattice points, expressed as a percentage. Generally, an EVM diagram illustrates that the fixed lattice points correspond to non-distortion of the signal forms and the distortions are quantized by the deviations from the lattice points. Thus, as linearity improves, the EVM value decreases. The EVM value of 0% corresponds to non-distortion and thus to ideal linearity. The measured EVM for this example is about 5.6%, which is considered of moderately good linearity in this application. The PAE versus Pin curve in FIG. 38 indicates that this PA has a peak PAE of about 52% and the overall PAE in the linear region is greater than 30%. This PAE value is significantly high as compared to a conventional class-AB PAE value of about 15%.

Figure 39:
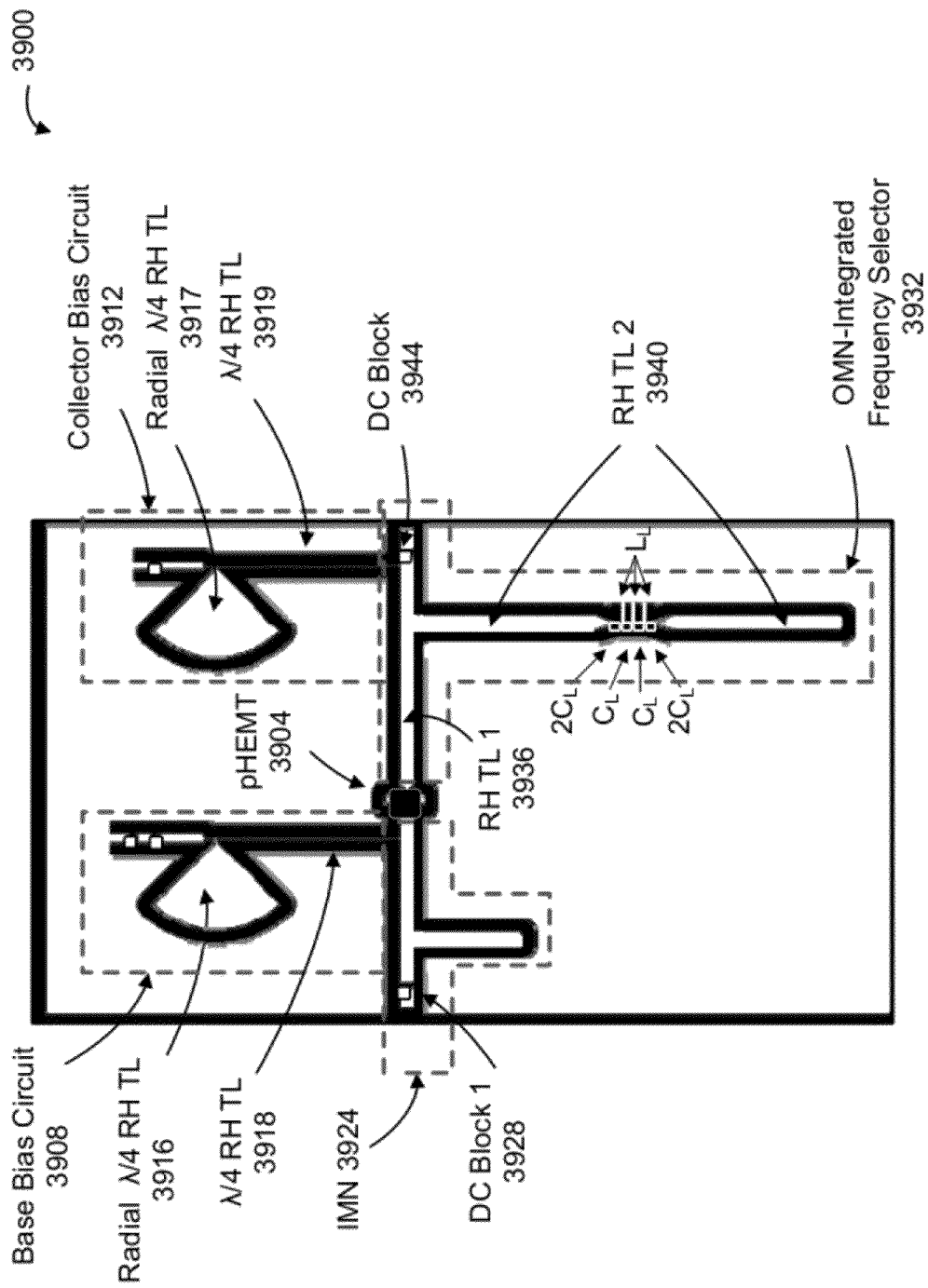
FIG. 39 illustrates a layout of an implementation example of the class-J MTM PA with the output matching impedance (OMN)-integrated MTM harmonic trap of FIG. 36C.

FIG. 39 illustrates a layout of an implementation example 3900 of the class-J MTM PA with an OMN-integrated MTM harmonic trap 3624 of FIG. 36C. A pHEMT is used in this example due to the availability of the discrete package for the underlying frequency range. However, the transistor may be of a different type with a different fabrication technique. FIG. 39 also illustrates additional discrete components used to realize this PA. The base of the pHEMT 3904 is biased by the base bias circuit 3908, which includes a capacitor and a resistor. The collector of the pHEMT 3904 is biased by the collector bias circuit 3912, which includes a capacitor. Each of these bias circuits includes a radial quarter-wavelength RH TL 3916/3917 and a stub-form quarter-wavelength RH TL 3918/3919, providing a total of half-wavelength for transforming the impedance from an open to an open as illustrated in FIG. 4. Use of a radial quarter-wavelength RH TL generally contributes to increasing the bandwidth. Although these bias circuits are designed based on the conventional single-band bias scheme, the bias circuit 600 based on a CRLH structure as shown in FIG. 6 may be used for one or both of the base and collector bias circuits. The IMN 3924 includes a series RH TL and a shunt RH TL, similar to the IMN 3716 in the class-J MTM PA implementation of FIG. 37. As explained earlier with reference to FIGS. 1F and 1G, the combination of a series RH TL and a shunt RH TL may be modeled with an RH series inductance $L_R$ and an RH shunt capacitor $C_R$. By structuring the lengths and widths of these two RH TLs, these equivalent circuit parameters may be adjusted to provide the optimum input impedance matching. A DC block 1 3928 is included in the IMN 3924 to block DC signals. The OMN-integrated MTM frequency selector 3932 is an implementation example of the OMN-integrated MTM frequency selector 3624 in FIG. 36C, including an RH TL 1 3936 and an RH TL 2 3940. A DC bock 2 3944 is included in the path along the RH TL 1 3936 to block DC signals. Four shunt LH capacitors, i.e., two $2C_L$s and two $C_L$s, three shunt $L_L$ inductors, i.e., three $L_L$s, and the RH TL 2 3940 are configured to provide three CRLH unit cells in this example. These capacitance and inductance values, as well as the dimensions of the RH TL 2 3940, are adjusted so that the equivalent circuit parameters for the RH portion, $C_R$ and $L_R$, provide the optimum output impedance matching as an OMN and at the same time the equivalent circuit parameters for the LH and RH portions, $C_L$, $L_L$, $C_R$ and $L_R$, provide the harmonic trap function, i.e., to filter out the second and third harmonics and pass the signal with the primary frequency. A CRLH design scheme for a harmonic trap may be similar to the one described with reference to FIG. 20, in which the CRLH phase curve is fit to three points. The phases of the RH TL 1 3936 may also be determined using the RH design scheme described with reference to FIG. 20 in that the input port P1, which is coupled to the collector terminal of the pHEMT 3904, is open for odd harmonics and shorted for even harmonics, as generally considered for class-J applications. Alternatively, the phases can be adjusted so that the collector terminal of the transistor is shorted for odd harmonics and open for even harmonics, shorted for all harmonics, or open for all harmonics, depending on underlying applications.

The design for this class-J MTM PA implementation 3900 of FIG. 39 involves integration of an OMN into an MTM harmonic trap as illustrated in FIG. 36C. As previously mentioned, the use of an MTM harmonic trap may reduce the overall circuit size: in contrast to the multiple RH TLs used in a conventional design for a harmonic trap, such as in FIG. 36A, one CRLH stub may be designed to filter out the second and third harmonics as in FIGS. 36B and 36C. In addition, the implementation example 3900 of FIG. 39 integrates an OMN into a CRLH TL, which is part of the MTM harmonic trap, further reducing the circuit size and component count. A reduction in overall circuit size and complexity generally reduces power loss, thereby leading to improved efficiency.

Figure 40:
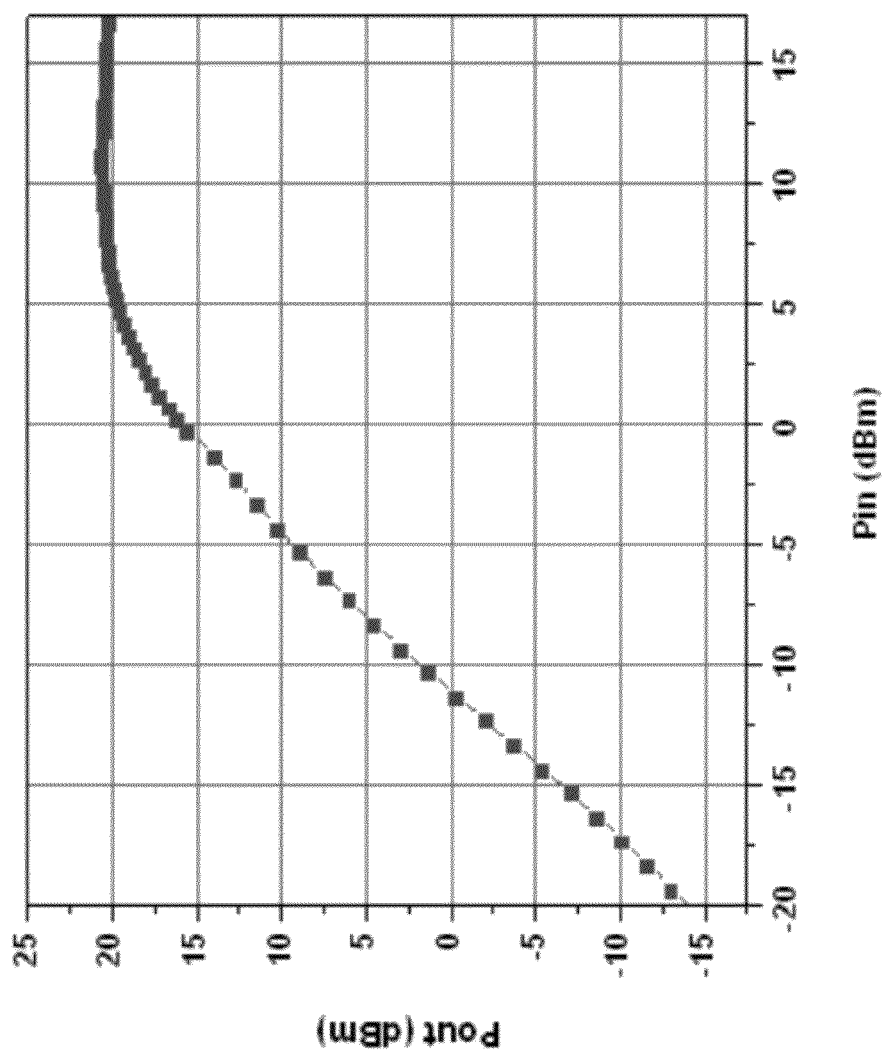
FIG. 40 plots measurement results of Pout versus Pin for the implementation example of FIG. 39.

FIG. 40 plots measurement results of Pout versus Pin for the implementation example 3900 of the Class-J MTM PA of FIG. 39. A base bias of Vbe=1V and a collector bias of Vice=3.5V are chosen for this class-AB case. The plot indicates that good linearity is obtained with the Pout up to about 15 dBm in this application. Note that the present implementation of the MTM class-J PA has some gain even in the low Pin region.

Figure 41:
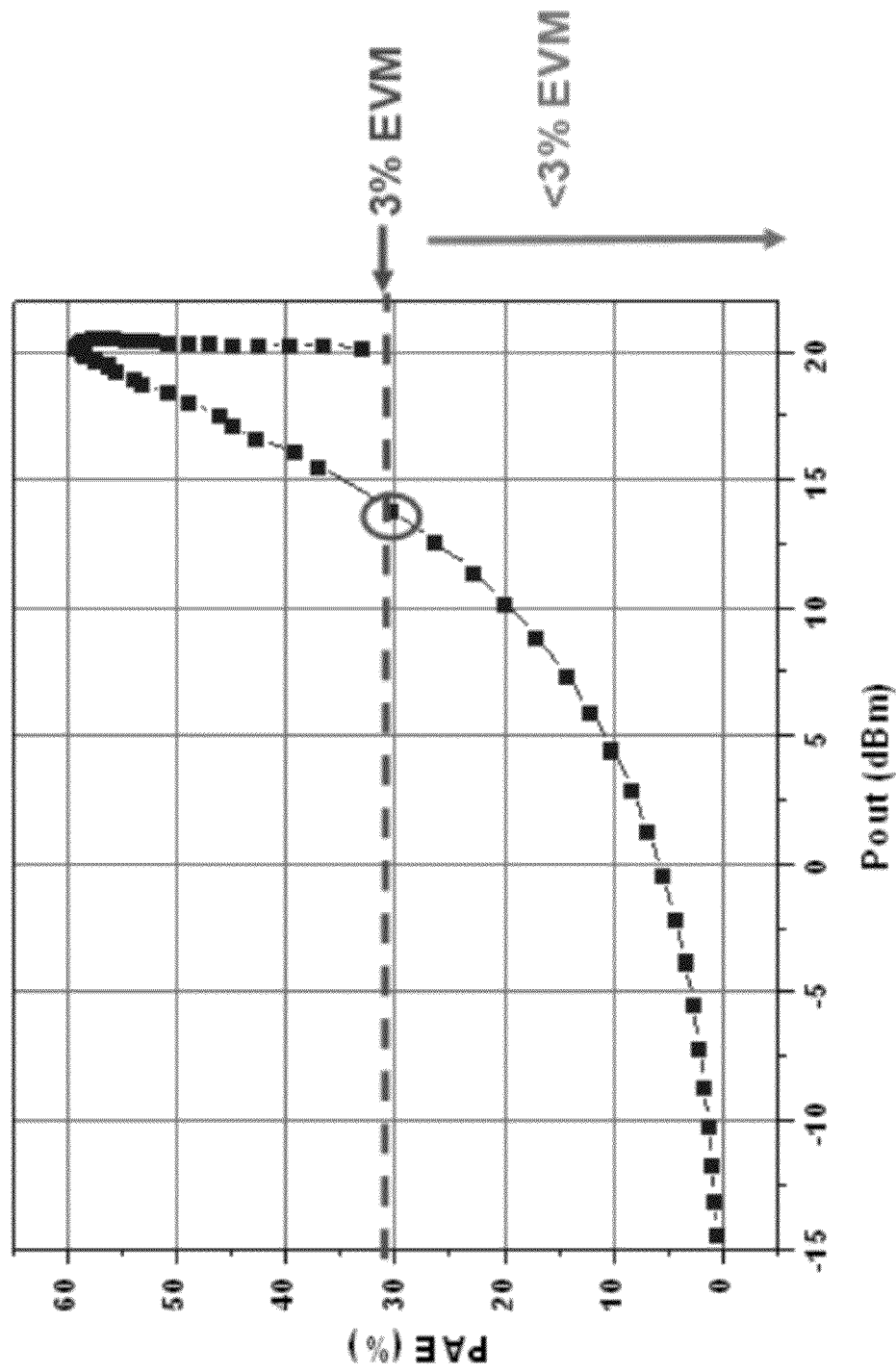
FIG. 41 plots measurement results of PAE versus Pout for the implementation example of FIG. 39.

FIG. 41 plots measurement results of PAE versus Pout for the implementation example 3900 of the class-J MTM PA of FIG. 39. The plot indicates that the measured peak PAE is about 60% at about Pout=20 dBm. The measured EVM values are added in this figure, indicating that an EVM value of less than 3% is obtained up to a PAE value of about 30% with a Pout value of about 14 dBm. Note that the EVM values of 3% or less are generally considered for communication systems for WiFi applications, in which the Pout is backed-off to this 3% EVM point to regain linearity but with reduced efficiency.

Figure 42:
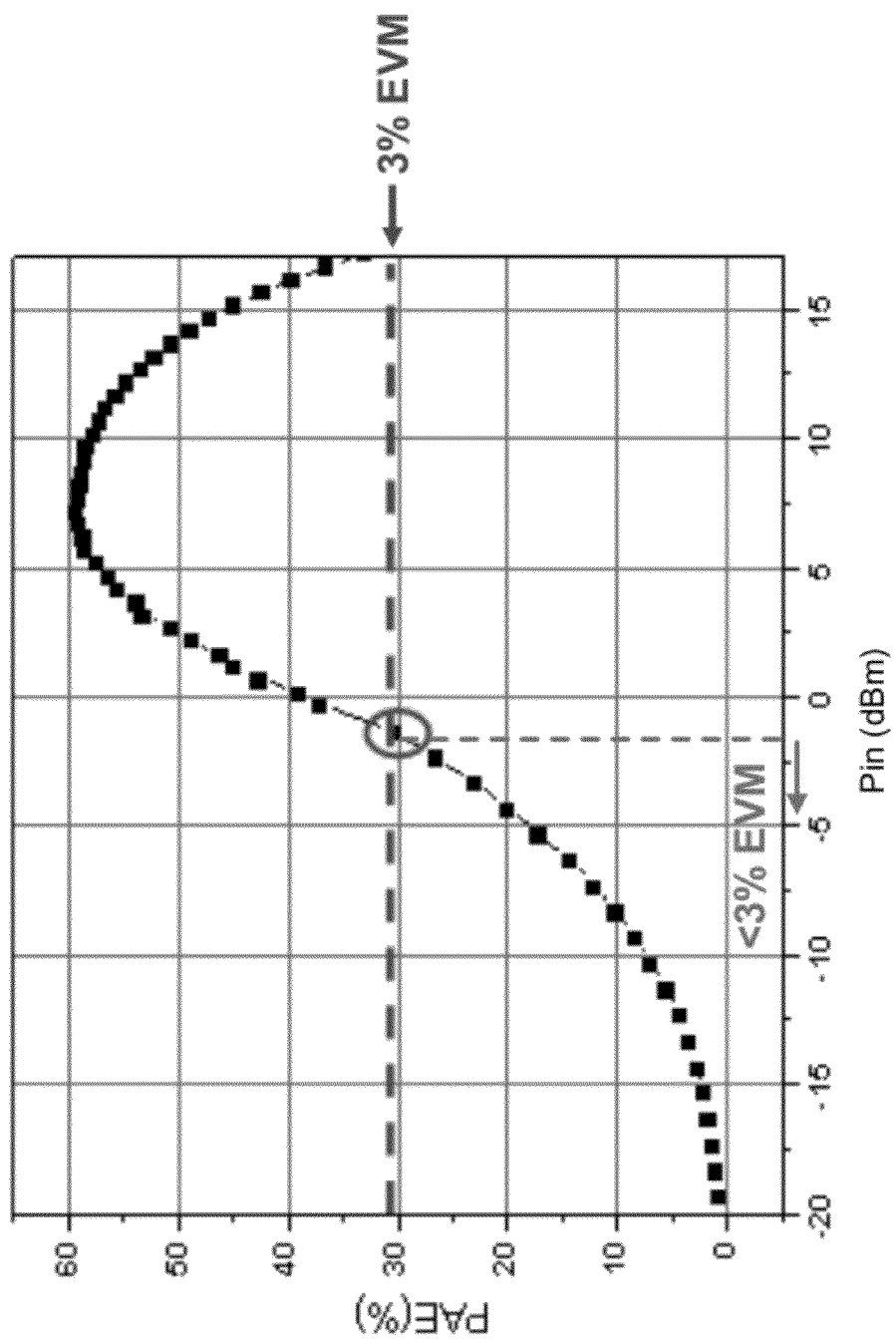
FIG. 42 illustrates measurement results of PAE versus Pin for the implementation example of FIG. 39.

FIG. 42 plots measurement results of PAE versus Pin for the implementation example 3900 of the class-J MTM PA of FIG. 39. The plot indicates that the measured PAE is about 30% with an EVM value of about 3% at a Pin value of about −2 dBm. The measured peak efficiency is about 60% at a Pin value of about 7 dBm.

Figure 43:
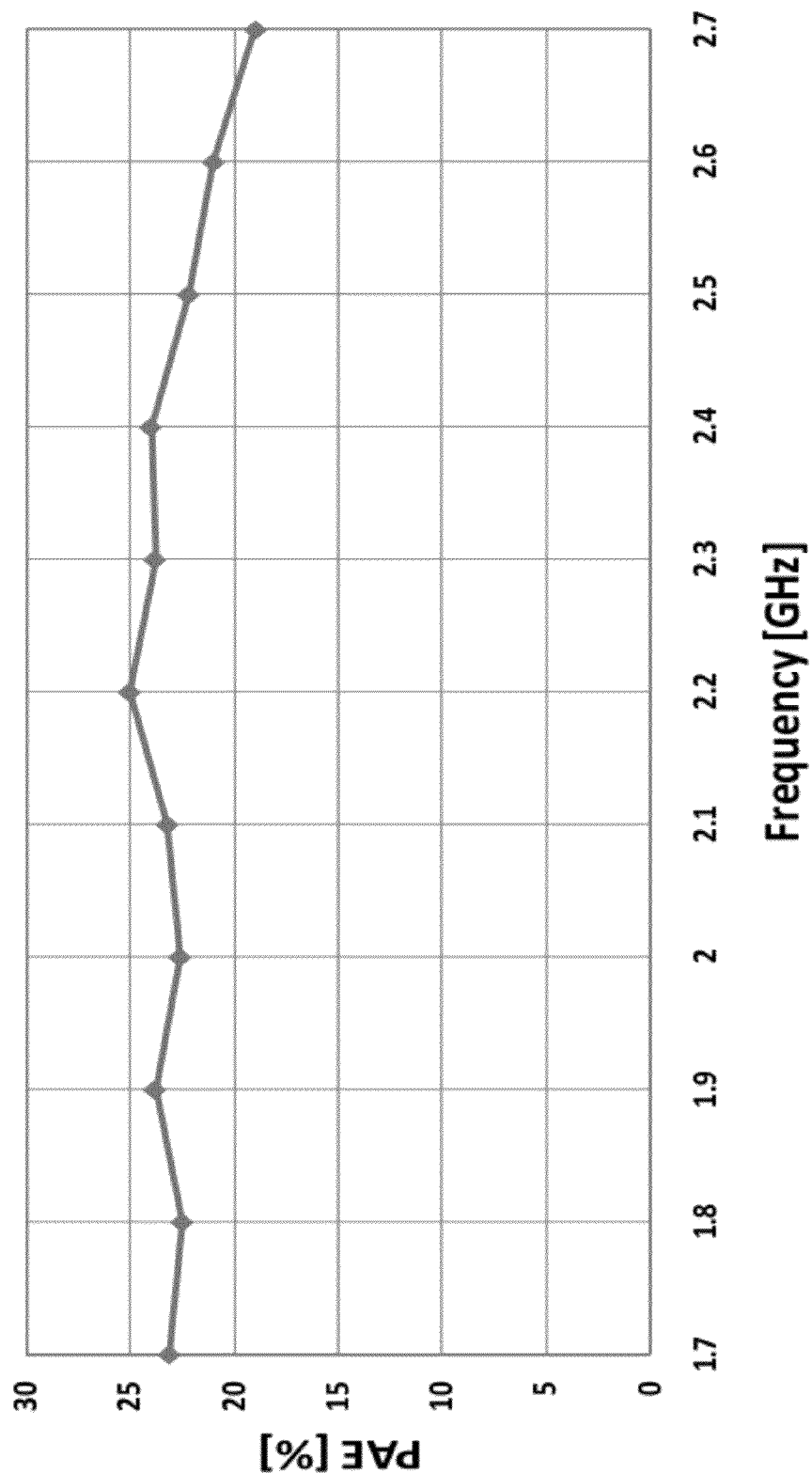
FIG. 43 plots simulation results of PAE versus frequency for a monolithic microwave integrated circuit (MMIC) implementation of the class-J MTM PA of FIG. 39.

FIG. 43 plots simulation results of PAE versus frequency for a monolithic microwave integrated circuit (MMIC) implementation of the class-J MTM PA 3900 of FIG. 39 with a driver PA coupled. OFDM signals are used in the simulation and the EVM for this case is about 3%. The plots indicate that good efficiency is obtained over a wideband, at least from 1.7 GHz to 2.7 GHZ, using the present class-J MTM PA design.

Figure 44:
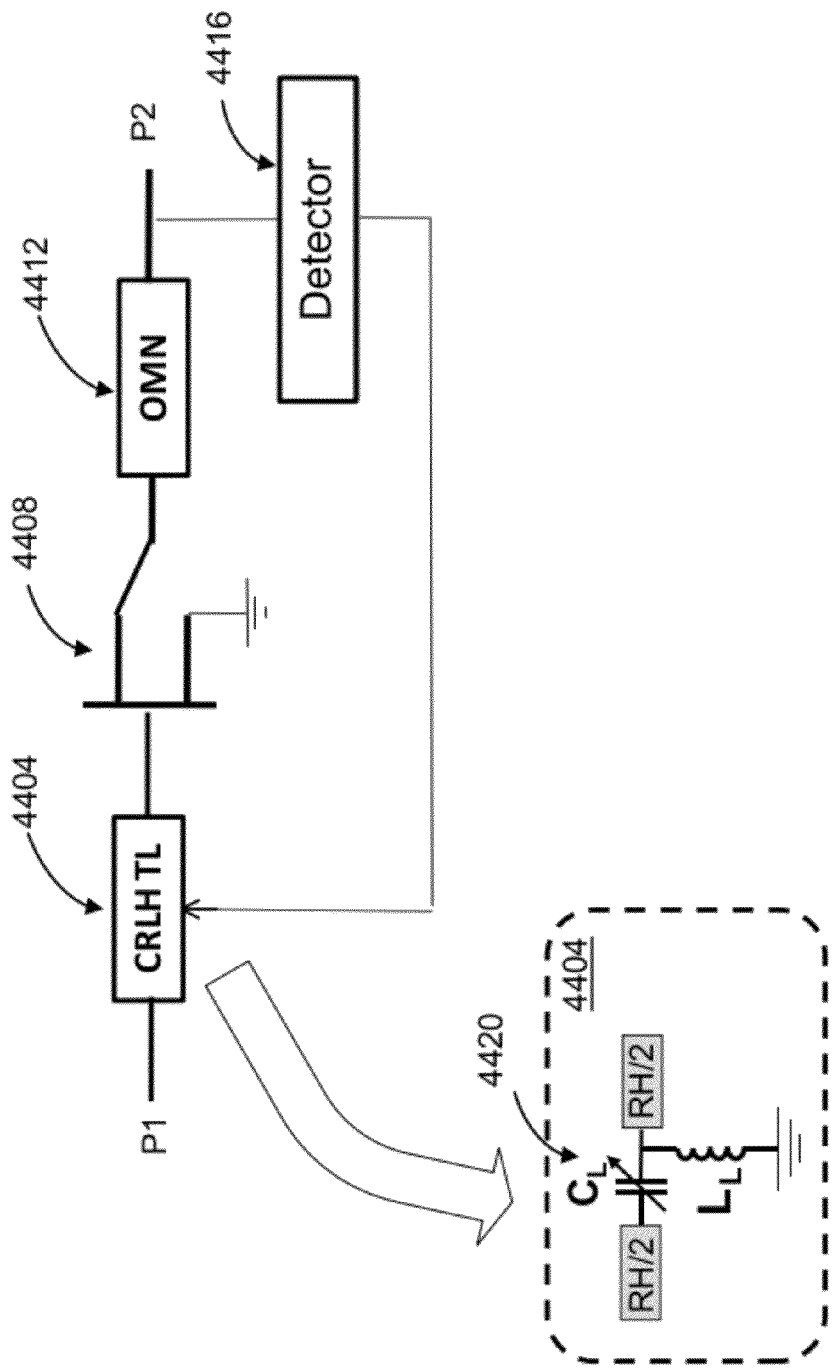
FIG. 44 illustrates a schematic diagram of a power amplifier configuration example using a CRLH TL with a varactor.

Phase distortion may occur at the output of the transistor due to the inherent non-linearity. Additional circuits or components may be incorporated in a PA to minimize the phase distortion. FIG. 44 illustrates a schematic diagram of a configuration example using a CRLH TL 4404 with a varactor therein. The CRLH TL 4404 is located on the input side of the transistor 4408 in this example. The magnified view of the CRLH TL 4404 is shown in the dashed box, illustrating the use of a CRLH unit cell such as in FIG. 1B. This CRLH TL 4404 includes two RH/2 TLs as an example to provide the RH parameters $C_R$ and $L_R$, but lumped elements may be used instead. A different type of a CRLH unit cell may also be used with lumped elements, distributed elements or a combination of both. The CRLH TL 4404 includes the varactor 4420 instead of a capacitor to provide the adjustable $C_L$. After the OMN 4412, the output power and/or associated signals are detected by a detector 4416 in this example. A feedback loop is provided from the detector 4416 to control the varactor 4420 inside the CRLH TL 4404. According to the detected power and/or associated signals by the detector 4416, the capacitance value of the varactor 4420 is varied so that the phase of the CRLH TL 4404 and hence the input phase is adjusted. The other CRLH parameters, such as $L_R$, $C_R$ and $L_L$, may be kept constant or varied for optimization. Unlike the RH phase response, which is negative and linear in frequency, the CRLH phase response is positive or negative and non-linear in frequency. Therefore, arbitrary phase distortion may be adjusted using the CRLH TL 4404 with the varactor 4420 at the input side of a PA.

In another example, an IMN may be integrated in a CRLH TL, which thereby performs both the input impedance matching and the phase distortion minimization. The integration may be realized in the similar way as for the OMN-integrated MTM frequency selector described with reference to FIGS. 36C and 39.

Note that the MTM PA examples described above may also be optimized for WLAN applications such as 802.11b, g with 64-QAM OFDM. Although the two class-J MTM PA implementations presented herein are designed to optimally operate at one frequency, e.g., 2.4 GHz, it is possible to design them at a different selected frequency and, therefore, may make these MTM PAs suitable for applications such as WCDMA, LIE, WLAN 802.11x, GSM, or other applications.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the disclosed implementations and other implementations can be made based on what is disclosed and illustrated.

What is claimed is:

1. A power amplifying system configured to operate for a plurality of frequency bands, comprising:
   an input matching network configured to perform input impedance matching for input signals in the plurality of frequency bands;
   a first frequency selecting module that is coupled to the input matching network and directs the input signal in each of the plurality of frequency bands to an input signal path associated with the corresponding frequency band;
   one or more transistors that receive the input signals in the plurality of frequency bands and amplify the input signals to generate output signals in the plurality of frequency bands;
   a bias circuit to bias the one or more transistors;
   an output matching network configured to perform output impedance matching for the output signals in the plurality of frequency bands; and
   a second frequency selecting module that is coupled to the output matching network and directs the output signal in each of the plurality of frequency bands to an output signal path associated with the frequency band;
   wherein the first and second frequency selecting modules each include at least one filtering element configured to direct signals by filtering signals based on their frequency, wherein certain signals are allowed to pass and other signals are removed via filtration.

2. A power amplifying system configured to operate for a plurality of frequency bands, comprising:
   an input matching network configured to perform input impedance matching for input signals in the plurality of frequency bands;
   a first frequency selecting module that is coupled to the input matching network and directs the input signal in each of the plurality of frequency bands to an input signal path associated with the corresponding frequency band;
   one or more transistors that receive the input signals in the plurality of frequency bands and amplify the input signals to generate output signals in the plurality of frequency bands;
   a bias circuit to bias the one or more transistors;
   an output matching network configured to perform output impedance matching for the output signals in the plurality of frequency bands; and
   a second frequency selecting module that is coupled to the output matching network and directs the output signal in each of the plurality of frequency bands to an output signal path associated with the frequency band;
   a plurality of input ports that are coupled to the input matching network and receive the input signals in the plurality of frequency bands, respectively; and
   a plurality of output ports that are coupled to the output matching network and output the output signals in the plurality of frequency bands, respectively,
   wherein
   the one or more transistors comprise a multiband transistor that is configured to operate for the plurality of frequency bands;

the input matching network receives the input signals from the plurality of input ports and processes and sends the input signals to the first frequency selecting module;

the first frequency selecting module directs the input signal in each of the plurality of frequency bands to the input signal path associated with the plurality of frequency bands and coupled to the multiband transistor; and the second frequency selecting module directs the output signal in each of the plurality of frequency bands to the output signal path associated with the frequency band and coupled through the output matching network to one of the plurality of output ports that outputs the output signal in the frequency band.

3. A power amplifying system configured to operate for a plurality of frequency bands, comprising:

an input matching network configured to perform input impedance matching for input signals in the plurality of frequency bands;

a first frequency selecting module that is coupled to the input matching network and directs the input signal in each of the plurality of frequency bands to an input signal path associated with the corresponding frequency band;

one or more transistors that receive the input signals in the plurality of frequency bands and amplify the input signals to generate output signals in the plurality of frequency bands;

a bias circuit to bias the one or more transistors;

an output matching network configured to perform output impedance matching for the output signals in the plurality of frequency bands; and a second frequency selecting module that is coupled to the output matching network and directs the output signal in each of the plurality of frequency bands to an output signal path associated with the frequency band;

an input port that is coupled to the first frequency selecting module and receives the input signals in the plurality of frequency bands; and an output port that is coupled to the second frequency selecting module and outputs the output signals in the plurality of frequency bands, wherein the one or more transistors comprise a plurality of single-band transistors that are configured to operate for the plurality of frequency bands, respectively;

the first frequency selecting module receives the input signals in the plurality of frequency bands from the input port and directs the input signal in each of the plurality of frequency bands to the input signal path associated with the frequency band and coupled through the input matching network to one of the plurality of single-band transistors that operates for the frequency band;

the output matching network receives the output signals from the plurality of single-band transistors and processes and sends the output signals to the second frequency selecting module; and the second frequency selecting module directs the output signal in each of the plurality of frequency bands to the output signal path associated with the plurality of frequency bands and coupled to the output port.

4. The power amplifying system as in claim 1, wherein the bias circuit comprises a composite right and left handed (CRLH) structure.

5. A power amplifying system configured to operate for a plurality of frequency bands, comprising:

an input matching network configured to perform input impedance matching for input signals in the plurality of frequency bands;

a first frequency selecting module that is coupled to the input matching network and directs the input signal in each of the plurality of frequency bands to an input signal path associated with the corresponding frequency band;

one or more transistors that receive the input signals in the plurality of frequency bands and amplify the input signals to generate output signals in the plurality of frequency bands;

a bias circuit to bias the one or more transistors;

an output matching network configured to perform output impedance matching for the output signals in the plurality of frequency bands; and a second frequency selecting module that is coupled to the output matching network and directs the output signal in each of the plurality of frequency bands to an output signal path associated with the frequency band;

the first and second frequency selecting modules include a plurality of frequency selectors, each of which is configured to transmit a signal in a frequency band associated with the frequency selector, and remove signals in one or more frequency bands that are different from the frequency band associated with the frequency selector.

6. The power amplifying system as in claim 5, wherein at least one of the plurality of frequency selectors is configured to be actively controlled to form an active frequency selector to transmit the signal in the frequency band associated with the frequency selector, wherein the frequency band associated with the frequency selector varies depending on time.

7. The power amplifying system as in claim 5, wherein at least one of the frequency selectors comprises a CRLH structure.

8. The power amplifying system as in claim 5, wherein the first and second frequency selecting modules include one or more frequency selecting networks, each frequency selecting network comprising:

a first port;

a plurality of second ports associated with the plurality of frequency bands, respectively; and a plurality of signal paths coupling the first port and the plurality of second ports, respectively, forming multifurcated branches, the plurality of signal paths being coupled to the plurality of frequency selectors, respectively, wherein each of the frequency selectors is configured to transmit the signal in the frequency band associated with the frequency selector between the first port and the second port associated with the frequency band.

9. The power amplifying system as in claim 8, wherein the first port is configured to receive the signals in the plurality of frequency bands sequentially in time intervals; and the plurality of second ports are configured to output the signals.

10. The power amplifying system as in claim 8, wherein the plurality of second ports are configured to receive the signals in the plurality of frequency bands, respectively, which are inputted sequentially in time intervals; and the first port is configured to output the signals.

11. The power amplifying system as in claim 6, wherein the active frequency selector comprises:
- a first port for receiving the signals in the plurality of frequency bands simultaneously or sequentially in time intervals;
- a second port for outputting the signal in a predetermined frequency band in a predetermined time interval, wherein the predetermined frequency band changes sequentially as the time interval changes;
- a signal path coupling the first port and the second port; and
- a plurality of active components coupled to the signal path and controlled to turn on and off as the time interval changes for selecting the predetermined frequency band that changes as the time interval changes.

12. A power amplifier, comprising:
- an input matching network configured to perform input impedance matching for an input signal in a frequency band;
- a transistor coupled to the input matching network, the transistor receiving the input signal in the frequency band and amplifying the input signal to generate an output signal in the frequency band; and
- a frequency selector configured to have a shunt element based on a CRLH structure and a series element and coupled to the transistor, the frequency selector receiving the output signal from the transistor and processing the output signal;
- wherein the frequency selector includes at least one filtering element configured to direct signals by filtering signals based on their frequency, wherein certain signals are allowed to pass and other signals are removed via filtration.

13. The power amplifier as in claim 12, wherein the transistor is biased with class-AB.

14. A power amplifier, comprising:
- an input matching network configured to perform input impedance matching for an input signal in a frequency band;
- a transistor coupled to the input matching network, the transistor receiving the input signal in the frequency band and amplifying the input signal to generate an output signal in the frequency band; and
- a frequency selector configured to have a shunt element based on a CRLH structure and a series element and coupled to the transistor, the frequency selector receiving the output signal from the transistor and processing the output signal;
- an output matching network configured to perform output impedance matching for the output signal in the frequency band,
- wherein
- the shunt element is configured based on the CRLH structure to have a phase response to remove harmonics associated with the output signal in the frequency band and send the output signal to the output matching network; and
- the series element is configured to have a phase response to adjust signal properties including transmission and reflection.

15. The power amplifier as in claim 14, wherein
the series element is configured based on a right-handed (RH) structure to have the phase response to have an open circuit for odd harmonics and a shorted circuit for even harmonics at an input end of the frequency selector.

16. A power amplifier, comprising:
- an input matching network configured to perform input impedance matching for an input signal in a frequency band;
- a transistor coupled to the input matching network, the transistor receiving the input signal in the frequency band and amplifying the input signal to generate an output signal in the frequency band; and
- a frequency selector configured to have a shunt element based on a CRLH structure and a series element and coupled to the transistor, the frequency selector receiving the output signal from the transistor and processing the output signal;
- wherein
- the shunt element is configured based on the CRLH structure to have a phase response to remove harmonics associated with the output signal in the frequency band and perform output impedance matching for the output signal; and
- the series element is configured to have a phase response to adjust signal properties including transmission and reflection.

17. The power amplifier as in claim 16,
wherein
the series element is configured based on an RH structure to have the phase response to have an open circuit for odd harmonics and a shorted circuit for even harmonics at an input end of the frequency selector.

18. A power amplifying system configured to operate for a plurality of frequency bands, comprising:
- an input matching network configured to perform input impedance matching for input signals in the plurality of frequency bands;
- a frequency selecting module that is coupled to the input matching network and directs the input signal in each of the plurality of frequency bands to an input signal path associated with the corresponding frequency band;
- one or more transistors that receive the input signals in the plurality of frequency bands and amplify the input signals to generate output signals in the plurality of frequency bands; and
- a bias circuit to bias the one or more transistors;
- an output matching network configured to perform output impedance matching for the output signals in the plurality of frequency bands and output the output signals;
- wherein the frequency selecting module includes at least one filtering element configured to direct signals by filtering signals based on their frequency, wherein certain signals are allowed to pass and other signals are removed via filtration.

19. The power amplifying system as in claim 18, wherein the bias circuit comprises a CRLH structure.

20. A power amplifying system configured to operate for a plurality of frequency bands, comprising:
- an input matching network configured to perform input impedance matching for input signals in the plurality of frequency bands;
- a frequency selecting module that is coupled to the input matching network and directs the input signal in each of the plurality of frequency bands to an input signal path associated with the corresponding frequency band;
- one or more transistors that receive the input signals in the plurality of frequency bands and amplify the input signals to generate output signals in the plurality of frequency bands; and
- a bias circuit to bias the one or more transistors;

an output matching network configured to perform output impedance matching for the output signals in the plurality of frequency bands and output the output signals;

the frequency selecting module includes at least one frequency selector, which is configured to transmit a signal in a frequency band associated with the frequency selector, and remove signals in one or more frequency bands that are different from the frequency band associated with the frequency selector.

21. The power amplifying system as in claim 20, wherein the at least one frequency selector is configured to be actively controlled to form an active frequency selector to transmit the signal in the frequency band associated with the frequency selector, wherein the frequency band associated with the frequency selector varies depending on time.

22. The power amplifying system as in claim 20, wherein the at least one frequency selector comprises a CRLH structure.

23. A power amplifying system configured to operate for a plurality of frequency bands, comprising:

an input matching network configured to perform input impedance matching for input signals in the plurality of frequency bands;

one or more transistors that receive the input signals in the plurality of frequency bands and amplify the input signals to generate output signals in the plurality of frequency bands;

a bias circuit to bias the one or more transistors;

an output matching network configured to perform output impedance matching for the output signals in the plurality of frequency bands; and a frequency selecting module that is coupled to the output matching network and directs the output signal in each of the plurality of frequency bands to an output signal path to output the output signals;

wherein the frequency selecting module includes at least one filtering element configured to direct signals by filtering signals based on their frequency, wherein certain signals are allowed to pass and other signals are removed via filtration.

24. The power amplifying system as in claim 23, wherein the bias circuit comprises a CRLH structure.

25. A power amplifying system configured to operate for a plurality of frequency bands, comprising:

an input matching network configured to perform input impedance matching for input signals in the plurality of frequency bands;

one or more transistors that receive the input signals in the plurality of frequency bands and amplify the input signals to generate output signals in the plurality of frequency bands;

a bias circuit to bias the one or more transistors;

an output matching network configured to perform output impedance matching for the output signals in the plurality of frequency bands; and a frequency selecting module that is coupled to the output matching network and directs the output signal in each of the plurality of frequency bands to an output signal path to output the output signals;

the frequency selecting module includes at least one frequency selector, which is configured to transmit a signal in a frequency band associated with the frequency selector, and remove signals in one or more frequency bands that are different from the frequency band associated with the frequency selector.

26. The power amplifying system as in claim 25, wherein the at least one frequency selector is configured to be actively controlled to form an active frequency selector to transmit the signal in the frequency band associated with the frequency selector, wherein the frequency band associated with the frequency selector varies depending on time.

27. The power amplifying system as in claim 25, wherein the at least one frequency selector comprises a CRLH structure.

28. A method of making a power amplifying system operable for a plurality of frequency bands, the method comprising:

forming an input matching network to perform input impedance matching for input signals in the plurality of frequency bands;

coupling a plurality of input ports that receive the input signals in the plurality of frequency bands, respectively, to the input matching network;

coupling a first frequency selecting module to the input matching network to direct the input signal in each of the plurality of frequency bands to an input signal path associated with the plurality of frequency bands;

coupling a multiband transistor to the input signal path to receive the input signals in the plurality of frequency bands and amplify the input signals to generate output signals in the plurality of frequency bands;

forming an output matching network to perform output impedance matching for output signals in the plurality of frequency bands;

coupling a second frequency selecting module between the multiband transistor and the output matching network to direct the output signal in each of the plurality of frequency bands to an output signal path associated with the frequency band;

coupling a plurality of output ports to the output signal paths associated with the plurality of frequency bands, respectively, to output the output signals; and directing signals in the first and second frequency selecting modules via filtering.

29. A method of making a power amplifying system operable for a plurality of frequency bands, the method comprising:

forming an input matching network to perform input impedance matching for input signals in the plurality of frequency bands;

coupling a plurality of input ports that receive the input signals in the plurality of frequency bands, respectively, to the input matching network;

coupling a first frequency selecting module to the input matching network to direct the input signal in each of the plurality of frequency bands to an input signal path associated with the plurality of frequency bands;

coupling a multiband transistor to the input signal path to receive the input signals in the plurality of frequency bands and amplify the input signals to generate output signals in the plurality of frequency bands;

forming an output matching network to perform output impedance matching for output signals in the plurality of frequency bands;

coupling a second frequency selecting module between the multiband transistor and the output matching network to direct the output signal in each of the plurality of frequency bands to an output signal path associated with the frequency band;

coupling a plurality of output ports to the output signal paths associated with the plurality of frequency bands, respectively, to output the output signals;
forming the first and second frequency modules by including a plurality of frequency selectors; and
configuring each of the plurality of frequency selectors to transmit a signal in a frequency band associated with the frequency selector and remove signals in one or more frequency bands that are different from the frequency band associated with the frequency selector.

30. The method as in claim 29, further comprising:
configuring at least one of the frequency selectors to be actively controlled to transmit a signal in a frequency band associated with the frequency selector when the frequency band associated with the frequency selector varies depending on time.

31. The method as in claim 28, further comprising:
forming at least one of the frequency selectors based on a CRLH structure.

32. A method of making a power amplifying system operable for a plurality of frequency bands, the method comprising:
forming an input matching network to perform input impedance matching for input signals in the plurality of frequency bands;
coupling a first frequency selecting module to the input matching network to direct the input signal in each of the plurality of frequency bands to an input signal path associated with the frequency band;
coupling an input port that receives the input signals in the plurality of frequency bands to the frequency selecting module;
coupling a plurality of transistors that receive the input signals through the input signal paths associated with the plurality of frequency bands, respectively, and amplify the input signals to generate output signals in the plurality of frequency bands;
forming an output matching network to perform output impedance matching for output signals in the plurality of frequency bands;
coupling a second frequency selecting module to the output matching network to direct the output signal in each of the plurality of frequency bands to an output signal path associated with the plurality of frequency bands;
coupling an output port to the output signal path to output the output signals; and
directing signals in the first and second frequency selecting modules via filtering.

33. A method of making a power amplifying system operable for a plurality of frequency bands, the method comprising:
forming an input matching network to perform input impedance matching for input signals in the plurality of frequency bands;
coupling a first frequency selecting module to the input matching network to direct the input signal in each of the plurality of frequency bands to an input signal path associated with the frequency band;
coupling an input port that receives the input signals in the plurality of frequency bands to the frequency selecting module;
coupling a plurality of transistors that receive the input signals through the input signal paths associated with the plurality of frequency bands, respectively, and amplify the input signals to generate output signals in the plurality of frequency bands;
forming an output matching network to perform output impedance matching for output signals in the plurality of frequency bands;
coupling a second frequency selecting module to the output matching network to direct the output signal in each of the plurality of frequency bands to an output signal path associated with the plurality of frequency bands;
coupling an output port to the output signal path to output the output signals;
forming the first and second frequency modules by including a plurality of frequency selectors; and
configuring each of the plurality of frequency selectors to transmit a signal in a frequency band associated with the frequency selector and remove signals in one or more frequency bands that are different from the frequency band associated with the frequency selector.

34. A method of making a power amplifying system operable for a plurality of frequency bands, the method comprising:
forming an input matching network to perform input impedance matching for input signals in the plurality of frequency bands;
coupling a first frequency selecting module to the input matching network to direct the input signal in each of the plurality of frequency bands to an input signal path associated with the frequency band;
coupling an input port that receives the input signals in the plurality of frequency bands to the frequency selecting module;
coupling a plurality of transistors that receive the input signals through the input signal paths associated with the plurality of frequency bands, respectively, and amplify the input signals to generate output signals in the plurality of frequency bands;
forming an output matching network to perform output impedance matching for output signals in the plurality of frequency bands;
coupling a second frequency selecting module to the output matching network to direct the output signal in each of the plurality of frequency bands to an output signal path associated with the plurality of frequency bands;
coupling an output port to the output signal path to output the output signals; and
configuring at least one of the frequency selectors to be actively controlled to transmit a signal in a frequency band associated with the frequency selector when the frequency band associated with the frequency selector varies depending on time.

35. A method of making a power amplifying system operable for a plurality of frequency bands, the method comprising:
forming an input matching network to perform input impedance matching for input signals in the plurality of frequency bands;
coupling a first frequency selecting module to the input matching network to direct the input signal in each of the plurality of frequency bands to an input signal path associated with the frequency band;
coupling an input port that receives the input signals in the plurality of frequency bands to the frequency selecting module;
coupling a plurality of transistors that receive the input signals through the input signal paths associated with the plurality of frequency bands, respectively, and amplify the input signals to generate output signals in the plurality of frequency bands;

forming an output matching network to perform output impedance matching for output signals in the plurality of frequency bands;

coupling a second frequency selecting module to the output matching network to direct the output signal in each of the plurality of frequency bands to an output signal path associated with the plurality of frequency bands; and coupling an output port to the output signal path to output the output signals;

wherein the configuring each of the plurality of frequency selectors comprises forming a frequency selector based on a CRLH structure to have a phase response to transmit the signal in the frequency band associated with the frequency selector and remove signals in one or more frequency bands that are different from the frequency band associated with the frequency selector.

36. A method of using a power amplifying system operable for a plurality of frequency bands, the method comprising:

receiving input signals in the plurality of frequency band;

performing input impedance matching for input signals in the plurality of frequency bands based on an input matching network;

directing the input signal in each of the plurality of frequency bands to an input signal path associated with the frequency band by coupling a first frequency selecting module to the input matching network;

using one or more transistors to amplify the input signals to generate output signals in the plurality of frequency bands;

performing output impedance matching for output signals in the plurality of frequency bands based on an output matching network;

directing the output signal in each of the plurality of frequency bands to an output signal path associated with the frequency band by coupling a second frequency selecting module to the output matching network; and outputting the output signals;

wherein the first and second frequency selecting modules each include at least one filtering element configured to direct signals by filtering signals based on their frequency, wherein certain signals are allowed to pass and other signals are removed via filtration.

37. The method as in claim 36, wherein:

the directing the input signal includes using a phase response of a CRLH structure in the first frequency module.

38. The method as in claim 36, wherein:

the directing the output signal includes using a phase response of a CRLH structure in the second frequency module.

* * * * *

UNITED STATES PATENT AND TRADEMARK OFFICE
CERTIFICATE OF CORRECTION

PATENT NO. : 8,154,340 B2  
APPLICATION NO. : 12/708437  
DATED : April 10, 2012  
INVENTOR(S) : Dupuy et al.

Page 1 of 1

It is certified that error appears in the above-identified patent and that said Letters Patent is hereby corrected as shown below:

On the title page, item (56), in Column 2, Line 10, delete "TEchniques," and insert -- Techniques, --, therefor.

In Column 1, Lines 60-61, delete the extra spaces between "2004).        CRLH".

In Column 3, Line 18, delete "an frequency" and insert -- a frequency --, therefor.

In Column 3, Line 61, delete "illustrates" and insert -- illustrate --, therefor.

In Column 5, Line 19, delete "illustrates" and insert -- illustrate --, therefor.

In Column 5, Line 21, delete "refers" and insert -- refer --, therefor.

In Column 15, Line 56, delete "ϕ3" and insert -- $\phi_3$ --, therefor.

In Column 16, Line 22, delete "RH TL 1 1708." and insert -- RH TL 1708. --, therefor.

In Column 17, Line 33, delete "$\phi_4$==90°" and insert -- $\phi_4$=-90° --, therefor.

In Column 18, Line 7, delete "of an" and insert -- of a --, therefor.

In Column 18, Line 33, delete "an frequency" and insert -- a frequency --, therefor.

In Column 28, Line 50, delete "Vice=3.5V" and insert -- Vce=3.5V --, therefor.

In Column 29, Line 54, delete "LIE," and insert -- LTE, --, therefor.

Signed and Sealed this  
Twentieth Day of November, 2012

David J. Kappos  
*Director of the United States Patent and Trademark Office*